US011700020B2

(12) United States Patent
Delfosse et al.

(10) Patent No.: US 11,700,020 B2
(45) Date of Patent: Jul. 11, 2023

(54) FAULT TOLERANT QUANTUM ERROR CORRECTION WITH LINEAR CODES

(71) Applicant: Microsoft Technology Licensing, LLC, Redmond, WA (US)

(72) Inventors: Nicolas Delfosse, Seattle, WA (US); Krysta Svore, Seattle, WA (US); Benjamin W. Reichardt, San Francisco, CA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 286 days.

(21) Appl. No.: 16/663,018

(22) Filed: Oct. 24, 2019

(65) Prior Publication Data

US 2021/0126652 A1    Apr. 29, 2021

(51) Int. Cl.
 *H03M 13/13* (2006.01)
 *G06N 10/00* (2022.01)
 *H03M 13/35* (2006.01)

(52) U.S. Cl.
 CPC .......... *H03M 13/136* (2013.01); *G06N 10/00* (2019.01); *H03M 13/353* (2013.01)

(58) Field of Classification Search
 CPC .. H03M 13/136; H03M 13/353; G06N 10/00; G06N 5/003
 See application file for complete search history.

(56) References Cited

U.S. PATENT DOCUMENTS

| | | | | |
|---|---|---|---|---|
| 9,477,796 | B2* | 10/2016 | Garcia-Ramirez | G06F 30/20 |
| 9,978,020 | B1* | 5/2018 | Gambetta | G06N 20/00 |
| 10,248,491 | B1* | 4/2019 | Zeng | G06N 10/00 |
| 10,352,992 | B1* | 7/2019 | Zeng | G01R 31/2851 |
| 10,866,861 | B1* | 12/2020 | Palmer | G06F 3/064 |
| 2014/0289583 | A1* | 9/2014 | Goto | H03M 13/41 714/752 |
| 2019/0020346 | A1* | 1/2019 | Wang | H03K 19/195 |
| 2019/0044543 | A1* | 2/2019 | Chamberland | H03M 13/13 |
| 2019/0065299 | A1 | 2/2019 | Lee et al. | |
| 2019/0199373 | A1* | 6/2019 | Heo | G06N 5/003 |
| 2019/0244128 | A1* | 8/2019 | Choi | G06N 10/00 |
| 2020/0310908 | A1* | 10/2020 | Hogaboam | G06N 10/00 |
| 2020/0334101 | A1* | 10/2020 | Albert | G06F 11/0736 |
| 2021/0027188 | A1* | 1/2021 | Nickerson | G06K 9/622 |

(Continued)

OTHER PUBLICATIONS

Nielsen et al "Quantum Information and Computation", Cambridge Univ. Press, 2000.*

(Continued)

*Primary Examiner* — Steve N Nguyen
(74) *Attorney, Agent, or Firm* — Holzer Patel Drennan

(57) ABSTRACT

This disclosure focuses on example embodiments of a classical approach to the problem of quantum error correction in the presence of faults. Linear codes equipped with faulty parity measurements are disclosed. Example definitions of fault tolerance are introduced and embodiments of a fault tolerant scheme are disclosed that reduce the number of parity measurements required compared with Shor method. Such schemes are well suited to be implemented in the classical control device of a quantum computer in order to ensure quantum fault tolerance.

7 Claims, 35 Drawing Sheets
(22 of 35 Drawing Sheet(s) Filed in Color)

(56) References Cited

U.S. PATENT DOCUMENTS

2021/0279627 A1* 9/2021 Bauer .................. G06N 10/70

OTHER PUBLICATIONS

Gottesman, Daniel. "Stazbilizer Codes and Quantum Error Correction". California Institute of Technology, 2008.*
"International Search Report and Written Opinion Issued in PCT Application No. PCT/US20/054646", dated Feb. 9, 2021, 12 Pages.
Van Lint, J. H., "Introduction to Coding Theory", in Publication of Springer-Verlag Berlin, vol. 86, Dec. 6, 2012, 244 Pages.
Aharonov, et al., "Fault-tolerant quantum computation with constant error rate", in SIAM Journal on Computing, vol. 38, Issue 4, Jul. 23, 2008, pp. 1-63.
Aliferis, et al., "Quantum accuracy threshold for concatenated distance-3 codes", in Journal of Quantum Information & Computation, vol. 6, Issue 2, Apr. 28, 2005, 58 Pages.
Ashikhmin, et al., "Correction of data and syndrome errors by stabilizer codes", in Journal of Computing Research Repository, Feb. 2016, 6 Pages.
Ashikhmin, et al., "Robust quantum error syndrome extraction by classical coding", in Proceedings of IEEE International Symposium on Information Theory, Jun. 29, 2014, pp. 546-550.
Bombín, Héctor, "Single-shot fault-tolerant quantum error correction", in Journal of Physical Review X, vol. 5, Issue 3, Sep. 28, 2015, 26 Pages.
Bosma, et al., "The Magma Algebra System I: The User Language", in Journal of Symbolic Computation, vol. 24, Issue 3-4, Oct. 1997, pp. 235-265.
Calderbank, et al., "Good quantum error-correcting codes exist", in Journal of Physical Review A, vol. 54, Issue 2, Aug. 1, 1996, 24 Pages.
Campbell, Earl T.,"A theory of single-shot error correction for adversarial noise", in Quantum Science and Technology, May 2018, pp. 1-21.
Chamberland, et al., "Flag fault-tolerant error correction with arbitrary distance codes", in Journal of Quantum, vol. 2, Feb. 8, 2018, pp. 1-29.
Chao, et al., "Quantum error correction with only two extra qubits", in Journal of Physical Review Letters vol. 121, Issue 5, Aug. 1, 2018, 9 Pages.
Delfosse, et al., "Almost-linear time decoding algorithm for topological codes", in Quantum Physics, Sep. 19, 2017, pp. 1-10.
Dennis, et al., "Topological quantum memory", in Journal of Mathematical Physics, vol. 43, Issue 9, Sep. 2002, pp. 1-39.
Fowler, et al., "Surface codes: Toward practical large scale quantum computation", in Journal of Physical Review A, vol. 86, Issue 3, Sep. 18, 2012, pp. 1-54.
Fujiwara, Yuichiro., "Ability of stabilizer quantum error correction to protect itself from its own imperfection", in Journal of Physical Review A, vol. 90, Issue 6, Dec. 1, 2014, pp. 1-9.
Gottesman, Daniel, "An introduction to quantum error correction and fault-tolerant quantum computation", in Proceedings of the Symposia in Applied Mathematics, vol. 68, Apr. 2010, 46 Pages.
Gottesman, Daniel., "Fault-tolerant quantum computation with constant overhead", in Quantum Information & Computation, vol. 14, Issue 15 & 16, Jan. 2014, pp. 1338-1372.
Gottesman, Daniel., "Stabilizer codes and quantum error correction", Submitted in the Partial Fulfillment of the Requirements for the Degree of Doctor of Philosophy, Thesis of California Institute of Technology, May 28, 1997, 122 Pages.
Grassl, Markus., "Code Tables: Bounds on the parameters of various types of codes", Retrieved from: http://www.codetables.de, Retrieved Date: Feb. 1, 2019,1 Page.
Grassl, Markus, "Searching for linear codes with large minimum distance", in Publication of Springer, Berlin, 2006, 2 Pages.
Kovalev, et al., "Fault tolerance of quantum low-density parity check codes with sublinear distance scaling", in Journal of Physical Review A, vol. 87, Issue 2, Feb. 28, 2013, 3 Pages.
MacWilliams, et al., "The theory of error-correcting codes", in Publication of Elsevier, 1977, 771 Pages.
Reiher, et al., "Elucidating reaction mechanisms on quantum computers", in Proceedings of the National Academy of Sciences, vol. 114, Issue 29, Jul. 18, 2017, pp. 7555-7560.
Richardson, et al., "Design of capacity-approaching irregular low-density parity-check codes", in Journal of IEEE Transactions on Information Theory, vol. 47 , Issue 2, Feb. 2001, pp. 619-637.
Shor, Peter W.,"Fault-tolerant quantum computation", in Proceedings of the 37th Annual Symposium on Foundations of Computer Science, Oct. 14, 1996, 11 Pages.
Shor, Peter W.,"Scheme for reducing decoherence in quantum computer memory", in Journal of Physical review A, vol. 52, Issue 4, Oct. 1, 1995, 4 Pages.
Steane, Andrew M.,"Efficient fault-tolerant quantum computing", in Journal of Nature, vol. 399, Issue 6732, Oct. 1998, pp. 1-24.
Steane, Andrew W.,"Multiple-Particle Interference and Quantum Error Correction", in Proceedings of the Royal Society of London. Series A: Mathematical, Physical and Engineering Sciences,vol. 452, Issue 1954, Nov. 8, 1996, 45 Pages.
Svore, et al., "Noise threshold for a fault-tolerant two-dimensional lattice architecture", in Journal of Quantum Information & Computation, vol. 7, Issue 4, May 2007, pp. 1-22.
Tanner, R. Michael, "A recursive approach to low complexity codes", in Journal of IEEE Transactions on Information Theory, vol. 27, Issue 5, Sep. 1981, pp. 533-547.
Delfosse, et al., "Fault-tolerant error correction", Jun. 5, 2019, pp. 1-29.

* cited by examiner

FAULT TOLERANT QUANTUM ERROR CORRECTION WITH LINEAR CODES

FIELD

This application is related to quantum computing. In particular, this application relates to tools and techniques for performing fault tolerant quantum error correction using linear codes.

SUMMARY

Fault tolerance is necessary in order to perform a useful computation on a quantum computer that suffers from an uninterrupted flow of faults. A combination of quantum and classical techniques can be used in order to constantly correct errors and avoid their propagation. A decoder is desirably implemented on the classical control device in order to identify the errors that occur. This is a purely classical task that deserves a classical solution.

This disclosure focuses on example embodiments of a classical approach to the problem of quantum error correction in the presence of faults. Linear codes equipped with imperfect parity measurements are considered. Embodiments of a fault tolerant scheme are disclosed that reduce the number of parity measurements required compared with Shor method. Such schemes are well suited to be implemented in the classical control device of a quantum computer in order to ensure quantum fault tolerance.

In some embodiments, a fault-tolerant error-correction scheme for a quantum computing device is generated. The fault-tolerant error-correction scheme produces a sequence of parity measurements over a set of qubits in the quantum computing device. The fault-tolerant error-correction scheme is implemented in the quantum computing device. A look-up-table-based fault-tolerant decoder can be run in a classical computing device. Based on the measurement outcomes, an error-correction action is performed, either in hardware or in software.

In another embodiment, a fault-tolerant error-correction scheme for implementation on a quantum computing device is generated. In this embodiment, the fault-tolerant error-correction scheme is configured to produce a plurality of cat states in a two-dimensional grid of qubits in the quantum computing device. The fault-tolerant error-correction scheme is caused to be generated in a plurality of qubits of the quantum computing device. One or more of the cat states are measured. An error-correction action is performed.

In a further embodiment, a fault-tolerant error-correction scheme is generated and implemented in the quantum computing device. In this embodiment, the fault-tolerant error-correction scheme produces a plurality of cat states in a grid of qubits in the quantum computing device. One or more cat states are measured. An error-correction action is caused to be performed on the quantum device (e.g., based on the measurements).

BRIEF DESCRIPTION OF THE DRAWINGS

The patent or application file contains at least one drawing executed in color. Copies of this patent or patent application publication with color drawing(s) will be provided by the Office upon request and payment of the necessary fee.

can be used to measure the syndrome of $X^{\otimes w}$, as shown here with w=4.

Figure 11A:
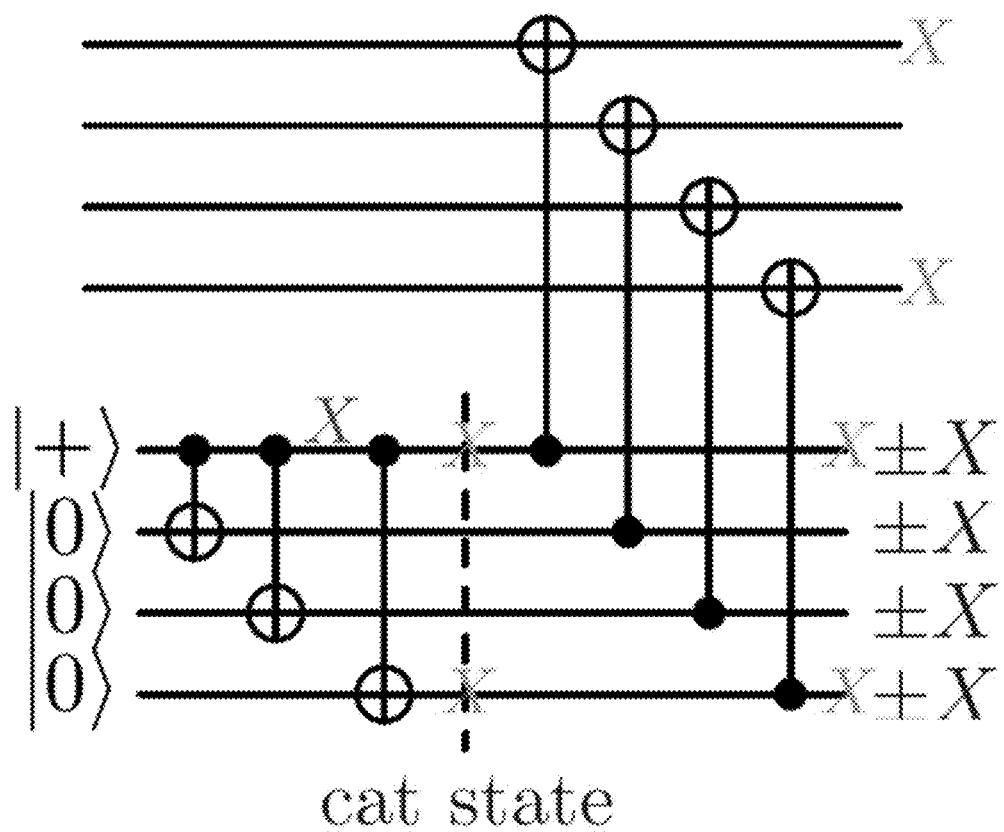
FIG. 11(A) is a schematic block diagram of a w-qubit cat state, $$\frac{1}{\sqrt{2}}(|0^w\rangle + |1^w\rangle),$$
Figure 11B:
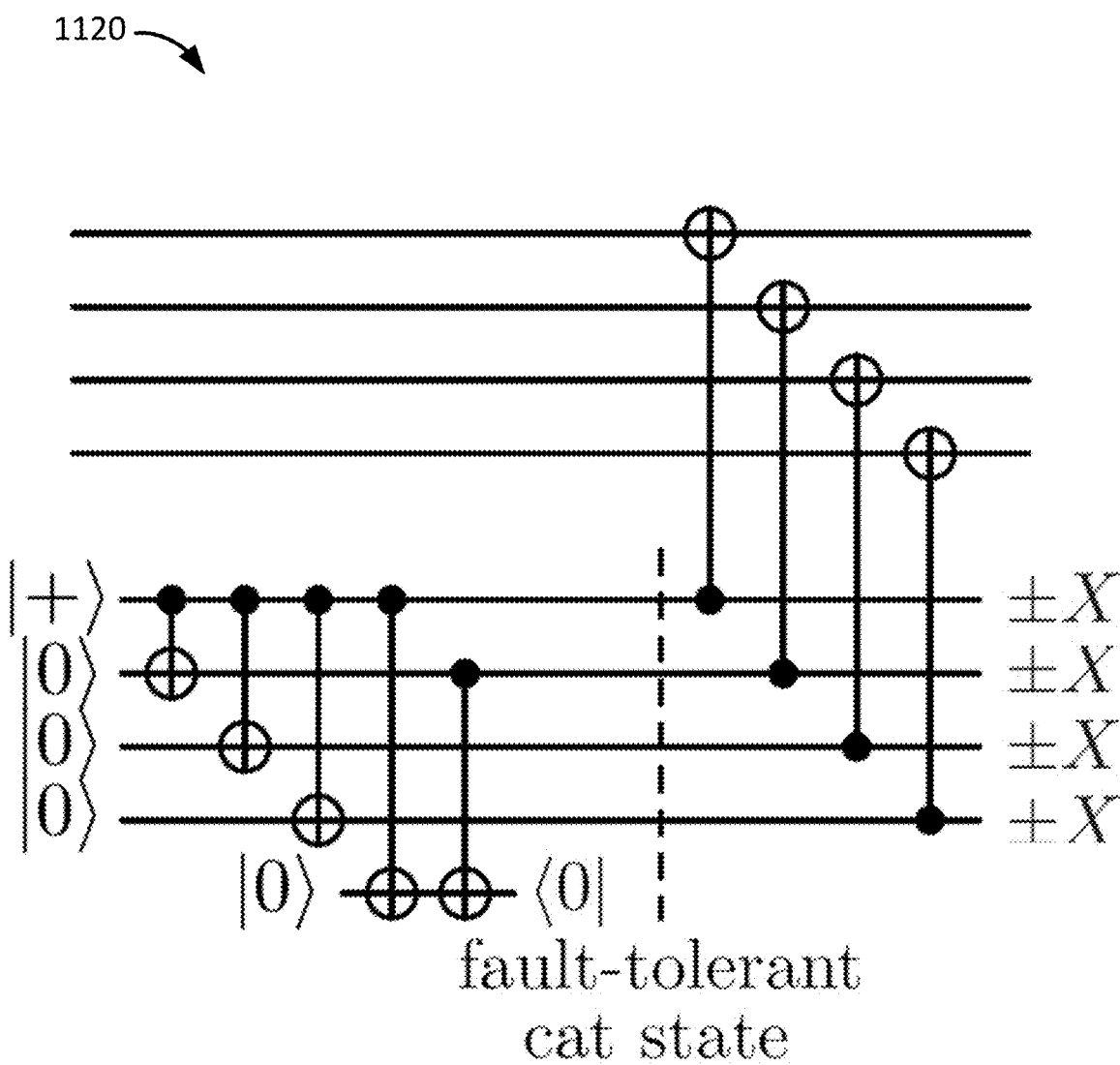

FIG. 11(B) is a schematic block diagram illustrating a cat state should be prepared fault tolerantly, which here it is not: a single X fault, at the location ill red, spreads to a weight-two X error on the data.

Figure 12A:
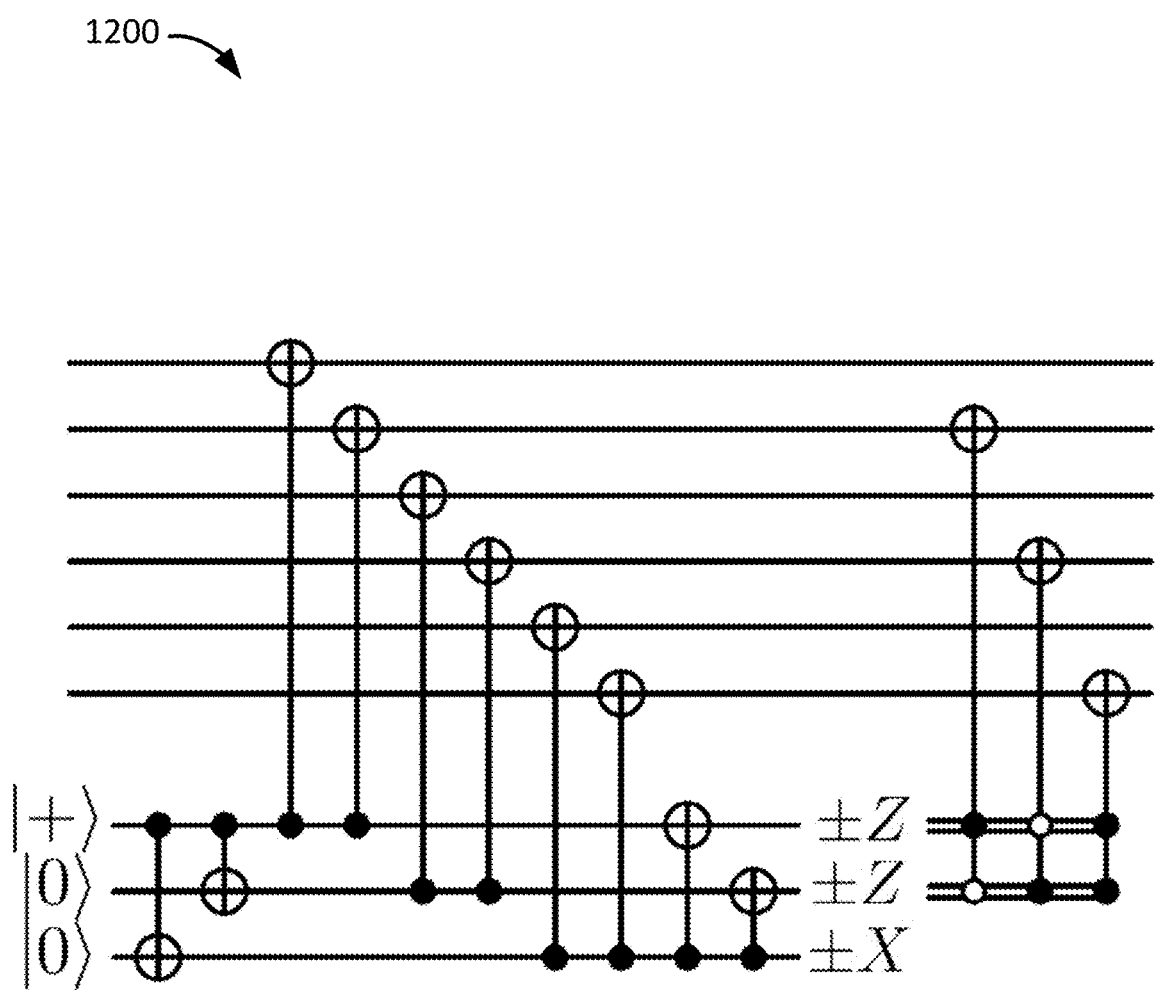
Figure 12B:
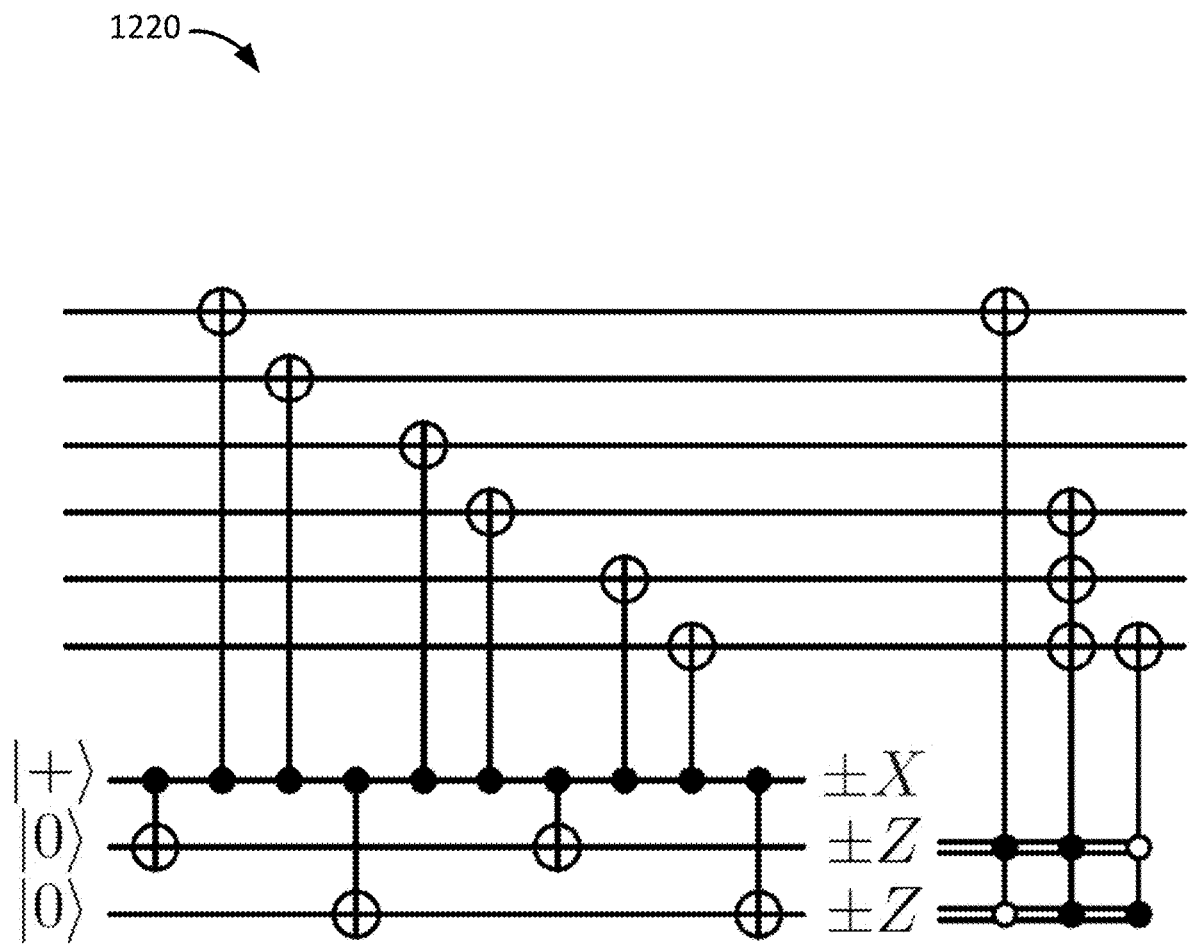

FIGS. 12(A) and 12(B) show two circuits for measuring $X^{\otimes 6}$ using three ancilla qubits.

Figure 13:
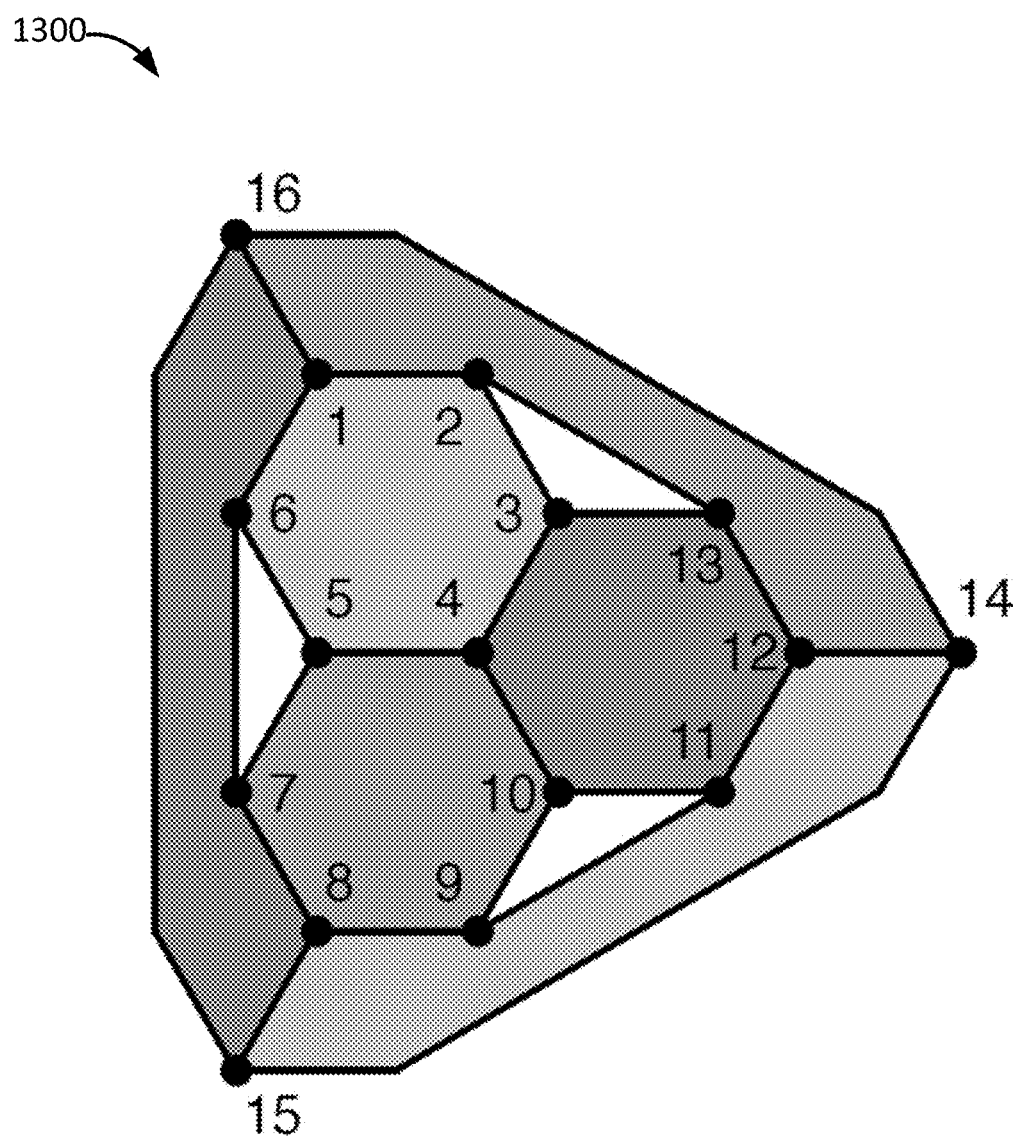

FIG. 13 illustrates a 16-qubit color code.

Figure 14:
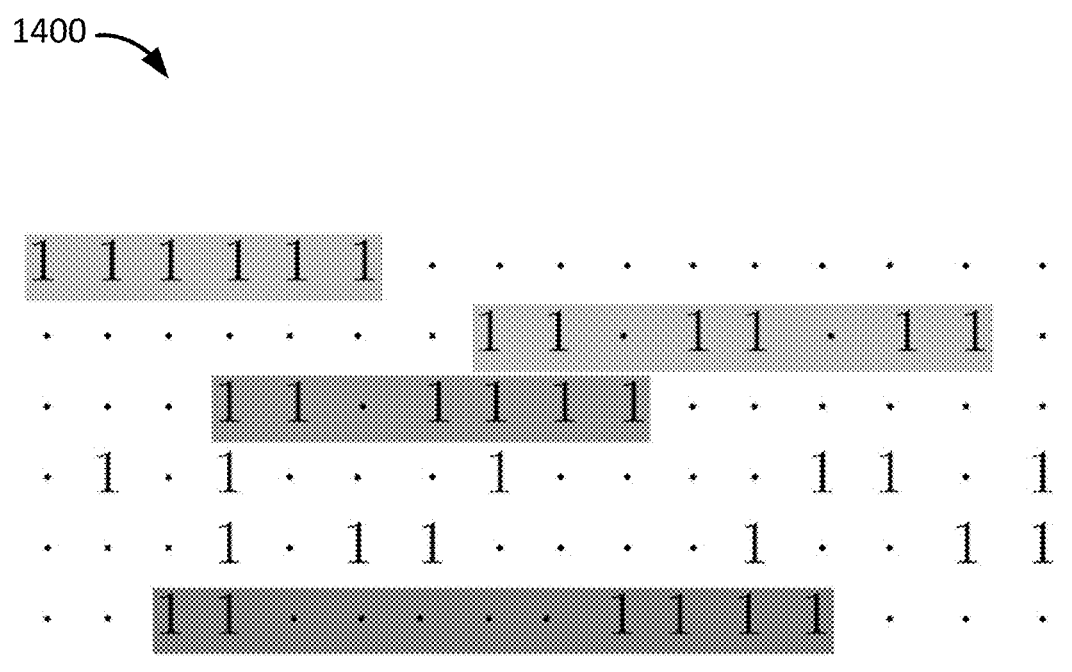

FIG. 14 illustrates a sequence of syndrome measurements for an example 16, 4, 3 code in both Z and X bases, allowing for fault-tolerant error correction, where • are written in place of 0 to draw attention to the structure.

Figure 15:
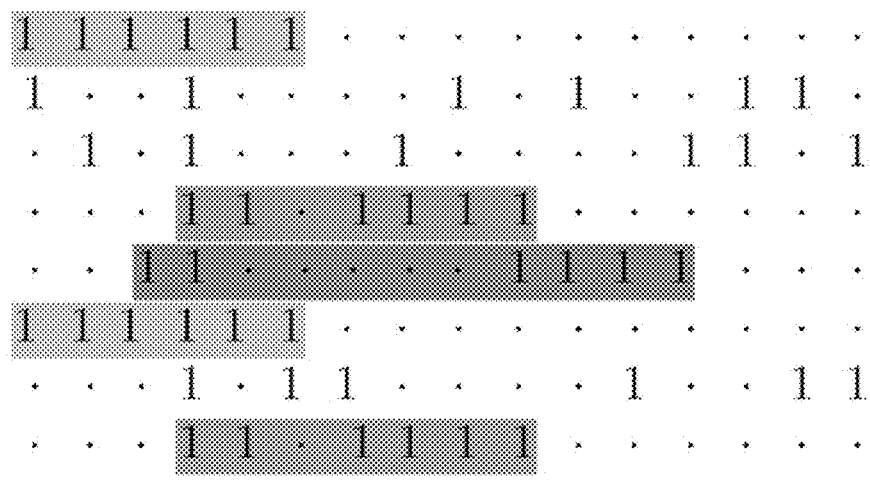

FIG. 15 illustrates a sequence of syndrome measurements in both Z and X bases that allows for concatenation fault-tolerant error correction.

Figure 16A:
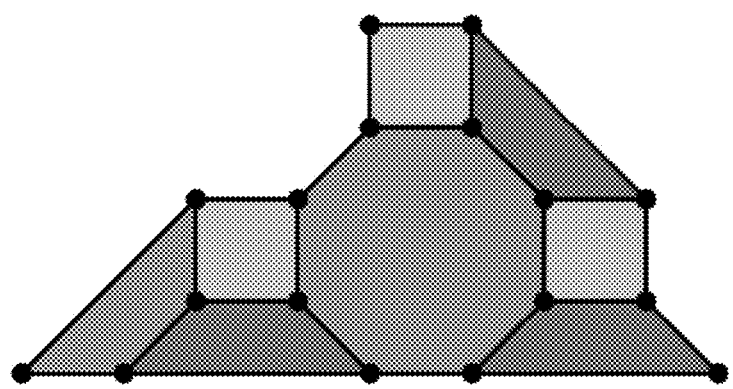

FIG. 16(A) illustrates an 17, 1, 5 color code.

Figure 16B:
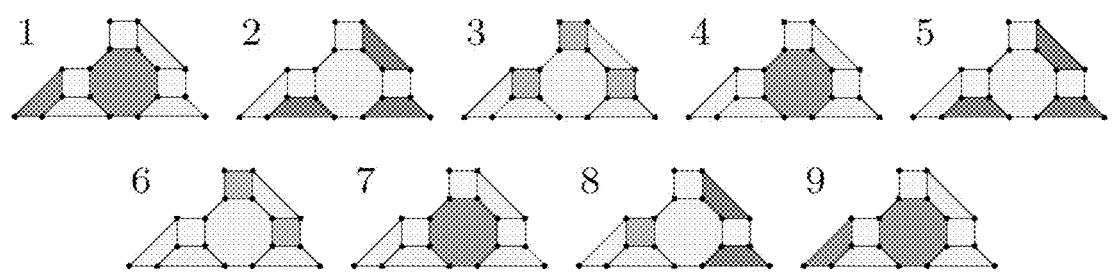

FIG. 16(B) illustrates an example of how fault-tolerant Z error correction can be accomplished with nine rounds of fault-tolerantly measuring X plaquette stabilizers, 20 syndrome measurements total, in the illustrated order.

Figure 17:
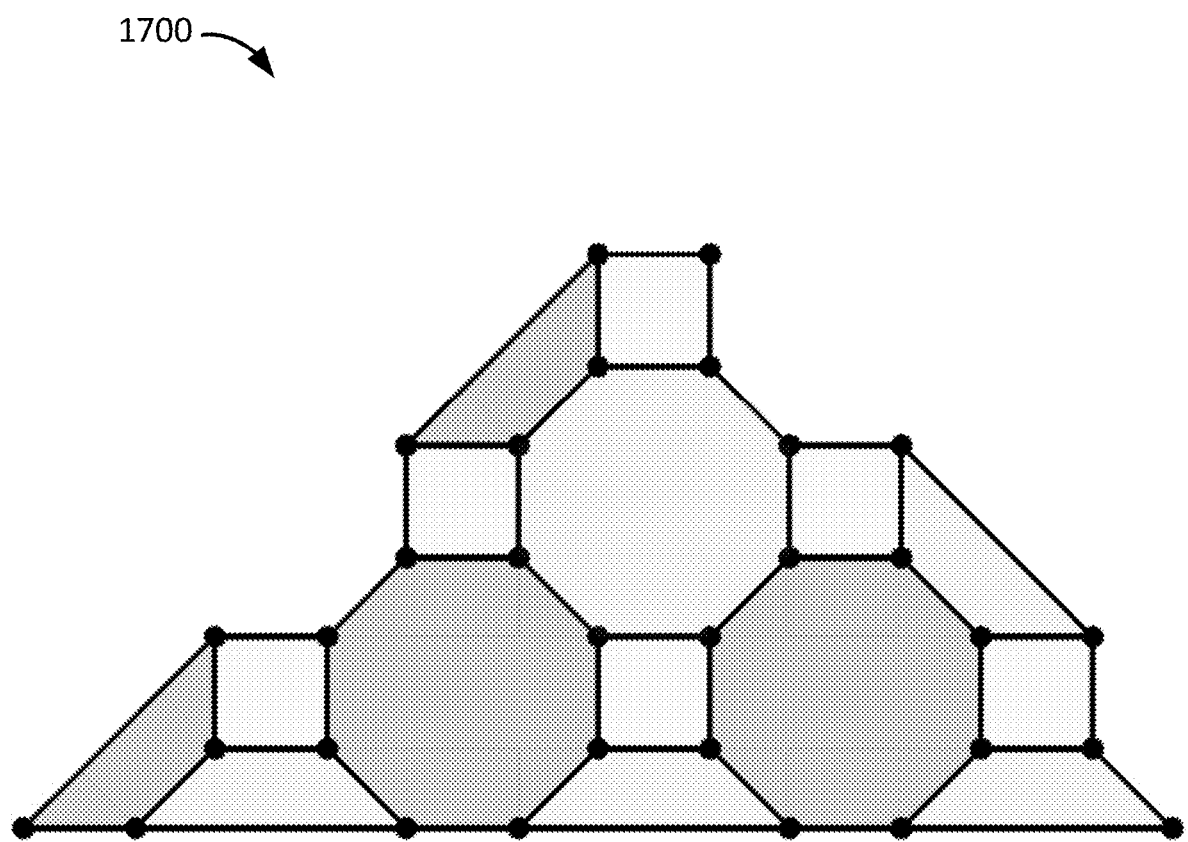

FIG. 17 is a schematic block diagram showing hexagonal color codes for the color code from FIGS. 16(A) and 16(B).

Figure 18:
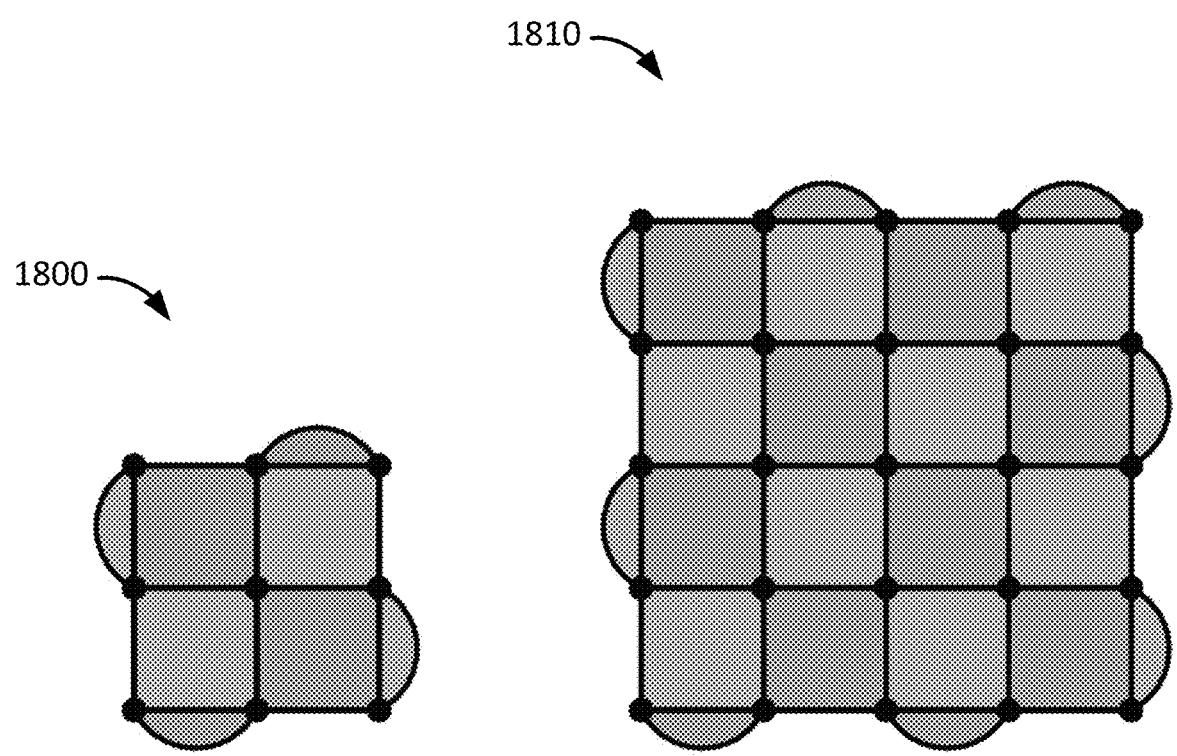

FIG. 18 illustrates examples of certain surface codes as described herein.

Figure 19:
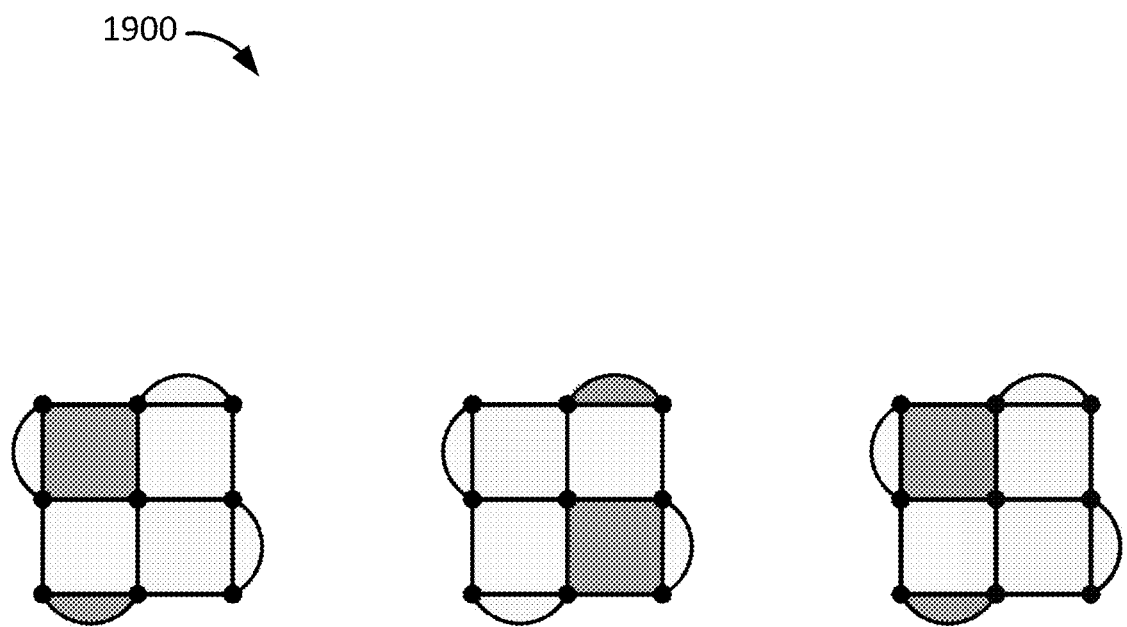

FIG. 19 is a schematic block diagram for a 9, 1, 3 code, six syndrome measurements, applied in three rounds, which suffice for fault-tolerant X error correction.

Figure 20:
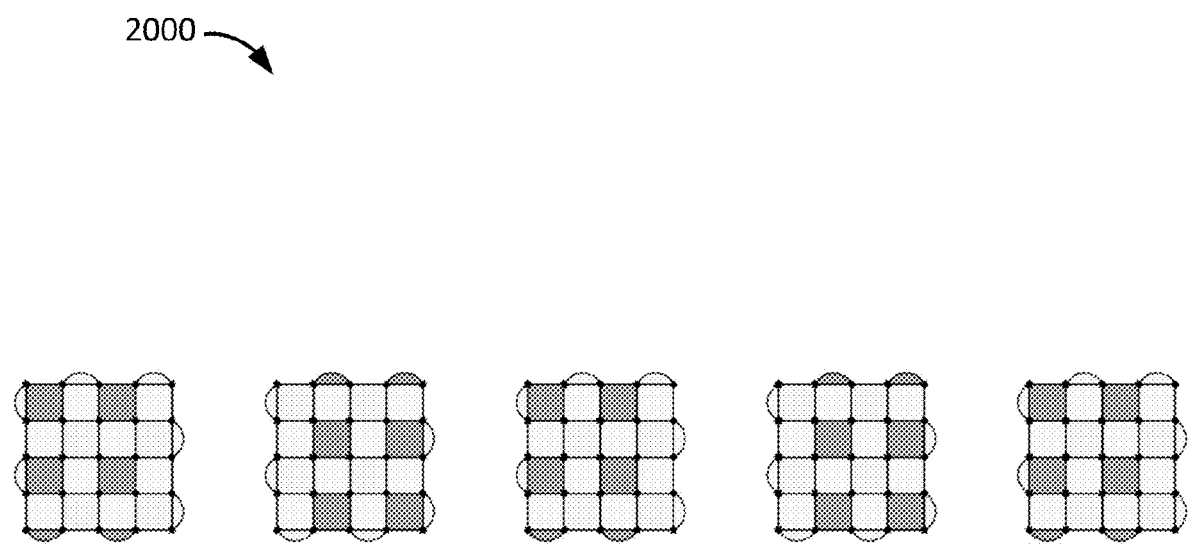

FIG. 20 is a schematic block diagram for a 25, 1, 5 code, 30 Z measurements, applied in five rounds, which suffice for distance-five fault-tolerant X error correction.

Figure 21:
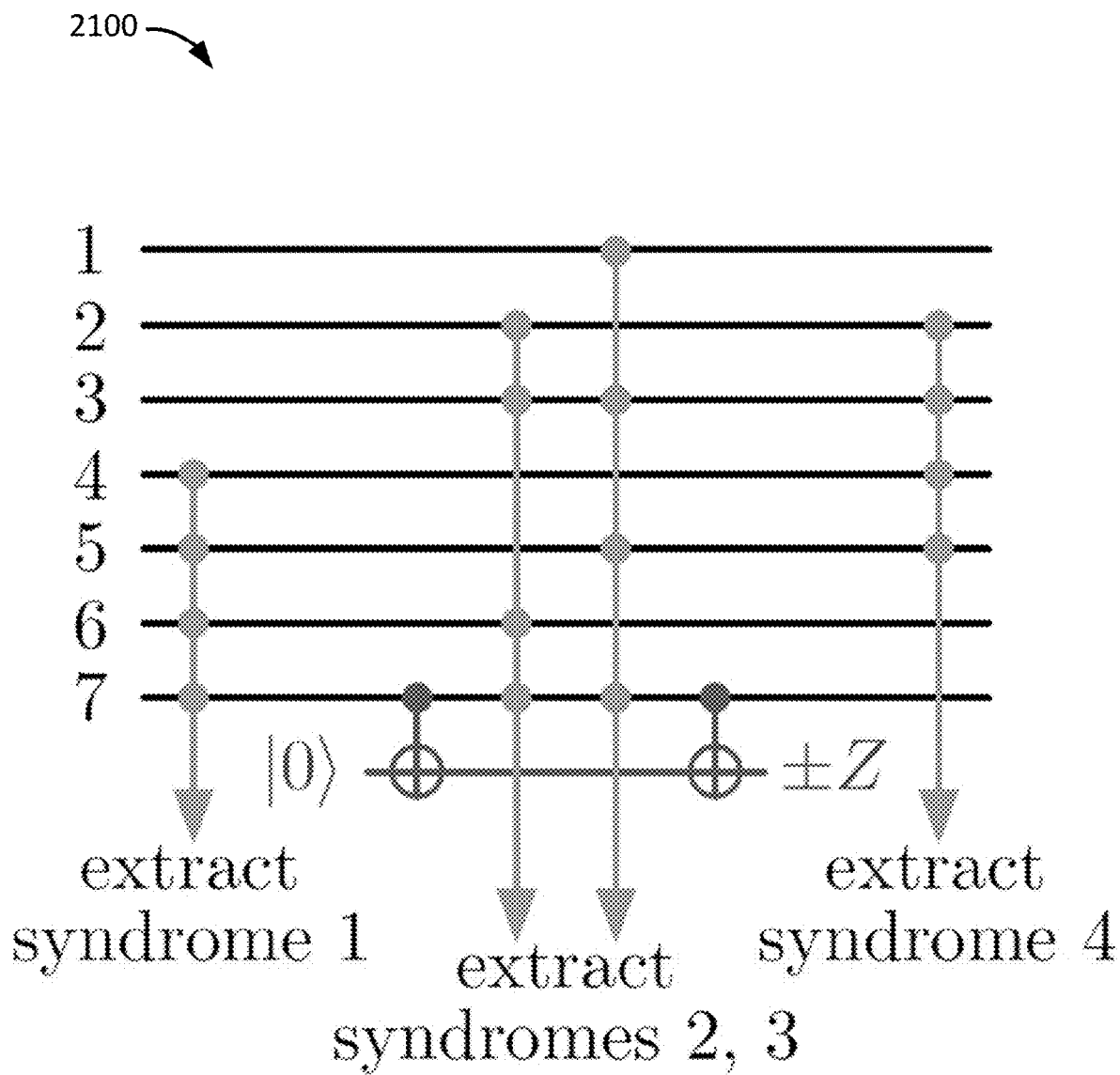

FIG. 21 is an example of placing a "flag" on a particular qubit in order to address an internal error.

Figure 22:
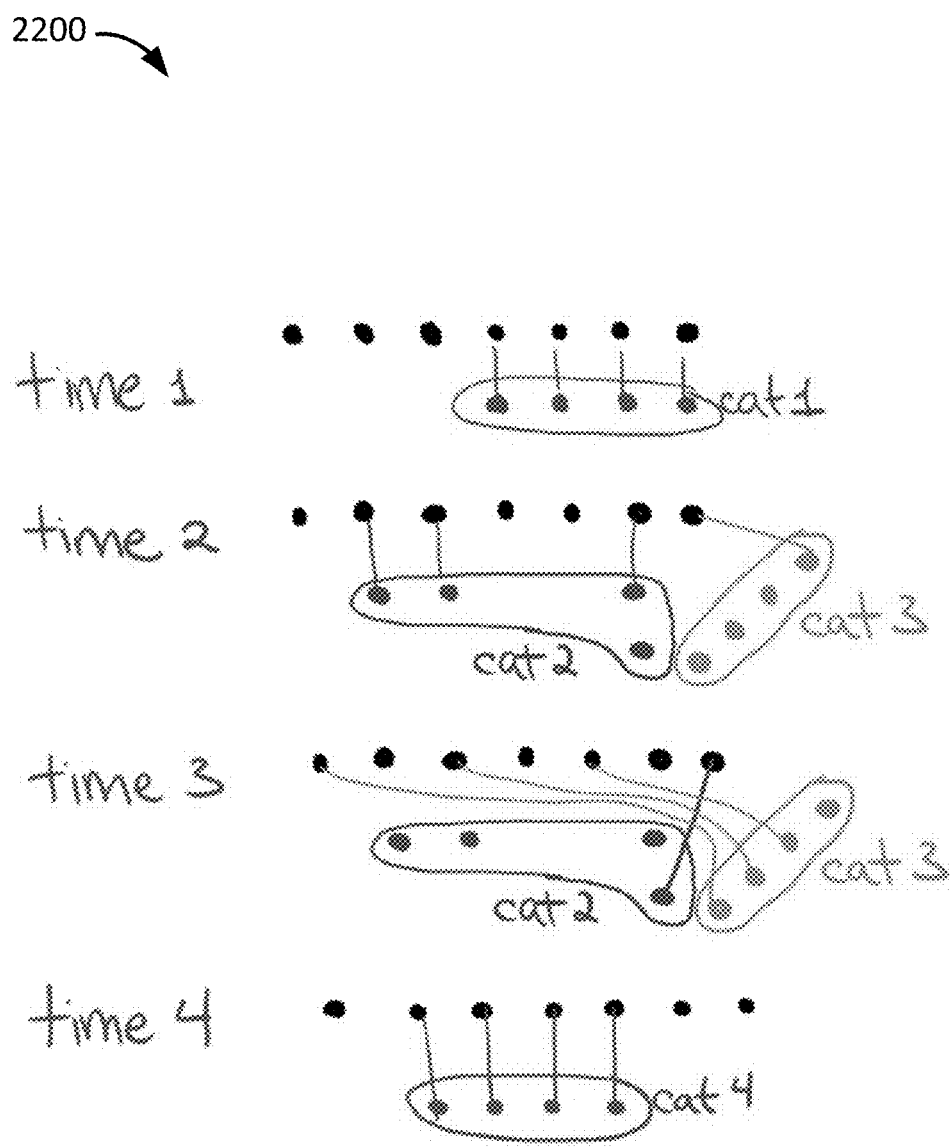

FIG. 22 is a schematic block diagram 2200 illustrating another way of implementing 7, 1, 3 code fault-tolerant X error correction with four non-adaptive syndrome measurements is to extract some syndromes in parallel, partially reordered.

Figure 23:
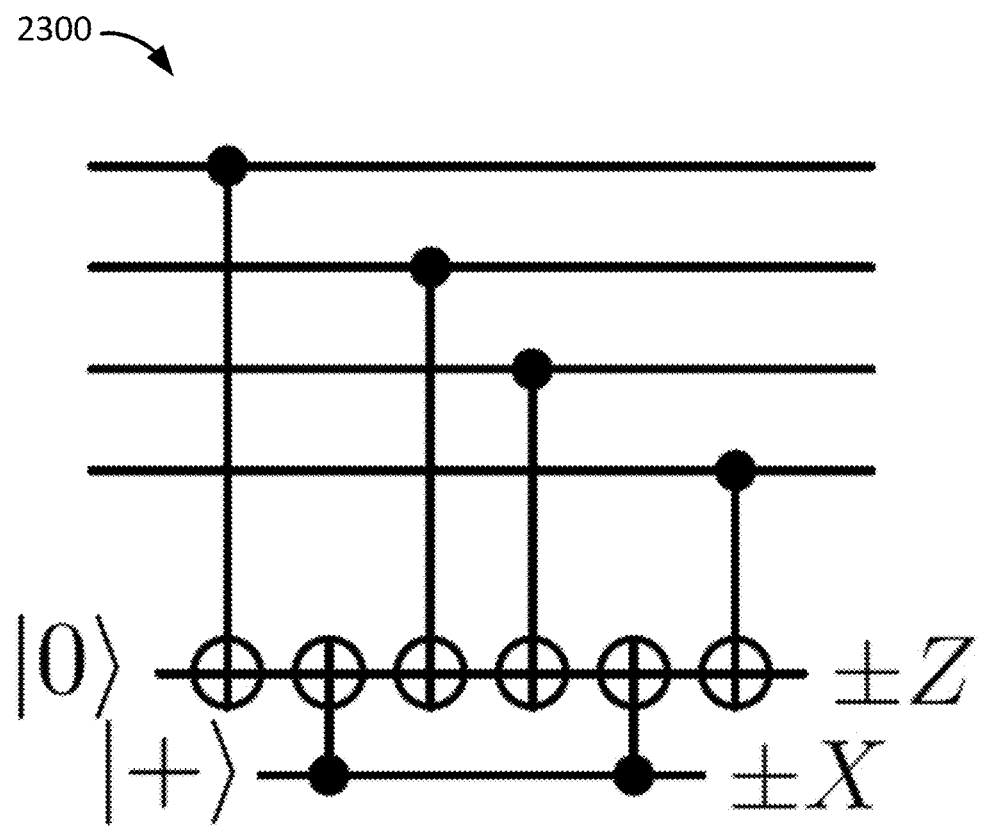

FIG. 23 shows a flagged circuit for measuring the syndrome of a weight-four Z stabilizer.

Figure 24:
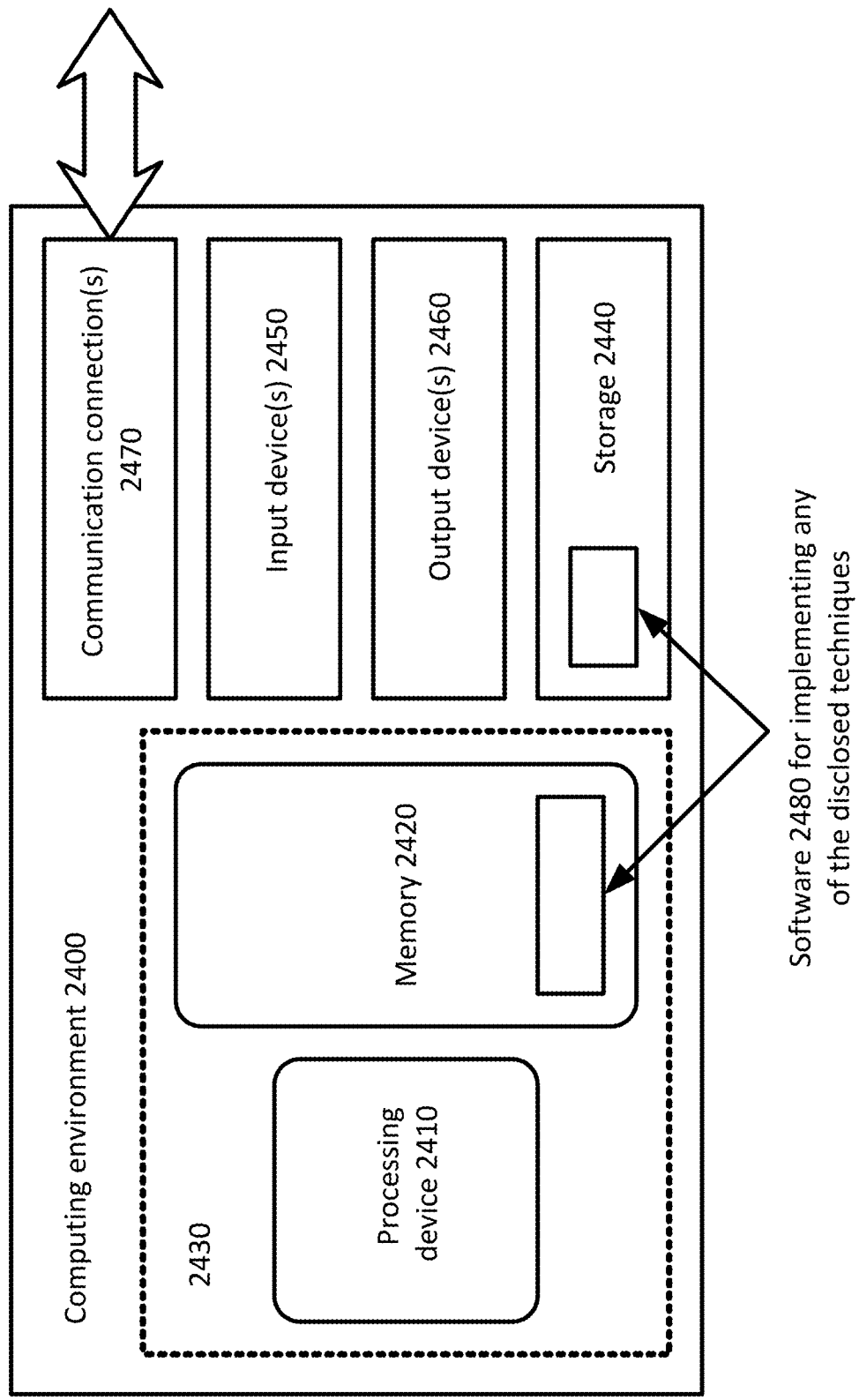

FIG. 24 illustrates a generalized example of a suitable classical computing environment in which aspects of the described embodiments can be implemented.

Figure 25:
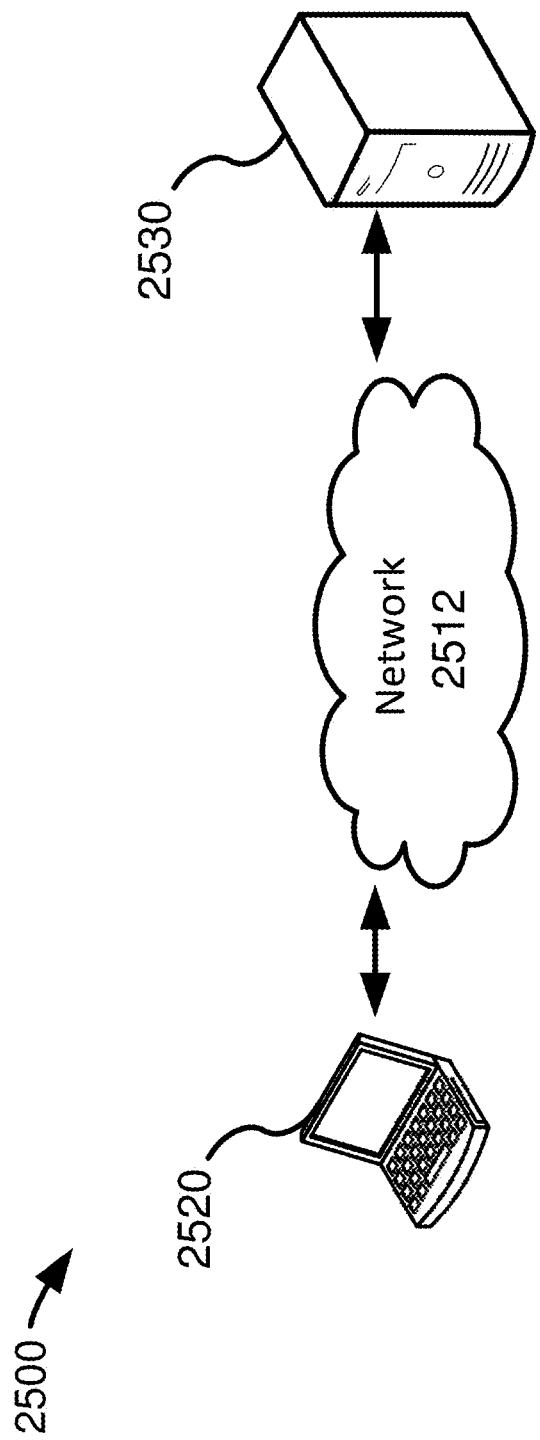

FIG. 25 illustrates an example of a possible network topology (e.g., a client-server network) for implementing a system according to the disclosed technology.

Figure 26:
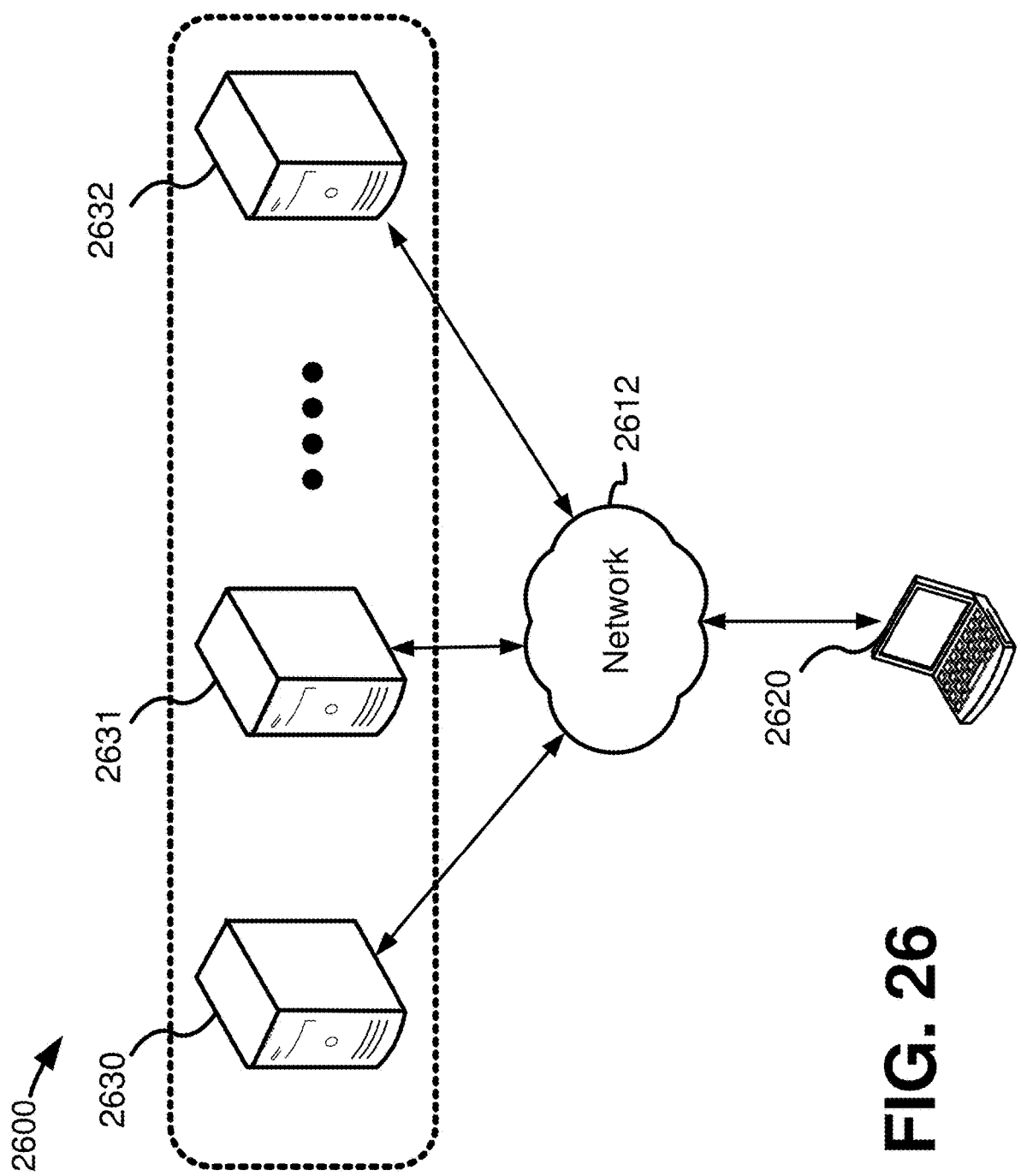

FIG. 26 illustrates another example of a possible network topology (e.g., a distributed computing environment) for implementing a system according to the disclosed technology.

Figure 27:
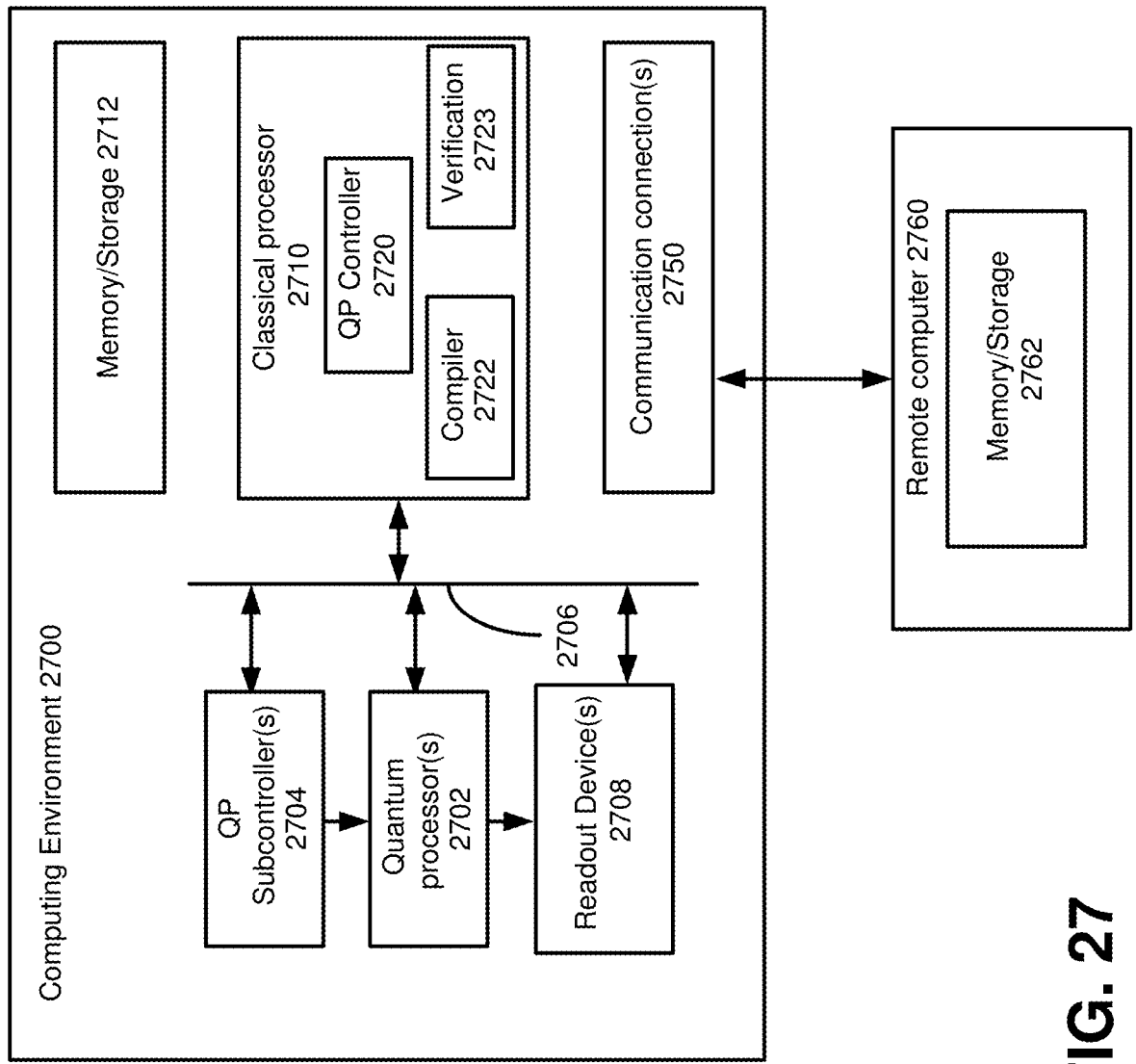

FIG. 27 illustrates an exemplary system for implementing the disclosed technology in which the system includes one or more classical computers in communication with a quantum computing device.

Figure 28:
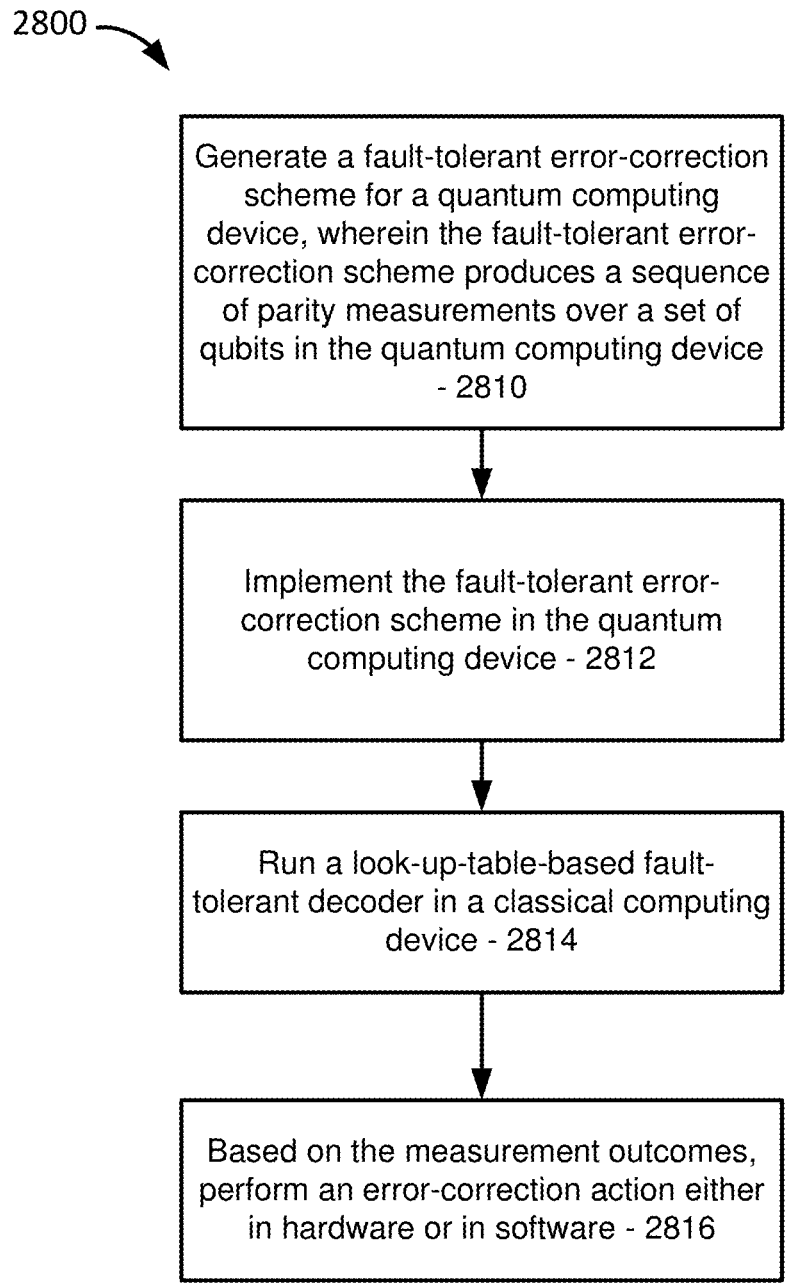
Figure 29:
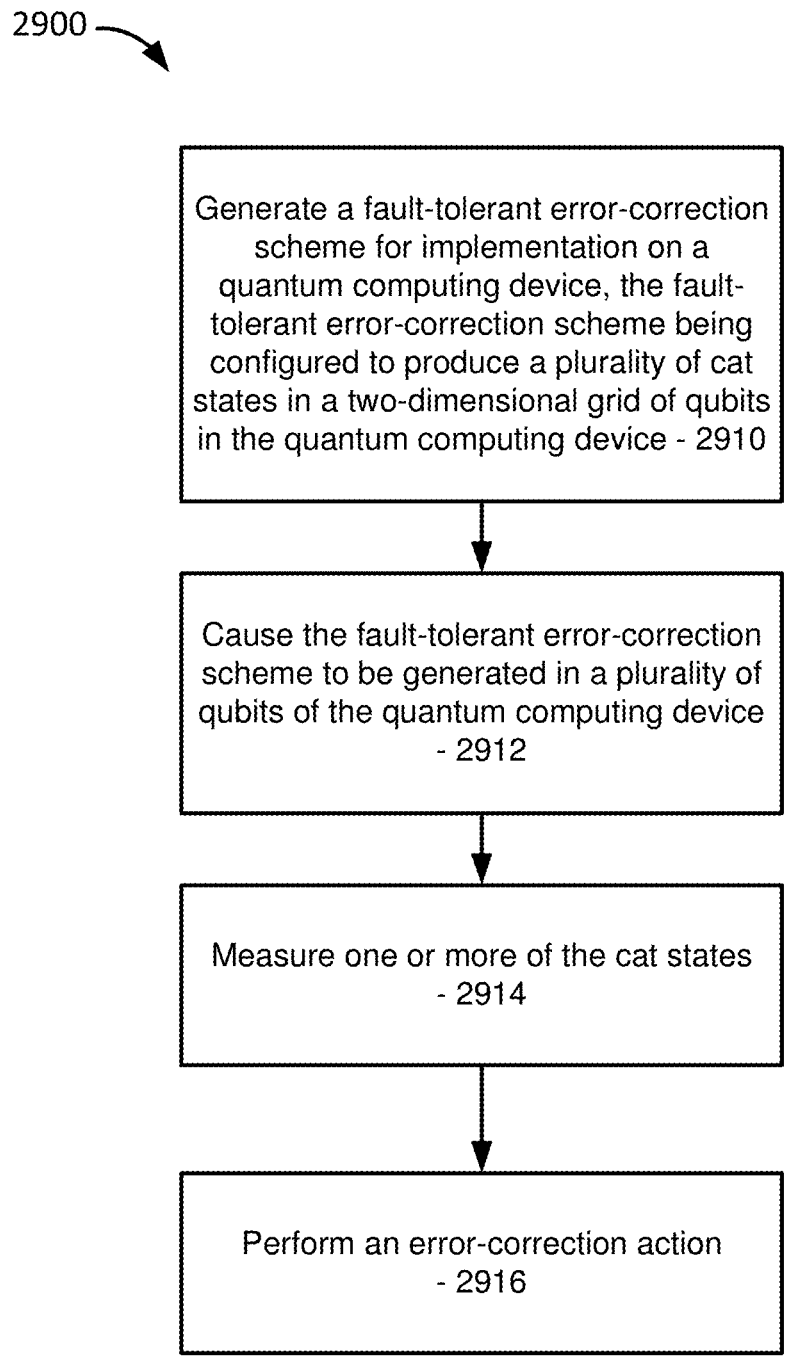
Figure 30:
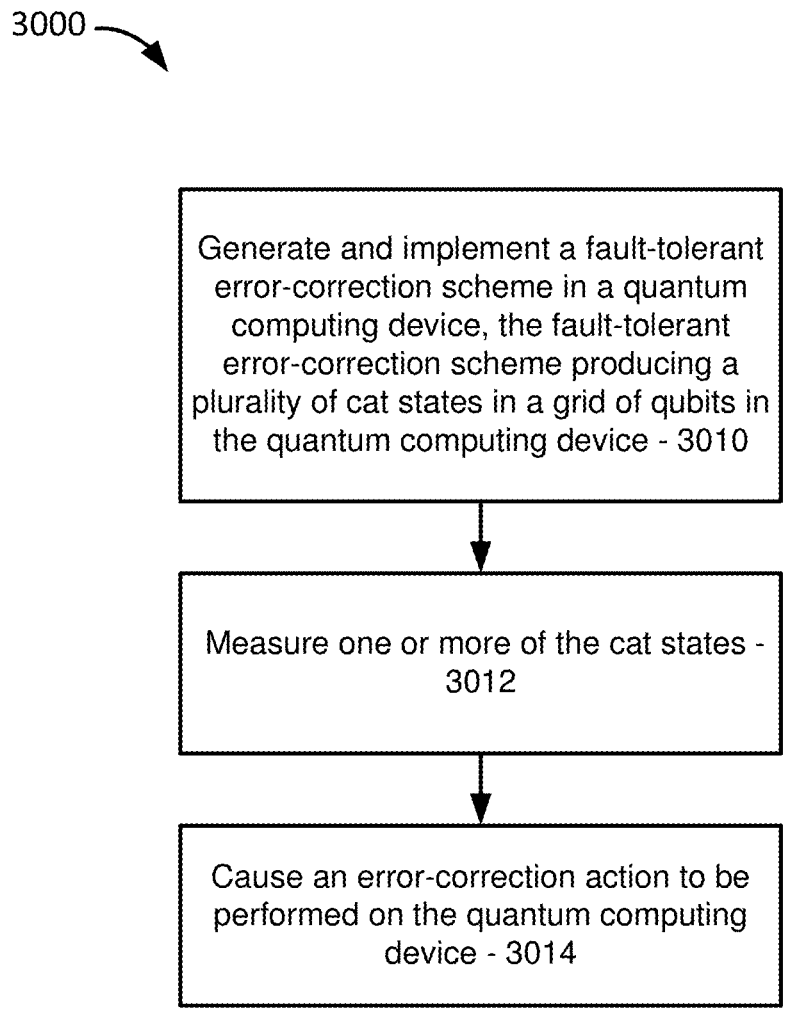

FIGS. 28-30 are flow charts for performing example embodiments of the disclosed technology.

DETAILED DESCRIPTION

1 General Considerations

As used in this application, the singular forms "a," "an," and "the" include the plural forms unless the context clearly dictates otherwise. Additionally, the term "includes" means "comprises." Further, the term "coupled" does not exclude the presence of intermediate elements between the coupled items. Further, as used herein, the term "and/or" means any one item or combination of any items in the phrase.

Although the operations of some of the disclosed methods are described in a particular, sequential order for convenient presentation, it should be understood that this manner of description encompasses rearrangement, unless a particular ordering is required by specific language set forth below. For example, operations described sequentially may in some cases be rearranged or performed concurrently. Moreover, for the sake of simplicity, the attached figures may not show the various ways in which the disclosed systems, methods, and apparatus can be used in conjunction with other systems, methods, and apparatus. Additionally, the description sometimes uses terms like "produce" and "provide" to describe the disclosed methods. These terms are high-level abstractions of the actual operations that are performed. The actual operations that correspond to these terms will vary depending on the particular implementation and are readily discernible by one of ordinary skill in the art.

2 Fault-Tolerant Quantum Error Correction 2.1 Introduction

Fault tolerance is necessary in order to perform a useful computation on a quantum computer that suffers from an uninterrupted flow of faults. This work focuses on the classical aspects of the problem of quantum error correction in the presence of faults. No notion of quantum information is required to understand this work. We consider linear codes equipped with faulty parity check measurements and we design a fault-tolerant error correction scheme that requires a small number of parity check measurements. We propose an algorithm that produces a short fault-tolerant sequence of parity measurements given a linear code. Asymptotically, it is proven that fault-tolerant error correction can be achieved with a linear code of minimum distance d using $O(d^{1+\epsilon})$ parity check measurements. For comparison, a basic implementation of Shor fault-tolerant scheme requires $(n-k)(d+1)^2/4$ parity measurements for a [n, k, d]-linear code.

As memory scales to higher density, error rates rise and new sources of error emerge, requiring extensive error correction. Ultimately, at the quantum scale, any manipulation of a quantum system introduces an error with a non-negligible probability. In this section, the problem of error correction with a faulty device is discussed. A fault-tolerant error correction scheme that is flexible is designed since it can be implemented over any linear code and a look-up table decoder is considered that provides an extremely fast decoder as long as enough memory is available.

Error correction is based on the computation of a set of parity bits called syndrome bits. The syndrome allows to identify the error corrupting data and to correct it. Faults may occur during the syndrome measurement resulting either in incorrect syndrome bits or in additional errors injected in the data. This context is familiar to both the classical and the quantum computing community. The reliability of modern dense classical storage devices is guaranteed by error correction. The values stored in memory can be read and copied in another location where error correction is performed. The corrected data can then be updated in the memory. This refresh by error correction cannot be done with quantum data. Quantum information is encoded in a set of correlated qubits. Measuring a single qubit of an encoded state would destroy these correlations. Only a subset of measurements is available. Moreover, a general quantum state cannot be copied. Linear codes can be used in the quantum setting thanks to the CSS construction and the stabilizer formalism. One can incorporate the quantum constraints as follows.

If a linear code with parity check matrix H is used for quantum error correction, the only measurements available are the parity checks that are linear combinations of the rows of H.

In this section, it is assumed that this constraint must be satisfied for all measurement schemes. One of the motivations for focusing on this unique quantum constraint is twofold. First, it is desirable to emphasize the aspects of quantum fault tolerance that are of purely classical nature and that deserves classical solutions. We voluntarily ignore some quantum facets of the problem such as the design of the parity measurement circuit. Second, this work and the mathematical questions it raises is hoped to be accessible to a broader audience by keeping a classical coding theory language.

Shor developed the first quantum error correcting code in 1995. However, the presence of faults makes error correction quite challenging to implement in a quantum device since the measurement outcomes observed cannot be trusted. The following year, Shor again introduced a fault-tolerant mechanism in order to perform quantum error correction with faulty components. This line of work lead to the threshold theorem that demonstrates that an arbitrary long quantum computation can be performed over a fault quantum device at the price of a reasonable asymptotic overhead if the noise strength is below a certain threshold value. An elegant proof of this result based on a notion of fault-tolerant computation for concatenated codes was proposed later. Although asymptotically reasonable, the overhead required for fault tolerance is still far too large for practical applications.

In this section, an example fast error correction scheme is disclosed, reducing the time overhead for fault-tolerant error correction. The basic idea of Shor fault-tolerant scheme is to repeat the syndrome measurement until it is observed the same syndrome consecutively enough times. One can then rely on the syndrome value and correct errors accordingly. For a linear code encoding k bits into n bits with minimum distance d, Shor scheme requires up to $((d+1)/2)^2$ repetitions of the syndrome measurement, that is $(n-k)(d+1)/2)^2 \geq \Omega(d^3)$ parity check measurements. This large time overhead is also present in other fault-tolerant quantum error correction schemes. Flag error correction that considerably reduces the number of extra qubits required to perform error correction, leads to a similar time overhead. The Steane method implements the syndrome readout in constant depth, however the difficulty is transferred to the preparation of an ancilla state. In the present disclosure, it is proven that fault-tolerant error correction with an arbitrary linear code respecting the quantum constraint can be implemented with at most $O(d^{1+\alpha})$ parity check measurements for $\alpha>0$ arbitrarily small.

An algorithm is proposed that generates a short measurement sequence for fault-tolerant error correction with an arbitrary linear code. Over practical examples, one can obtain a significant reduction of the number of measurements required for fault tolerance. The distance-three Hamming code only requires five measurements instead of 12 for Shor scheme. For a distance five BCH codes, one can obtain a fault-tolerant scheme using 16 measurements while Shor would need 72 parity measurements. Golay codes can be implemented using a fault-tolerant sequence of 27 measurements instead of 176 measurements with Shor method. This speed-up is doubly beneficial for error correction. One the one hand it reduces the logical cycle time of the quantum computer. On the other hand, less measurement introduces less noise during the correction cycle, improving the lifetime of logical qubits.

The following properties make embodiments of the fault-tolerant error correction scheme well suited for error correction in a quantum device. (i) A small number of parity measurements is required. (ii) The measurements realized are not adaptive, i.e. they do not depend on the outcome observed previously. (iii) It can be implemented as a look up table decoder for small codes, providing an extremely fast decoder that runs in constant time independent of the error configuration.

The basic idea of this example scheme is to extract as much safe information as possible from the measurement of a redundant set of parity checks.

The example fault-tolerant decoder applies to arbitrary linear codes and takes into account measurement errors affecting the data that are not considered in other works.

2.2 Fault-Tolerant Error Correction 2.2.1 Background on Error Correction

Error correction based on classical binary linear codes is considered in this subsection.

A linear code C or simply a code with parameters [n, k] is defined to be a k-dimensional subspace of $\mathbb{Z}_2^n$. The integer n is called the length of the code. The $2^k$ vectors of C are called codewords. Picking a linear code C consists in selecting a subspace of the bit strings of length n. When the selected codewords are far apart from each other, this allows us to identify a codeword even if a few of its bits are flipped. The minimum distance d of the code, defined as the minimum Hamming weight |x| of a non-zero codeword x of C, measures the error correction capability of the code. When d is known, it is denoted by [n, k, d] the parameters of the code. If some bits of a codeword x are flipped, it is mapped onto y=x+e for some $e \in \mathbb{Z}_2^n$. The support of e corresponds to the flipped bits. One can recover x by picking the closest codeword from y when the number of bit flips that occur satisfies $|e| \leq (d-1)/2$.

A linear code can be defined by a generator matrix $G \in M_{k,n}(\mathbb{Z}_2)$, such that the rows of G form a basis of C. The code C is the set of vectors xG, where $x \in \mathbb{Z}_2^k$. The transformation $x \to xG$ is an encoding map. Alternatively, a linear code can be given by a parity check matrix $H \in M_{r,n}(\mathbb{Z}_2)$, such that the codewords of C are the vectors x with $xH^T=0$.

For example, Hamming code is a code with parameters [6, 4, 3] is defined by the parity check matrix $$H = \begin{pmatrix} 1 & 0 & 1 & 0 & 1 & 0 & 1 \\ 0 & 1 & 1 & 0 & 0 & 1 & 1 \\ 0 & 0 & 0 & 1 & 1 & 1 & 1 \end{pmatrix}. \quad (1)$$

The two following generator matrices $$G_1 = \begin{pmatrix} 1 & 0 & 0 & 1 & 1 & 0 \\ 0 & 1 & 0 & 1 & 0 & 1 \\ 0 & 0 & 1 & 0 & 1 & 1 \end{pmatrix} \text{ and} \quad (2)$$

$$G_1 = \begin{pmatrix} 1 & 0 & 0 & 1 & 0 & 1 & 1 & 0 & 0 & 1 \\ 0 & 1 & 0 & 1 & 1 & 0 & 1 & 0 & 1 & 0 \\ 0 & 0 & 1 & 1 & 1 & 1 & 1 & 1 & 0 & 0 \end{pmatrix}$$

define two linear codes with parameters [6, 3, 3] and [10, 3, 5] respectively.

Assume that an error e occurs on a codeword x in the code C, resulting in x'=x+c. Error correction is based on the computation of the syndrome $s=(x+e)H^T$. A non-trivial syndrome indicates the presence of an error. The value of the syndrome depends only on the error e. By decoding, estimating the error e given its syndrome s is mean. A decoder is a map D: $\mathbb{Z}_2^r \to \mathbb{Z}_2^n$. The decoding is said to be successful when c is correctly identified by the decoder that is if D(s)=e. For practical purposes, an efficient implementation of the map D is required.

For purposes of this disclosure, call minimum weight error decoder or MWE decoder, a decoder that returns an error with minimum weight among the errors with syndrome s, where s is the observed syndrome. In what follows. $D_{MWE}^H$ denotes a MWE decoding map for the code C with parity check matrix H. A MWE decoder successfully identifies any error e with weight up to (d−1)/2.

A standard noise model in information theory is the binary symmetric channel with crossover probability p. Each bit is flipped independently with probability p. A MWE decoder can be used to correct this type of noise since when p<½ the error $\hat{e}=D_{MWE}^H(s)$ returned for a syndrome s is a most likely error (MLE) for the binary symmetric channel, i.e. it maximizes the conditional probability $\mathbb{P}(e|s)$ among the errors with syndrome s. The notation $\hat{e}$ is used to refer to an estimation of the error e.

In what follows, $\mathbb{P}$ denotes the Bernoulli distribution over $\mathbb{Z}_2$ defined by $\mathbb{P}_p(0)=1-p$ and $\mathbb{P}_p(1)=p$. The corresponding product distribution over $\mathbb{Z}_2^n$ is denoted $$\mathbb{P}_{n,p} = \sum_{i=1}^{n} \mathbb{P}_p.$$

When the noise is described by a binary symmetric channel, a bit string x of length n is mapped onto the bit string x+e with probability $\mathbb{P}_{n,p}(e)=p^{|e|}(1-p)^{n-|e|}$. Also considered herein, a noise model where the bit flip probability varies over the n bits. Then the error is sampled from the distribution $$\mathbb{P}_{p_1,\ldots,p_n} = \sum_{i=1}^{n} \mathbb{P}_{p_i}$$

where $p_i$ the bit flip probability over bit i. We have $\mathbb{P}_{n,p} = \mathbb{P}_{p,\ldots,p}$. The expectations corresponding to these probability distributions are denoted by $\mathbb{E}_{n,p}$ and $\mathbb{E}_{p_1,\ldots,p_n}$ respectively. $\mathbb{E}$

2.2.2 Circuit Error

The design of fault-tolerant error correction schemes. Roughly, by fault tolerance, what is meant is that any step of the correction can introduce errors in addition to the input error. A precise description of these errors is provided in this section. Assume that a classical linear code is used in order to correct errors in a device. The code allows one to correct low-weight errors by computing the syndrome of the error. However, if it is extracted through a noisy device then the syndrome itself may contain errors and even worse, measuring the syndrome may change the value of the code bits. Error correction must take those errors into account.

A desired goal is to protect a set of $n_D$ data bits using a linear code $C_D$ with parameters $[n_D, k_D, d_D]$. It is assumed that the data code $C_D$ is fixed. Data bits suffer from an error $e^0$ that are called input error. In order to correct errors with $C_D$, a sequence of $n_M$ measurements is applied to the data bits; each measurement returns the parity $m_i \in \{0, 1\}$ of a subset of the data bits. In the fault-tolerant setting, the bit $m_i$ may be flipped. This is a second source of error. The measurement outcome observed is a $n_M$-bit vector n=m $(e^0)$+f where $m(e^0)=e^0 H_D^T$ is the ideal measurement outcome and f is called measurement error. It may also happen that the measurement fails and that no outcome is returned. This can be modeled as a lost or erased outcome. The focus here is on the correction of flipped outcomes which is more challenging.

Measurements are neither instantaneous nor perfect. Errors may occurs during a measurement. This third source of error is modeled as a bit flip occurring after each parity measurement. Each data bit may be flipped but it is reasonable to expect that the bit involved in the parity measurement are more likely to be flipped. These errors are called internal errors. Denote by $e^i \in \mathbb{Z}_2^{n_D}$ the level-i internal error that occurs after the i-th measurement for i=1, 2, ..., $n_M$.

Figure 1:
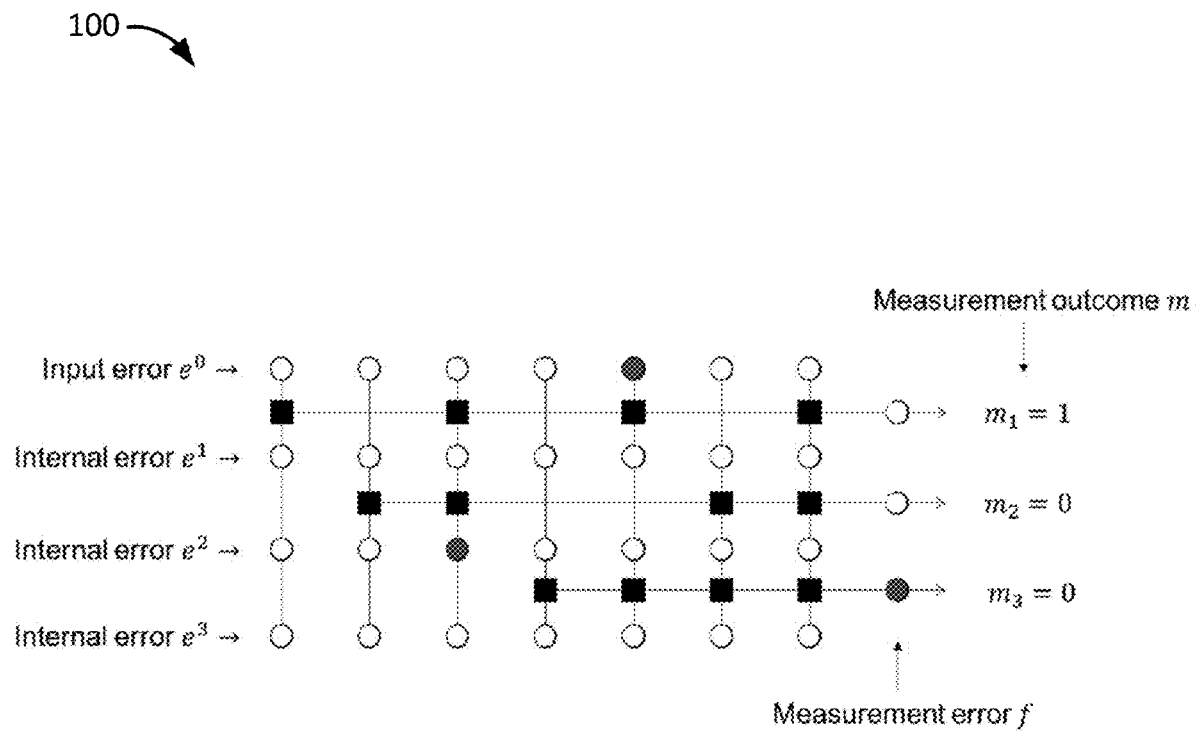
FIG. 1 is a schematic block diagram illustrating errors during the syndrome measurement for Hamming code.

FIG. 1 is a schematic block diagram 100 illustrating errors during the syndrome measurement for Hamming code. Circles indicates bit flip locations. A row of squares connected horizontally corresponds to a parity measurement between the bits marked by a square. Red circles show a circuit error with one input error, one internal error and one measurement error. The outcome observed for such an error is m=(1, 0, 0).

Overall a circuit error is a triple $\varepsilon=(e, f)$ with
Input error: $e^0 \in \mathbb{Z}_2^{n_D}$ on data bits.
Internal error: $(e^1, e^2, \ldots, e^{n_M}) \in (\mathbb{Z}_2^{n_D})^{n_M}$ on data bits.
Measurement error: $f \in \mathbb{Z}_2^{n_M}$ on measurement outcomes.

A circuit error is a binary vector of length $(n_D+1)(n_M+1)-1$. The Hamming weight of a circuit error $\varepsilon=(e, f)$ is denoted by $|\varepsilon|=|e^0|+ \ldots +|e^r|+|f|$.

More specifically, FIG. 1 is a schematic block diagram 100 showing an example of error during the syndrome measurement for Hamming code. A sequence of three measurements given by the three rows of the parity check matrix (1) is realized. The input error is $e^0$=(0000100). An internal error occurs on the third data bit after measurement of $m_2$, that is $e^2$=(0010000). The third outcome is flipped which means f=(001).

2.2.3 Fault-Tolerant Decoder

Internal errors are quite difficult to handle since they may change the value of the error during the correction. The first difficulty is therefore to properly define what is meant by correction. For instance, assume that an error $e^0$ occurs and that its syndrome $m(e^0)$=(101000) is measured perfectly. This error can be correctly identified and $e^0$ can be corrected given m, however if the same error occurs after the measurement of the third bit or later no information about the error observed. It cannot be corrected! Another possibility is that the error occurs after the measurement of the first bit of m. Then only a partial syndrome (001000) is obtained.

Our goal is to correct the effect of a circuit error $\varepsilon=(e, f)$ that occurs given the measurement outcome m(e, f). One could aim at identifying the pair (e, f). This is clearly enough to recover the data but this is too ambitious. It is actually impossible to recover the pair (e, f) given the outcome observed m.

Lemma 1. Assume that an internal bit-flip occurs on bit j after measurement i with probability p, independently of i and j. Then for any map $\tilde{D}$ that returns a circuit error $\varepsilon=(e, f)$ given an outcome m, the probability that $\tilde{D}(m(\varepsilon))=\varepsilon$ is vanishing for large $n_D$ and $n_M$.

Proof. Within this model, the number of typical internal errors grows as $2^{n_D n_M h(p)}$ where $h(p)=-p \log_2(p)-(1-p)\log_2$ (1-p) is the binary entropy function, but only $n_M$ bits of information are obtained by the measurement of m. If $n_D > 1/h(p)$, then m is not sufficient to identify e when $n_M \to \infty$. The number of outcome is exponentially smaller than the number of typical circuit error $\varepsilon = (e, f)$. □

Lemma 1 demonstrates that identifying the circuit error $\varepsilon = (e, f)$ is generally impossible. Luckily, one does not need to find the exact value of this pair. The goal is only to protect the $n_D$ data bits. Given $m = m(\varepsilon)$, one can aim at identifying the residual data error defined by $$\pi(\varepsilon) = \sum_{i=0}^{n_M} e^i$$

after a sequence of $n_M$ measurements. A decoder is a map D: $\mathbb{Z}_2^{n_M} \to \mathbb{Z}_2^{n_D}$ that estimates the residual data error given the outcome n observed. When no confusion is possible, $\pi$ is used to denote the residual error $\pi = \pi(\varepsilon)$ and the estimation returned by the decoder is denoted by $\hat{\pi} = D(m(\varepsilon))$.

Aiming at identifying the exact residual error $\pi$ is still too ambitious. Some internal bit flips occur too late to be recognized. By trying to correct those late errors, one might actually inject additional errors. The following lemma makes this idea rigorous. The level of a circuit error e is the first level j such that $e^j \neq 0$.

Lemma 2. For any decoder D, one has

Either D corrects no circuit error $\varepsilon$ of level $n_M-1$, i.e. $D(m(\varepsilon)) = 0$.

Or D amplifies at least one error $\varepsilon$, i.e. $|\pi(\varepsilon) + D(m(\varepsilon))| > |\pi(\varepsilon)|$.

Proof. Assume that the last measurement involves $s \geq 2$ data bits. A level-$(n_M-1)$ error either results in a trivial outcome or yields $m = (0 \ldots 01)$. Since $s \geq 2$, at least two distinct level-$(n_M-1)$ errors $\varepsilon$ and $\varepsilon'$ lead to the outcome m. If D corrects one of them, say $D(n) = \pi(\varepsilon)$, then the error $\varepsilon'$ is amplified. □

This lemma proves that one should not be too ambitious. If one tries to correct too many errors in particular from the latest levels of internal errors, the decoder will do more damage than correction.

The two lemmas presented in this section motivate the following definition of fault tolerance.

Definition 1. A fault-tolerant decoder is defined to be a map $D: \mathbb{Z}_2^{n_M} \to \mathbb{Z}_2^{n_D}$ such that for all circuit error $\varepsilon = (e, f)$ such that $|\varepsilon| \leq (d_D-1)/2$ one has $$|\pi + \hat{\pi}| \leq |f| + \sum_{i=1}^{n_m} |e^i| = |\varepsilon| - |e^0| \quad (3)$$

where $\pi = \pi(\varepsilon)$ is the residual data error and $\hat{\pi}$ is the estimation of $\pi$ returned by the decoder.

Roughly speaking, one will try to correct the input error $e^0$ without amplifying any internal error or measurement error.

2.2.4 Storage Life Time

This section provides another justification of the notion of fault tolerance proposed in Section 2.2.3. In a noisy environment encoded data corrected with a fault-tolerant decoder can be preserved for a longer time that its non-encoded counterpart. The proof of this property can be seen as a basic application of the rectangle method.

Assume given a set of bits stored in an imperfect device. One can assume that at each time step, stored bits are flipped independently with probability p. On a given bit, an error occurs in average after 1/p time steps. One can increase this value by the mean of fault-tolerant error correction.

In order to extend the life time of the data, one can store encoded data using a code $C_D$ with parameters $[n_D, k_D, d_D]$. The state of the $n_D$ stored bits is described by a vector $v \in \mathbb{Z}_2^{n_D}$ called memory state. If $v = c$ is a codeword of $C_D$, it represents some encoded information. The same information c can still be recovered from the vector $v = c + e^0$, affected by a low-weight error $e^0$. One can say that a memory state $v \in \mathbb{Z}_2^{n_D}$ stores the information $c \in C_D$ if c is the unique closest codeword of $C_D$ from the vector v. Consider that a state v that admits multiple closest codewords in $C_D$ does not store any information. For any error $e^0$ such that $|e^0| \leq (d_D-1)/2$, the information stored in a vector $v = c + e^0$ can be extracted by running a MWE decoder for the code $C_D$.

In order to protect the stored data against the accumulation of errors, one can regularly run a fault-tolerant decoder. In particular implementations, alternations are made between passive storage and rounds of error correction. Denote by $e^0(t)$ the $n_D$-bit error on the memory state during the t-th storage round for $t \in \mathbb{N}$. Let $f(t)$ and $e^1(t), \ldots, e^{n_M}(t)$ be the measurement error and the internal errors that occur during the t-th correction round following the occurrence of $e^0(t)$. This lead to a sequence of circuit error $\varepsilon(t) = (e(t), f(t))$ for each time step $t \in \mathbb{N}$ that is termed storage error.

Consider the sequence $v(t)_{t \in \mathbb{N}}$ of memory states obtained after each round of error correction. The storage life time of c in the sequence $v(t)_{t \in \mathbb{N}}$ is defined to be the first time step t such that v(t) does not store c anymore. The storage life time depends only on the storage error $\varepsilon(t)_{t \in \mathbb{N}}$ and not on the stored information c. One can assume that $c = 0$ and $\ell(\varepsilon)$ can be used to denote the storage life time for a storage error $\varepsilon = \varepsilon(t)_{t \in \mathbb{N}}$. The following lemma provides a sufficient condition that ensure that the stored data is not lost.

Lemma 3. Let $\varepsilon(t)_{t \in \mathbb{N}}$ be a storage error that satisfies $$|\varepsilon(t-1)| - |e^0(t-1)| + |\varepsilon(t)| \leq (d_D-1)/2 \quad (4)$$

for all $t = 0, \ldots, N$, using the convention $|\varepsilon(-1)| = |e^0(-1)| = 0$. Then the storage life time $\ell(\varepsilon)$ using a fault-tolerant decoder is at least N.

Proof. One can use the notation v(t) for the memory state after the correction round t. Without loss of generality, one can assume that the initial memory state is $c = 0$. In order to prove that the information stored is preserved throughout the N first rounds of correction, it suffices to show that the input error $e^0(t)$ of the correction round t for $t = 0, \ldots, N$ satisfies $$|\varepsilon(t)| \leq (d_D-1)/2. \quad (5)$$

Indeed by definition of fault tolerance, this implies that the memory state v(t) after correction has weight at most $(d_D-1)/2$ proving that the information stored is not lost.

One can prove by induction that $\varepsilon(t)$ satisfies Eq. (5). The input error for the first round of correction is $e^0(0)$ that satisfies Eq. (5) by assumption (4). Assume now that $\varepsilon(t-1)$ satisfies the inequality (5) for some $1 \leq t \leq N$. Then after correction it remains an error v(t-1) such that $|v(t-1)| \leq |f(t-1)| + \sum_{i=1}^{n_M} |e^i(t-1)|$. The input error of the next correction round (round t) is then $v(t-1) + e^0(t)$. It satisfies $$|v(t-1)| + |e^0(t)| + |f(t)| + \sum_{i=1}^{n_M} |e^i(t)| \leq |f(t-1)| + \sum_{i=1}^{n_M} |e^i(t-1)| + |\varepsilon(t)| =$$

$$|\varepsilon(t-1)| - |e^0(t-1)| + |\varepsilon(t)| \leq (d_D - 1)/2.$$

The last inequality is the application of the hypothesis (4). This proves Eq. (5), concluding the proof of the lemma. □

Let one define a noise model for the storage. During a storage round, the memory state bits are flipped independently with probability p. The outcomes measured during error correction rounds are flipped independently with probability p. During a parity m, is measured, all the data bits are flipped independently with probability p. In order to obtain relevant quantitative values, one may consider different flip probabilities for each flip locations. In this section, consider a single parameter noise model to simplify. The goal here is only to provide a proof that error correction increases the storage lifetime. In what follows, denote by $\mathbb{P}_{stor,p}$ the storage distribution induced over the set of storage errors $\varepsilon(t)_{t \in \mathbb{N}}$.

Proposition 1. The probability that the storage life time is shorter than N is upper bounded as follows $$\mathbb{P}_{stor,p}(f(x) < N) \leq N \binom{m}{s} p^s$$

where $$s = \frac{d_D + 1}{2} \text{ and } m = 2n_M + 2n_D n_M + n_D.$$

This probability can be made arbitrarily small by selection a code $C_D$ with large minimum distance under the condition that one can design a fault tolerant decoder and that m grows polynomially with the minimum distance $d_D$. This guarantees the exponential decays of the upper bound as a function of the minimum distance $d_D$.

Proof. For $t \in \mathbb{N}$, let $A_t$ be the set of storage errors such that Eq. (4) fails, that is $|\varepsilon(t-1)| - |e^0(t-1)| + |\varepsilon(t)| > (d_D - 1)/2$. Denote by s the integer $$s = \frac{d_D + 1}{2}$$

The probability of the event $A_t$ is upper bounded as follows.

$$\mathbb{P}_{stor}(A_t) \leq \binom{m}{s} p^s$$

where $m = 2n_M + 2n_D n_M + n_D$.

The life time is shorter than N only if at least one of the event $A_t$ occurs with $t < N$. Therefore, a union bound $$\mathbb{P}_{stor}(f(\varepsilon) < N) \leq \sum_t \mathbb{P}_{stor}(A_t)$$

proves the proposition.

2.3 Fault-Tolerant Decoding

In this section, a fault-tolerant decoder is designed based on a minimum weight circuit error. It is the most natural way to correct a circuit error. Given an outcome n, one can pick a minimum weight circuit error with outcome n. Denote by $\hat{D}_{MWE}(m) = \hat{\varepsilon}$ this circuit error. The residual data error $\hat{\pi} = \pi(\hat{x})$ can be used as a correction. Unfortunately, this decoder does not satisfies the fault tolerance definition. The issue is that one may try to correct some bit flips that occur too late to be identify correctly. Lemma 2 illustrates this phenomenon. This results in the amplification of some data errors. In order to make the minimum weight circuit error strategy viable, one can restrict the action of the decoder to bit flips that occurs at early stages of the measurement.

2.4 Correction of Measurement Error by Syndrome Encoding

In this section, it is assumed that no internal error occurs. In other words, consider a circuit error $\varepsilon = (e, f)$ with a trivial internal components $e^1 = \ldots = e^{n_M} = 0$. Here, it is explained how to correct the input error on the $n_D$ data bits in the presence of measurement errors.

Standard error correction with linear codes is based on the syndrome measurement. A syndrome bit $s_i$ is measured for each row of the parity check matrix of the code. In the context of fault tolerance the syndrome is subjected to some noise. In order to protect the syndrome s against measurement errors, and in accordance with an embodiment of the disclosed technology, one does not directly measure s. Instead, an encoded version of the syndrome is measured.

The data code $C_D$ is given by a parity check matrix $H_D$ of size $r_D \times n_D$ with $r_D n_D - k_D$. In order to protect the syndrome $s = e^0 H_D^T \in \mathbb{Z}_2^{r_D}$ of the input error $e^0$, one can encode s using a measurement code $C_M$ with generator matrix $G_M$. The measurement code is a $[n_M, k_M, d_M]$ linear code with $k_M = r_D$. The encoded syndrome $m(e^0)$ for an input error $e^0$ is then $m(e^0) = s G_M = e^0 H_D^T G_M$. Equivalently, this is the syndrome of $e^0$ associated with the redundant parity check matrix $H_m = G_M^T H_D$. Here, the matrix is referred to as the measurement matrix. Note that this scheme respects the quantum constraint. Instead of measuring the syndrome bits $s_1, \ldots, s_{r_D}$ corresponding to the rows of the parity check matrix $H_D$, one can measure the bits $m_1, \ldots, m_{n_M}$ of the decoded syndrome that are given by the rows of the measurement matrix. If an input error $e^0$ and a measurement error f occur, the measurement outcome $$n(e^0, f) = n(e^0) + f = e^0 H_m^T + f$$

is obtained.

Hamming code [7, 4, 3] can be used in combination with any measurement code with dimension $k_M = 3$. Using the measurement codes defined by the generator matrix $G_1$ and $G_2$ in Equation (2), one gets measurement matrices $$H_{m,1} = \begin{pmatrix} 1 & 0 & 1 & 0 & 1 & 0 & 1 \\ 0 & 1 & 1 & 0 & 0 & 1 & 1 \\ 0 & 0 & 0 & 1 & 1 & 1 & 1 \\ 1 & 1 & 0 & 0 & 1 & 1 & 0 \\ 1 & 0 & 1 & 1 & 0 & 1 & 0 \\ 0 & 1 & 1 & 1 & 1 & 0 & 0 \end{pmatrix} \text{ and} \qquad (6)$$

$$H_{m,2} = \begin{pmatrix} 1 & 0 & 1 & 0 & 1 & 0 & 1 \\ 0 & 1 & 1 & 0 & 0 & 1 & 1 \\ 0 & 0 & 0 & 1 & 1 & 1 & 1 \\ 1 & 1 & 0 & 1 & 0 & 0 & 1 \\ 0 & 1 & 1 & 1 & 1 & 0 & 0 \\ 1 & 0 & 1 & 1 & 0 & 1 & 0 \\ 1 & 1 & 0 & 1 & 0 & 0 & 1 \\ 0 & 0 & 0 & 1 & 1 & 1 & 1 \\ 0 & 1 & 1 & 0 & 0 & 1 & 1 \\ 1 & 0 & 1 & 0 & 1 & 0 & 1 \end{pmatrix}$$

Both matrices define a different sequence of measurements for Hamming code. The first matrix $H_{m,1}$ is derived from the measurement code [6, 3, 3]. The second matrix comes from a measurement code [10, 3, 5]. It requires a longer sequence of measurements (10 measurements instead of 6), but it will be seen that it also allows to correct more measurement errors thanks to a larger minimum distance $d_M=5$.

The redundancy in the parity check matrix can be used to correct the syndrome bits. For instance, the [6, 3, 3] measurement code allows to correct 1 flipped outcome. Then the corrected syndrome can be used to correct the data bits. A larger minimum distance du allows to correct more measurement errors.

In general, it is better to correct both input error $e^0$ and measurement error f simultaneously instead of sequentially correcting syndrome values and then data bits. Given an outcome m, one can identify a minimum weight pair $(e^0, f)$ of input error and syndrome flip that results in the outcome m. With this strategy only 5 measurements suffice to correct a single bit flip either on the input data or on the outcome with Hamming code. The measurement code is the [5,3,2] linear code.

In order to make error correction applicable to a realistic setting, one desirably includes internal errors. In the remainder of this section, a fault-tolerant error correction scheme is described that tolerates internal errors at the price of a moderate increase of the number of measurements required.

2.5 Sequential Tanner Graph and Cluster Decomposition

Figure 2A:
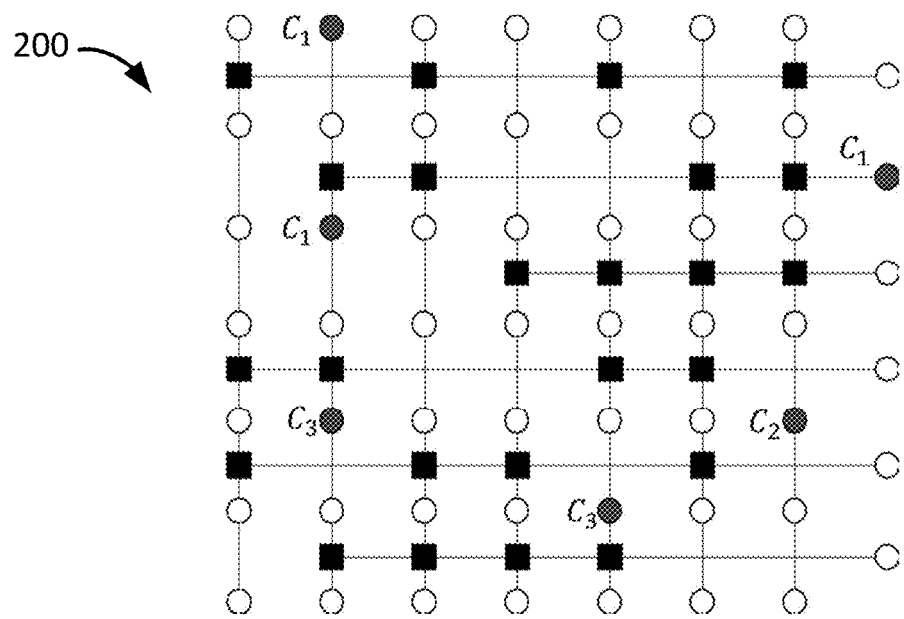
FIG. 2(A) is a schematic block diagram showing circuit errors for Hamming code equipped with a measurement code with parameters [6, 3, 3].
Figure 2B:
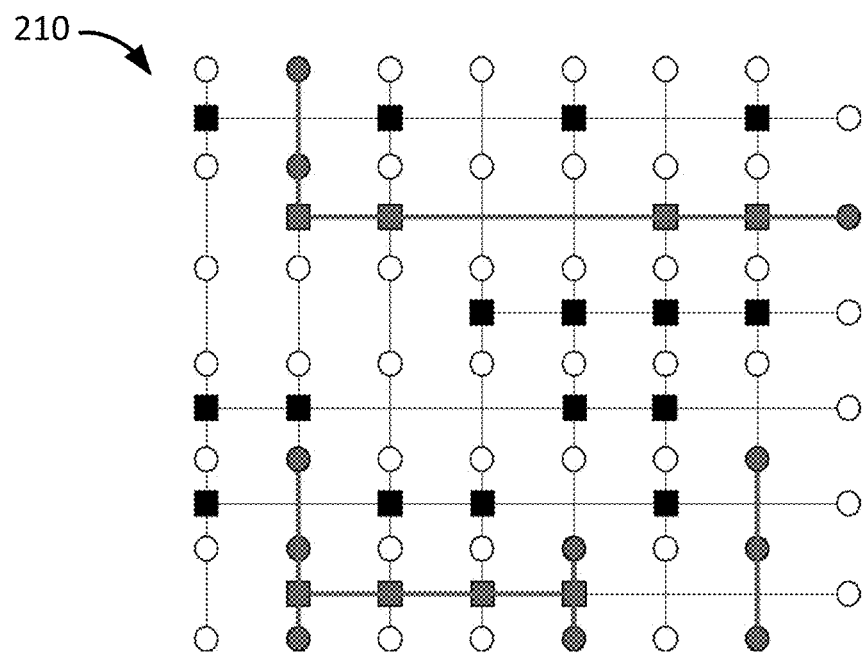
FIG. 2(B) is a schematic block diagram showing the corresponding accumulated error.

The Tanner graph belongs to the modern coding theory toolbox. It is quite convenient in order to design error correcting codes and their decoders. In this context, one can associate a sequential Tanner graph with a $n_M \times n_D$ measurement matrix $H_m$. FIGS. 2(A) and 2(B) show two representations of a circuit error using the sequential Tanner graph for Hamming code equipped with the measurement matrix $H_{m,1}$ given in Eq. (6).

The sequential Tanner graph generalizes diagram 100 of FIG. 1. There is $n_M+1$ rows of nodes that corresponds $n_M+1$ levels of data errors $e^0, e^1, \ldots, e^{n_M}$ from top to bottom. Denote this set of nodes by $$V_D = \{v_{i,j} | (i,j) \in [0, n_M] \times [1, n_D]\}.$$

For all $j=1, \ldots, n_D$, all the nodes of the sequence $v_{0,j}, v_{1,j}, \ldots, v_{n_M,j}$ are connected to their successor. These nodes form the bit line of bit j. Two consecutive rows $e^{i-1}$ and $e^i$ are separated by a row of check nodes (square) indicating the bits involved in the i-th parity measurement $m_i$. A node is added at the end of each check node row to mark the measurement outcome flip. Let $$V_M = \{u_i | i \in [1, n_M]\}$$

be this set of nodes.

FIG. 2(A) is a schematic block diagram 200 showing circuit errors (shown in red or greyscale-filled circles) for Hamming code equipped with a measurement code with parameters [6, 3, 3]. The accumulated error has three connected components. It induces a cluster decomposition of the circuit error with three clusters $C_1$, $C_2$ and $C_3$.

FIG. 2(B) is a schematic block diagram 210 showing the corresponding accumulated error (shown in blue or greyscale emphasis).

The set of nodes $V = V_D \cup V_M$ is built in such a way that each vertex corresponds to a coordinate of a circuit error. This leads to a one-to-one correspondence between circuit errors $\varepsilon$ and subsets $U \subset V$ of vertices of the sequential Tanner graph. An error can be considered alternatively as a vector $\varepsilon = (e, f)$ or as a subset of $V(\varepsilon) \subset V$. The error $\varepsilon$ whose support is given by $U \subset V$ is denoted $\varepsilon(U)$.

The sequential Tanner graph provides a graphical framework that allows to identify some properties of circuit errors. Some features of the circuit error are easier to read when considering the accumulated error $\bar{\varepsilon} = (\bar{e}, f)$ defined by $$\bar{e}^i = \sum_{j=0}^{i} e^j$$

for all $i=0, \ldots, n_M$. The error $\bar{e}^i$ is the accumulation of all data errors that appear during the first i measurements. The residual data error introduced in Section 2.2.3 is given by $\pi(\varepsilon) = \bar{e}^{n_M}$. Given the accumulated error F, one can recover $\varepsilon$ as $\varepsilon = \bar{\bar{e}}$.

The error graph induced by a circuit error e is obtained from the vertex set $V(\varepsilon) \subset V$ by connecting vertices as follows. (i) Two consecutive nodes of the same bit line are connected. (ii) Two nodes involved in the same measurement are connected (these nodes can belong either to $V_D$ or to $V_M$). This provides a bijection between circuit errors and error graphs that allows us to apply the language of graph theory to circuit errors. A circuit error $\varepsilon$ is said to be connected if the subset $V(\varepsilon)$ induces a connected error graph. An error $\varepsilon'$ is a connected component of the circuit error $\varepsilon$ if $V(\varepsilon')$ is a connected component of the error graph induced by $V(\varepsilon)$.

The connected components of the accumulated error $\bar{\varepsilon}$ identify bit flips that trigger the same outcomes. This motivates the cluster decomposition that are introduced now. Let $$V(\bar{\varepsilon}) = \bigcup_{i \in I} V(\bar{\varepsilon}_i)$$

be the decomposition of the accumulated error $\bar{\varepsilon}$ in connected components. Each component $\bar{\varepsilon}_i$ is the accumulated error of an error $\varepsilon_i$ such that $V(\varepsilon_i) \in V(\varepsilon)$. The cluster decomposition of a circuit error $\varepsilon$ is the decomposition $$\varepsilon = \sum_{i \in I} \varepsilon_i$$

derived from the decomposition of the accumulated error $\bar{\varepsilon}$ in connected components. FIGS. 2(A) and 2(B) show the cluster decomposition of a circuit error.

The set of vertices of $V_D$ supporting input errors is denoted by $$V_{in} = \{v_{0,j} | j \in [1, n_D]\}$$

and vertices of $V_{in}$ are called input vertices. Similarly, vertices of the last level $$V_{out} = \{v_{n_M, j} | j \in [1, n_D]\}$$

are called output vertices. Given the cluster decomposition $\varepsilon = \Sigma_{i \in I} \varepsilon_i$ of a circuit error e, denote by $I_{in} \subset I$ the subset of indices i such that $V(\overline{\varepsilon}_i) \cap V_{in} \neq \emptyset$ and let $I_{out}$ be the subset of I such that $V(\overline{\varepsilon}_i) \cap V_{out} \neq \emptyset$. The errors $\varepsilon_{in} = \Sigma_{i \in I_{in}} \varepsilon_i$ and $\varepsilon_{out} = \Sigma_{i \in I_{out}} \varepsilon_i$ are defined by selecting the components that meet input or output vertices. Again, $\varepsilon_{in}$ and $\varepsilon_{out}$ are defined as a function of the connected components $\overline{\varepsilon}_i$ of the accumulated error. An input clusters $\varepsilon_i$ with $i \in I_{in}$ always contains an input vertex. However, an output cluster does not have to contain any output vertex. The cluster $C_1$ is the only input cluster for the error shown in FIGS. 2(A) and 2(B) and the output clusters are $C_2 \cup C_3$. In general, there exist clusters that are neither input nor output clusters.

The following lemma justifies the cluster decomposition. Lemma 4. Let $\varepsilon = \Sigma_{i \in I} \varepsilon_i$ be the cluster decomposition of a circuit error.

If $m(\varepsilon) = 0$ then for all $i \in I$ one has $m(\varepsilon_i) = 0$.

If $\overline{\varepsilon}_i \cap V_{out} = \emptyset$ then one has $\pi(\varepsilon_i) = 0$.

Proof. By construction of the sequential Tanner graph, the outcome location $m_j$ is connected to all the bits involved in the measurement $m_j$. This proves the first item. The second item is an immediate application of the definition of the accumulated error because $\pi(\varepsilon)$ is equal to the accumulated error $\overline{e}^{n_M}$. □

The graphical formalism introduced in this section provides a decomposition of circuit errors and Lemma 4 identifies the clusters that contributes to the residual data error.

The standard Tanner graph used in classical coding theory encodes the set of all the parity measurements. Our sequential Tanner graph contains additional information such as the order in which measurements are realized. This information is necessary in order include outcome flips dues to internal errors. This Tanner graph can be seen as a sequential version of the Tanner graph used for instance in the context of topological quantum codes or quantum LDPC codes with additional nodes for measurement errors.

2.6 Correction of Input Error and Circuit Distance

The fault tolerance condition introduced in Definition 1 can be interpreted as the fact that the decoder corrects the input error without amplifying internal errors. This section deals with the correction of the input error ignoring the problem of error amplification. The notion of minimum distance $d_{circ}$ adapted to the context of fault tolerance is introduced, and it is proven that one can correct the input error for any circuit error of weight less than $(d_{circ}-1)/2$. The next section adapts the decoder in order to keep error amplification limited and to satisfy the fault tolerance condition.

Consider the MWE decoder. Recall that $\hat{\varepsilon}$ denotes a minimum weight circuit error with outcome in that are denoted $\hat{\varepsilon} = \tilde{D}_{MWE}(m)$. The MWE decoder returns $D_{MWE}(m) = \pi(\tilde{D}_{MWE}(m)) = \pi(\hat{\varepsilon})$.

Naively, for a circuit error $\varepsilon = (e, f)$ with outcome $m(\varepsilon) = m$, one could say that the input error is corrected by the MWE decoder if the estimation $\hat{\varepsilon} = (\hat{e}, \hat{f})$ satisfies $\hat{e}^0 = e^0$, that is if the input component $e^0$ is correctly estimated. This definition is not satisfying because an input error can be indistinguishable from an internal circuit error. To clarify this point, the set of trivial errors is introduced. A trivial circuit error is a circuit error $\varepsilon$ such that $m(\varepsilon) = 0$ and $\pi(\varepsilon) = 0$. This error is impossible to detect since the corresponding outcome is trivial and it does not induce any bit flip on the data at the end of the measurement circuit. Two circuit errors that differ in a trivial error cannot be distinguished using the outcome observed or the data bits after measurement.

Figure 3A:
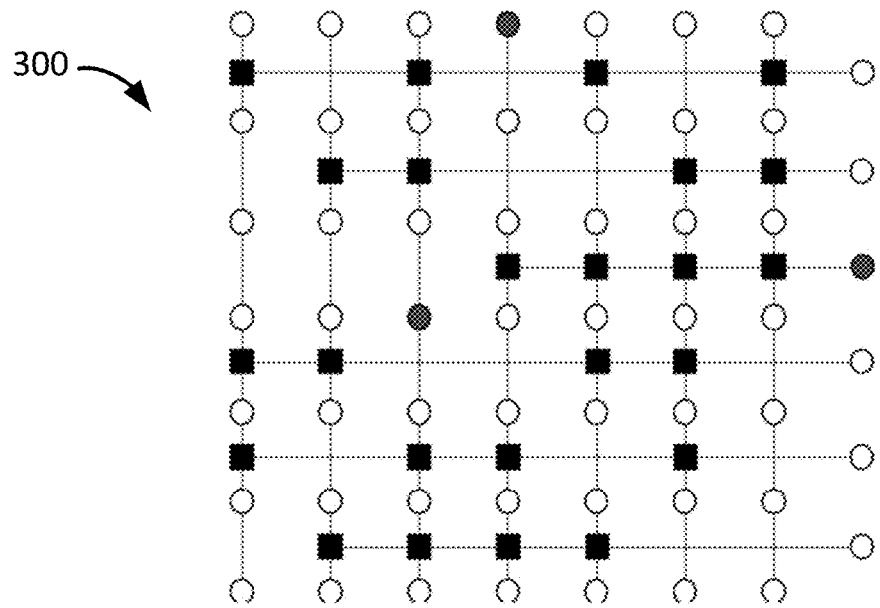
FIG. 3(A) is a schematic block diagram showing a minimum weight circuit error.
Figure 3B:
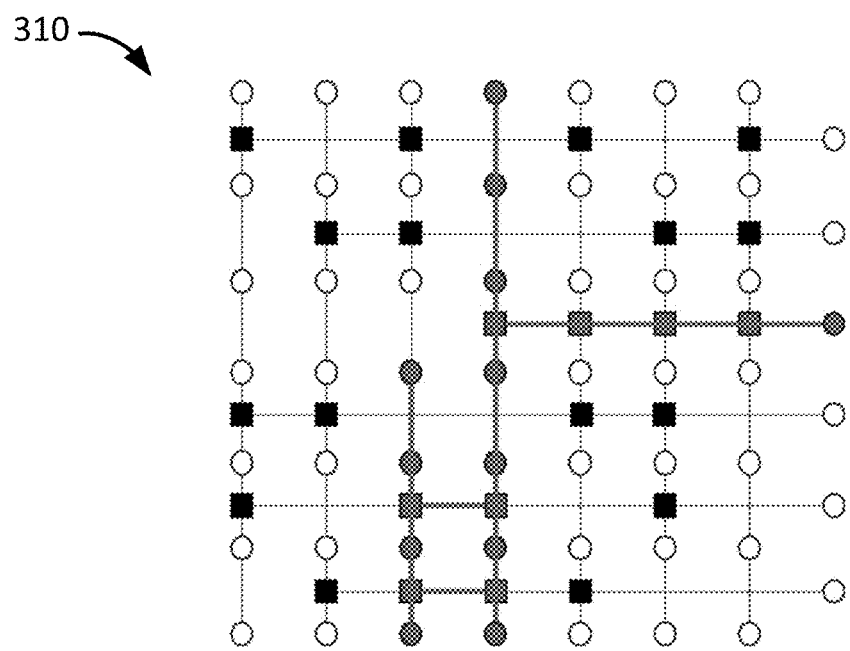
FIG. 3(B) is a schematic block diagram showing the corresponding accumulated error for Hamming code equipped with a measurement code with parameters [6, 3, 3].

FIG. 3(A) is a schematic block diagram 300 showing a minimum weight circuit error (red), and FIG. 3(B) is a schematic block diagram 310 showing the corresponding accumulated error (blue) for Hamming code equipped with a measurement code with parameters [6,3,3]. The accumulated error connects input vertices (FIG. 3(A)) with output vertices (FIG. 3(B)), which means that the circuit error is a propagating error. Note that the measurement error on outcome 3 cancels the accumulated error on bit 4.

The definition herein of the correction of the input error relies on the notion of propagating error that is introduced introduce now. A propagating error is defined to be a circuit error $\varepsilon$ with trivial outcome $m(\varepsilon) = 0$ such that $V(\overline{\varepsilon})$ contains a path connecting $V_{in}$ and $V_{out}$. A propagating error connects the input of the sequential Tanner graph with its output. It can be interpreted as an input error that propagates through the measurement circuit. FIGS. 3(A) and 3(B) show a propagating error for Hamming code. If an error e occurs with outcome m, one can say that the MWE decoder corrects the input error if $\varepsilon + \tilde{D}_{MWE}(m)$ is not a propagating error. Since this circuit error is guaranteed to have a trivial outcome, that means that it does not connect input and output sets of vertices.

The circuit distance $d_{circ}$ is defined to be the minimum weight of a propagating error.

$$d_{circ} = \min\{|\varepsilon| \| \varepsilon \text{ is propagating}\}.$$

A propagating error is undetectable in the sense that $m(\varepsilon) = 0$ and non-trivial, however all undetectable non-trivial errors are not propagating errors. For instance, the circuit distance of Hamming code combined with the [6, 3, 3] measurement code is three. A minimum weight propagating error is represented in FIG. 3.

In Section 2.2.1, it was recalled that in the standard coding theory setting the minimum distance provides an indication on the performance of the minimum weight error decoder. Any set of up to $(d-1)/2$ bit flips can be corrected by MLE decoding. The following proposition establishes a fault-tolerant analog of this result.

Proposition 2. For any circuit error $\varepsilon$ such that $|\varepsilon| \leq (d_{circ}-1)/2$ the MWE decoder $D_{MWE}$ corrects the input error.

Proof. Assume that a circuit error $\varepsilon$ with weight $|\varepsilon| \leq (d_{circ}-1)/2$ occurs during a round of measurement. Let $m = m(\varepsilon)$ the outcome observed. The MWE decoder is based on the estimation $\hat{\varepsilon} = \tilde{D}_{MWE}(m)$ of the circuit error $\varepsilon$. By definition, it satisfies $|\hat{\varepsilon}| \leq |\varepsilon| \leq (d_{circ}-1)/2$, which implies $|\varepsilon + \hat{\varepsilon}| \leq (d_{circ}-1)$. This proves that the residual circuit error $\varepsilon + \hat{\varepsilon}$ cannot be a propagating error. The input error is corrected by the MWE decoder. □

The circuit distance cannot be arbitrarily large. It is limited by the minimum distance $d_D$ of the data code and the minimum distance $d_M$ of the measurement code as follows.

$$d_{circ} \leq \min\{d_D, n_D + d_M\}.$$

To obtain the upper bound $d_{circ} \leq d_D$ remark that for any codeword $u \in C_D$, the circuit error $\varepsilon = (e, f)$ with input $e^0 = u$ and with $e^1 = \ldots = e^{n_M} = f = 0$ is a propagating error. One can also build a propagating error out of an arbitrary input error $e^0$ using $f = e^0 H_m^T$. The second upper bound $d_{circ} \leq n_D + d_M$ follows.

Given a data code $C_D$, one can try to select a measurement code $C_M$ with optimal circuit distance $d_{circ} = d_D$ that requires a minimum number of parity measurements $n_M$. One can obtain a circuit distance $d_{circ} = d_D = 3$ for Hamming code using the linear codes [6,3,3] or [10, 3, 5] defined in Eq. (2) as a measurement code. The circuit distance can be larger than the measurement code minimum distance. The linear code [5, 3, 2] with generator matrix $$G = \begin{pmatrix} 1 & 0 & 0 & 1 & 1 \\ 0 & 1 & 0 & 1 & 0 \\ 0 & 0 & 1 & 1 & 0 \end{pmatrix}$$

leads to a circuit distance $d_{circ} = 3$ for Hamming code and it requires only 5 measurements.

As a second example, consider the BCH code [15, 7, 5] with generator matrix $$G_D = \begin{pmatrix} 1 & 0 & 0 & 0 & 0 & 0 & 0 & 1 & 0 & 0 & 0 & 1 & 0 & 1 & 1 \\ 0 & 1 & 0 & 0 & 0 & 0 & 0 & 1 & 1 & 0 & 0 & 1 & 1 & 1 & 0 \\ 0 & 0 & 1 & 0 & 0 & 0 & 0 & 0 & 1 & 1 & 0 & 0 & 1 & 1 & 1 \\ 0 & 0 & 0 & 1 & 0 & 0 & 0 & 1 & 0 & 1 & 1 & 1 & 0 & 0 & 0 \\ 0 & 0 & 0 & 0 & 1 & 0 & 0 & 0 & 1 & 0 & 1 & 1 & 1 & 0 & 0 \\ 0 & 0 & 0 & 0 & 0 & 1 & 0 & 0 & 0 & 1 & 0 & 1 & 1 & 1 & 0 \\ 0 & 0 & 0 & 0 & 0 & 0 & 1 & 0 & 0 & 0 & 1 & 0 & 1 & 1 & 1 \end{pmatrix}$$

as a data code. Searching over random generator matrices $G_M$, it was found that a measurement code with length $n_M = 16$ that leads to an optimal circuit distance $d_{circ} = d_D = 5$. It is defined by the generator matrix $$G_M = \begin{pmatrix} 1 & 0 & 0 & 0 & 1 & 1 & 1 & 0 & 0 & 0 & 0 & 1 & 1 & 0 & 0 & 0 \\ 1 & 1 & 1 & 0 & 0 & 1 & 0 & 0 & 1 & 0 & 0 & 0 & 0 & 1 & 1 & 0 \\ 1 & 1 & 1 & 1 & 1 & 0 & 1 & 0 & 0 & 1 & 0 & 0 & 0 & 1 & 0 & 1 \\ 1 & 0 & 0 & 1 & 0 & 0 & 1 & 0 & 0 & 1 & 0 & 0 & 1 & 0 & 1 & 1 \\ 0 & 0 & 1 & 0 & 0 & 1 & 0 & 1 & 1 & 0 & 1 & 1 & 1 & 1 & 0 & 0 \\ 1 & 1 & 1 & 1 & 1 & 1 & 0 & 1 & 1 & 0 & 1 & 1 & 0 & 0 & 0 & 1 \\ 1 & 0 & 0 & 0 & 0 & 0 & 1 & 0 & 1 & 1 & 0 & 1 & 0 & 0 & 1 & 0 \\ 1 & 0 & 1 & 1 & 0 & 0 & 0 & 1 & 1 & 0 & 1 & 0 & 1 & 1 & 0 & 0 \end{pmatrix}$$

It is a linear code with parameters [16, 8].

2.7 Truncated Minimum Weight Error Decoder

It was seen that the MWE decoder can be generalized to the context of circuit errors by selecting a circuit error $\varepsilon$ with minimum weight that yields the observed outcome m. Then $\pi(\varepsilon)$ provides an estimation of the residual data error that occurs. Unfortunately, this strategy fails to satisfy the fault-tolerant condition dues the issue of error amplification illustrated with Lemma 2. Some internal errors occurs to late to be corrected safely. This motivates the introduction of the truncated minimum weight error decoder.

Figure 4A:
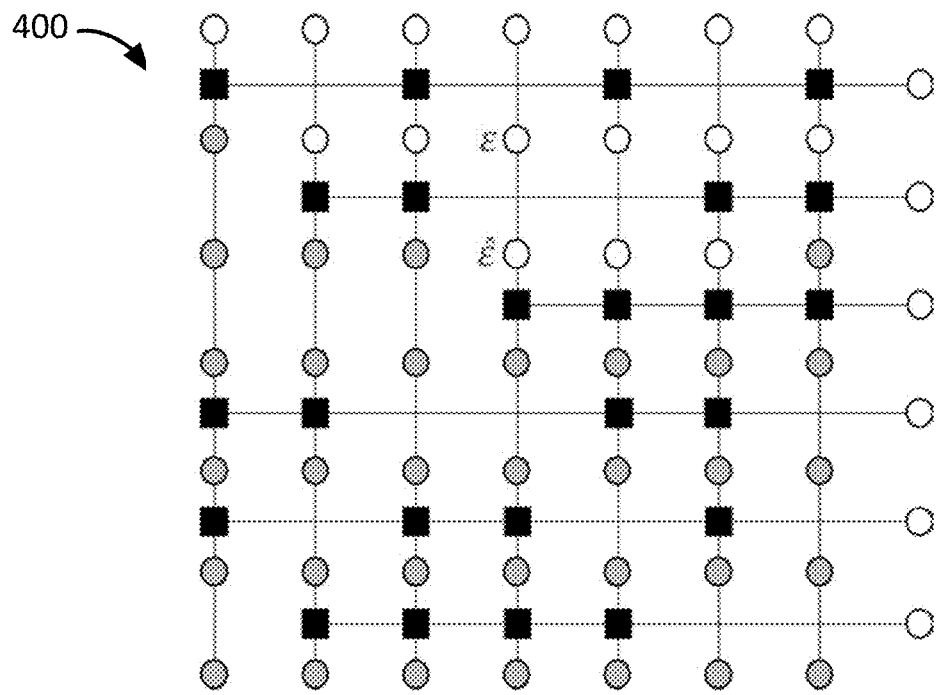
FIG. 4(A) is a schematic block diagram illustrating that the correction succeeds although the circuit error is not exactly identified since no residual error remain at the end of the measurement cycle.

FIG. 4(A) is a schematic block diagram 400 illustrating that the correction succeeds although the circuit error is not exactly identified since no residual error remain at the end of the measurement cycle. The correction succeeds although the circuit error is not exactly identified since no residual error remain at the end of the measurement cycle.

Figure 4B:
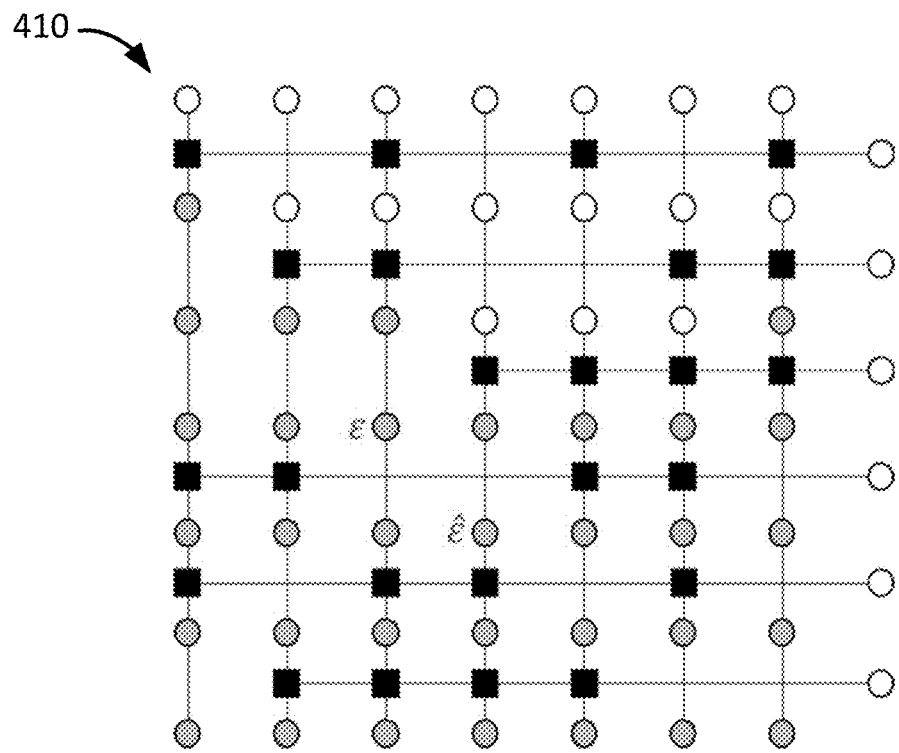
FIG. 4(B) is a schematic block diagram illustrating that the decoder fails leading to an amplified residual error with weight two.

FIG. 4(B) is a schematic block diagram 410 illustrating that the decoder fails leading to an amplified residual error with weight two. To make the MWE decoder fault-tolerant, one can discard the part of $\hat{\varepsilon}$ that is included in the green region $S_{out}$.

In order to make the definition of the truncated decoder more intuitive, begin with a case of failure of the minimum weight error decoder illustrated in FIGS. 4(A) and 4(B). An internal bit flip may be amplified by the decoder if it is included in the support of a weight-two undetectable error with a non-trivial residual error. To avoid error amplification, correct e with the restriction of $\hat{\varepsilon}$ to a subset of early bit flip locations. This idea leads to the truncated decoder.

Let $A \subset V$ be a subset of vertices of the sequential Tanner graph. Let $\tilde{D}_{MWE}^A$ be the map defined by $\tilde{D}_{MWE}^A(m) = \hat{\varepsilon} \cap A$ where $\hat{\varepsilon}$ is a minimum weight circuit error with outcome m. The notation $\hat{\varepsilon} \cap A$ is used as a shorthand for the restriction of the support of $\varepsilon$ to the set A that is $\hat{\varepsilon} \cap A = \varepsilon(V(\hat{\varepsilon}) \cap A)$. The truncated MWE decoder with support A is defined to be the map $D_{MWE}^A : \mathbb{Z}_2^{n_M} \to \mathbb{Z}_2^{n_D}$ such that $$D_{MWE}^A(m) = \pi(\tilde{D}_{MWE}^A(m)).$$

For A=V, the strategy considered in the previous section is recovered, that is $\tilde{D}_{MWE}^V = \tilde{D}_{MWE}$. In general, the truncated decoder ignores the bit flips supported outside of the subset A. Without loss of generality, one can assume that $\tilde{D}_{MWE}^V(m) = \hat{\varepsilon}$ is fixed and that $\tilde{D}_{MWE}^A(m) = \tilde{D}_{MWE}^V \cap A$ for any subset A of V.

Figure 5:
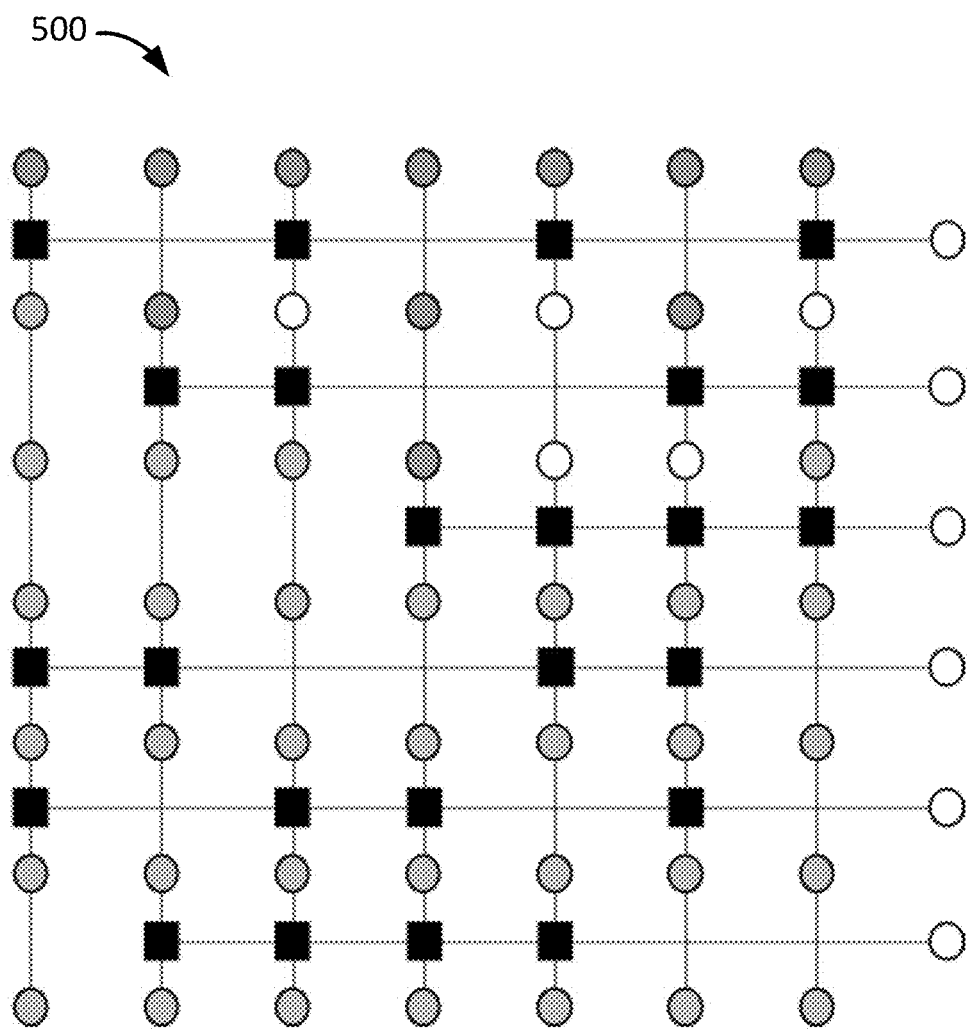
FIG. 5 is a schematic block diagram illustrating that the set $V_{in} \cup S_{in}$ and $S_{out}$ do not overlap for Hamming code combined with the measurement code [6, 3, 3].

FIG. 5 is a schematic block diagram 500 illustrating that the set $V_{in} \cup S_{in}$ (red) and $S_{out}$ (green) do not overlap for Hamming code combined with the measurement code [6,3, 3]. The restriction of the MWE decoder to the set $A = S_{out}^C$ is fault tolerant by Theorem 1

In order to distinguish between correctable bit flips and those that occur too late to be corrected we introduce two subsets of V shown in FIG. 5. Define $$S_{in} = \bigcup_{\substack{|\varepsilon| \leq d_D - 1 \\ m(\varepsilon) = 0}} V(\varepsilon_{in})$$

and $$S_{out} = \bigcup_{\substack{|\varepsilon| \leq d_D - 1 \\ m(\varepsilon) = 0}} V(\varepsilon_{out})$$

The set $S_{out}$ always contains $V_{out}$. Ideally those two sets are disjoint. In this case the following theorem applies, providing a fault tolerant decoder.

Theorem 1. If $(V_{in} \cup S_{in}) \cap S_{out} = \emptyset$, then the truncated decoder $D_{MWE}^A$ with $A = S_{out}^C$ is a fault tolerant decoder.

In what follows, when the truncated MWE decoder is referred to, it is assumed that the support of the truncated decoder is $A = S_{out}^C$. The condition $V_{in} \cap S_{out} = \emptyset$ is equivalent to $d_{circ} = d_D$. A large circuit distance is therefore required in order to ensure fault tolerance.

Proof. Consider an error $\varepsilon = (e, f)$ with outcome m such that $|\varepsilon| \leq (d_D - 1)/2$ and denote by $$\hat{\pi}^A = \pi(\hat{\varepsilon} \cap A)$$

the residual error estimation returned by the TMWE decoder where $A = S_{out}^C$.

Here, the interest is in the residual data error after correction, i.e.

$$\pi(\varepsilon) + \hat{\pi}^A = \pi(\varepsilon + \hat{\varepsilon} \cap A).$$

Let one prove that it satisfies the fault tolerance condition $|\pi(\varepsilon+\hat{\varepsilon} \cap A)| \le |\varepsilon| - |\varepsilon^0|$.

Step 1. Partition of the circuit error: Denote $\omega=\varepsilon+\hat{\varepsilon}$. It will be proven that the fault tolerance condition in two steps through the partition $V = V(\omega) \cup V(\omega)^C$ of the bit flip locations. Note that $V(\omega)$ is the set of locations where $\varepsilon$ and its estimation $\hat{\varepsilon}$ do not match.

The partition induces the decomposition $\varepsilon = \varepsilon \cap V(\omega) + \varepsilon \cap V(\omega)^C$ of the circuit error. Denote $\varepsilon \cap V(\omega) = (e_1, f_1)$ and $\varepsilon \cap V(\omega)^C = (e_2, f_2)$ the two components of $\varepsilon$. It is enough to show that both components satisfy the fault tolerance constraint, that is $$|\pi(\varepsilon \cap V(\omega) + \hat{\varepsilon} \cap V(\omega) \cap A)| \le |\varepsilon \cap V(\omega)| - |e_1^0| \qquad (7)$$

and $$|\pi(\varepsilon \cap V(\omega)^C + \hat{\varepsilon} \cap V(\omega)^C \cap A)| \le |\varepsilon \cap V(\omega)^C| - |e_2^0| \qquad (8)$$

Assuming that Eq. (7) and (8) are satisfied, one can obtain the fault-tolerant condition as follows.

$$|\pi(\varepsilon + \hat{\varepsilon} \cap A)| = |\pi((\varepsilon + \hat{\varepsilon} \cap A) \cap V(\omega) + (\varepsilon + \hat{\varepsilon} \cap A) \cap V(y)^C)| \le$$

$$|\pi((\varepsilon + \hat{\varepsilon} \cap A) \cap V(\omega))| + |\pi((\varepsilon + \hat{\varepsilon} \cap A) \cap V(y)^C)|$$

$$= |\pi(\varepsilon \cap V(\omega) + \hat{\varepsilon} \cap V(\omega) \cap A)| +$$

$$|\pi(\varepsilon \cap V(\omega)^C + \hat{\varepsilon} \cap V(\omega)^C \cap A)| \le$$

$$|\varepsilon \cap V(\omega)| - |e_1^0| + |\varepsilon \cap V(\omega)^C| - |e_2^0|$$

$$= |\varepsilon| - |e^0|$$

Therein, the second inequality is the application of Eq. (7) and (8). The last equality comes from the fact that $\varepsilon \cap V(\omega)$ and $\varepsilon \cap V(\omega)^C$ do not overlap. In the remainder of the proof, it is demonstrated that Eq. (7) and Eq. (8).

Step 2. Proof of Eq. (8): Eq. (8) is easier to prove. By definition, the set $V(\omega)^C$ is the subset of $V$ over which $\varepsilon$ and $\hat{\varepsilon}$ coincide, i.e. $\varepsilon \cap V(\omega)^C = \hat{\varepsilon} V(\omega)^C$. As a consequence, one gets $$\varepsilon \cap V(\omega)^C + \hat{\varepsilon} \cap V(\omega)^C \cap A = \varepsilon \cap V(\omega)^C + \varepsilon \cap V(\omega)^C \cap A$$

$$= \varepsilon \cap V(\omega)^C \cap A^C$$

which produces $$|\pi(\varepsilon \cap V(\omega)^C + \hat{\varepsilon} \cap V(\omega)^C \cap A)| \le |\pi(\varepsilon \cap V(\omega)^C \cap A^C)| \le |\varepsilon \cap V(\omega)^C \cap A^C| \le |\varepsilon \cap V(\omega)^C| - |e_2^0|$$

where the last inequality exploits the fact that $A^C = S_{out}$ does not intersect $V_{in}$. This proves Eq. (8).

Step 3. Proof of Eq. (7): In order to show that Eq. (7) is satisfied consider the cluster decomposition $\omega = \Sigma_{i \in I} \omega_i$ of $\omega$ and denote by $\varepsilon_i = x \cap V(\omega_i)$ and $\hat{\varepsilon}_i = \hat{\varepsilon} \cap V(\omega_i)$ the induced clusters of $\varepsilon$ and $\hat{\varepsilon}$. By definition of $\omega$, one has $\omega_i = \varepsilon_i + \hat{\varepsilon}_i$. From Lemma 4, one has $m(\omega_i) = 0$ for each cluster of $\omega$ since $m(\omega) = 0$. The clusters also satisfy $|\omega_i| \le |\omega| \le d_D - 1$ as required in the definition of $S_{in}$ and $S_{out}$. The cluster decomposition leads to $$\pi(\varepsilon \cap V(\omega) + \hat{\varepsilon} \cap V(\omega) \cap A) = \sum_{i \in I} \pi(\varepsilon_i + \hat{\varepsilon}_i \cap A) \qquad (9)$$

by linearity of $\pi$. The term $\pi(\varepsilon_i + \hat{\varepsilon}_i \cap A)$ depends on the relative position of the error $\omega_i$ and the truncated set A. In what follows, it is established that the fault tolerance inequality for each term $\varepsilon_i + \hat{\varepsilon}_i \cap A$. Three cases must be considered.

(i) Assume first that $\omega_i \in A = S_{out}^C$. Then, one has $\varepsilon_i + \hat{\varepsilon}_i \cap A = \varepsilon_i + \hat{\varepsilon}_i = \omega_i$. The accumulated error $\overline{\omega}_i$ cannot intersect $V_{out}$ otherwise it would included in $S_{out}$. Hence Lemma 4 tells one that $$\pi(\varepsilon_i + \hat{\varepsilon}_i \cap A) = \pi(\omega_i) = 0. \qquad (10)$$

(ii) Consider now the case $\omega_i \in A^C = S_{out}$. Then, one has $\varepsilon_i + \hat{\varepsilon}_i \cap A = \varepsilon_i$ that yields $$\pi(\varepsilon_i + \hat{\varepsilon}_i \cap A) = |\pi(\varepsilon_i)| \le |\varepsilon_i|. \qquad (11)$$

(iii) The remaining clusters $\omega$ intersect both A and its complementary $A^C$. By definition of $S_{out}$, such an error $\omega_i$ cannot meet $V_{out}$ otherwise it would be fully included in $A^C = S_{out}$. One can thus apply Lemma 4 showing that $\pi(\omega_i) = \pi(\varepsilon_i + \hat{\varepsilon}_i) = 0$. This lead to $$|\pi(\varepsilon_i + \hat{\varepsilon}_i \cap A)| = |\pi(\hat{\varepsilon}_i \cap A^C)| \le |\hat{\varepsilon}_i| \le |\varepsilon_i|. \qquad (12)$$

Therein, the last inequality is a consequence of Lemma 5. Denote by $I_{(ii)} = \{i | y_i \subset A\}$, $I_{(iii)} = \{i | y_i \in A^C\}$ and $I_{(iii)} = I \setminus (I_{(ii)} \cup I_{(iii)})$, the index sets corresponding to the previous three cases. Injecting the three inequalities (10) (11) (12) in Equation (9) leads to $$\pi(\varepsilon \cap V(\omega) + \hat{\varepsilon} \cap V(\omega) \cap A) \le \sum_{i \in I_{(ii)} \cup I_{(iii)}} |\varepsilon_i|. \qquad (13)$$

It remains to prove that this sum is at most $|\varepsilon \cap V(\omega)| - |e_1^0|$. Consider the error $\omega_{in} = \Sigma_{i \in I_{in}} \omega_i$ defined in Section 2.5. The input error $e^0$ of $\varepsilon$ is included in the support of $\Sigma_{i \in I_{in}} \varepsilon_i$. By definition, if $i \in I_{in}$ then $\omega_i \in S_{in}$. Using the hypothesis $S_{in} \cap S_{out} = \emptyset$ this proves that $y_i \subset S_{in} \subset S_{out}^C = A$. This shows that $I_{in} \subset I_{(i)}$ and thus $I_{(ii)} \cup I_{(iii)} \subset I_{in}^C$. Coming back to Eq. (13), one obtains $\pi(\varepsilon$ $$\pi(\varepsilon \cap V(\omega) + \hat{\varepsilon} \cap V(\omega) \cap A) \le \sum_{i \in I_{(ii)} \cup I_{(iii)}} |\varepsilon_i| \le \sum_{i \in I_{in}^C} |\varepsilon_i| \le |\varepsilon \cap V(\omega)| - |e_1^0|$$

concluding the proof of Eq. (7). The Theorem follows. □

Consider an error $\varepsilon$ with outcome m and let $\hat{\varepsilon} = D_{MWE}^V(m)$. The following lemma proves that a minimum weight error $\hat{\varepsilon}$ is also locally minimum within each cluster of $\varepsilon + \hat{\varepsilon}$.

Lemma 5. Let $\varepsilon$ be a circuit error with outcome m, let $\hat{\varepsilon} = \hat{D}_{MWE}^V(m)$ and let $\omega = \varepsilon + \hat{\varepsilon}$. Denote by $\omega = \Sigma_{i \in I} \omega_i$ the cluster decomposition of $\omega$ and let $\varepsilon_i = \varepsilon \cap V(\omega_i)$ and $\hat{\varepsilon}_i = \hat{\varepsilon} \cap V(\omega_i)$. Then, for all $i \in I$, one has $|\varepsilon_i| \ge |\hat{\varepsilon}_i|$.

Proof. If there exists a cluster i such that $|\varepsilon_i| < |\hat{\varepsilon}_i|$ then replacing $\hat{\varepsilon}_i$ by $\varepsilon_i$ in $\hat{\varepsilon}$ provides an error $\hat{\varepsilon}' = \hat{\varepsilon} + \varepsilon_i + \hat{\varepsilon}_i$ with reduced weight and unchanged outcome $n(\hat{\varepsilon}') = m(\hat{\varepsilon})$. This last equality is a based on the fact that $m(\varepsilon_i + \hat{\varepsilon}_i) = m(\omega_i) = 0$ proven in Lemma 4. This cannot happen by definition of the MWE decoder. □

2.7.1 Time Overhead of Fault Tolerance

The choice of the encoding scheme depends on the application one is considering. The application dictates the number of data bits k that one desirably uses to encode and the error rate targeted is used to estimate the minimum distance d required. Encoding increases the volume of the data. The space overhead is the inverse of the rate of the code used, i.e. roughly one needs 1/R bits per data bit. The time overhead to implement a fault-tolerant error correction scheme is the number of parity measurements per correction cycle. Fault tolerance may considerably increase the number of measurements needed to perform error correction with a code of length $n_D$. In this section, an upper bound is obtained on the number of measurements required to guarantee fault tolerance by analyzing the circuit distance of random measurement matrices.

The following theorem shows that $O(n_D^{1+\alpha})$ parity measurements are enough to make any data code with length $n_D$ fault-tolerant. For comparison, Shor method is based on $\Omega(d^3)$ parity measurements, that is $\Omega(n_D^3)$ for good codes.
Theorem 2. Consider a family of data codes $C_D$ with length $n_D \to \infty$ and with minimum distance $d_D$. For any $\alpha > 0$ there exists a family of measurement codes with length $n_M = O(d_D^{1+\alpha})$ that makes the codes $C_D$ fault-tolerant equipped with the truncated MWE decoder.

One can state this theorem in term of the circuit distance. It proves that there exists a family of measurement codes with length $n_M = O(d_D^{1+\alpha})$ that produces an optimal circuit distance $d_{circ} = d_D$ for the data code $C_D$.

Naturally one can trade time for space. In this context, this can be done by encoding our k data bits with a longer code $C_D$ with the same minimum distance $d_D$. This extra cost in space can be compensated with a shorter fault-tolerant measurement sequence. Using a code with minimum distance $\Omega(n_D^\beta)$ for some $\beta < 1$, one needs only $\cap(n_D^{\alpha+\beta})$ parity measurements.

Proof. The basic idea is to build a family of measurement codes $C_M$ that maximizes the circuit distance of the pair $(C_D, C_M)$.

In order to guarantee an optimal circuit distance, it is proven that it is possible to construct a measurement matrix $H_m$ such that there is no circuit error with weight $\omega \leq d_D - 1$ that is a propagating error. A probabilistic method is used. Fix the code $C_D$ and pick a random measurement matrix $H_m = G_M^T H_D$ whose rows are $n_M$ vectors of $C_D^\perp$ selected independently according to a uniform distribution.

For a circuit error $\varepsilon \in \mathbb{Z}_2^N$, define the random variable $X_\varepsilon$ by $$X_\varepsilon(H_m) = \begin{cases} 1 & \text{if } \varepsilon \text{ is a propagating error for } H_m \\ 0 & \text{otherwise} \end{cases}$$

Then, for $\rho \in \mathbb{N}$ denote $$X_\rho = \sum_{\substack{\varepsilon \in \mathbb{Z}_2^N \\ |\varepsilon| \leq \rho}} X_\varepsilon$$

the random variable that counts the number of propagating errors with weight up to $\rho$ for the code $C_D$ with the measurement matrix $H_m$. In what follows, $\rho = d_D - 1$ and the goal is to bound the expectation of $X_\rho$.

By definition, the expectation of $X_\varepsilon$ is the probability that $\varepsilon = (e, f)$ is a propagating error. Based on Lemma 6, this probability is upper bounded by the probability that $m(e, 0) = f$. First, let one prove that the vector $m(e, 0)$ is a uniform random bit string of $\mathbb{Z}_2^{n_M}$. For all $i = 1, \ldots, n_M$, the i-th component $m_i$ of $m(e, 0)$ is the inner product between row i of $H_m$ and the component $\bar{e}^{(i-1)}$ of the accumulated error. Moreover, a propagating error $\varepsilon$ satisfies condition (i) in Lemma 6. This proves that $m_i$ is a uniform random bit. Given that rows of $H_m$ are selected independently, for any circuit error x with weight $|x| < d_D$, the vector $m(e, 0)$ is uniformly distributed in $\mathbb{Z}_2^{n_M}$. This produces the upper bound $$\mathbb{E}(X_\varepsilon) = \mathbb{P}(\varepsilon \text{ is a propagating error}) \leq$$
$$\mathbb{P}(m(e,0)=f) = 2^{-n_M}$$

where the last equality is based on the uniformity of $m(e, 0)$.

Linearity of the expectation, combined with the upper bound on $\mathbb{E}(X_\varepsilon)$ leads to $$\mathbb{E}(X_\rho) = \sum_{\substack{\varepsilon \in \mathbb{Z}_2^N \\ |\varepsilon| \leq \rho}} \mathbb{E}(X_\varepsilon) \leq \rho \cdot \binom{N}{\rho} 2^{-n_M} \leq d_D \cdot \binom{n_D n_M}{d_D} 2^{-n_M}$$

where $N = (n_D+1)(n_M+1)-1$ and $\rho = d_D - 1$. In the case $n_M = \Omega(d_D^{1+\alpha})$, Lemma 7 applies. It results
$$\mathbb{E}(X_\rho) \leq d_D \cdot 2^{d_D(\log_2(n_D n_M/d_D) + \log_2(e)) - n_M} \to 0$$

which goes to 0 when $n_D \to \infty$. Since $X_\rho$ takes integer values, this is enough to prove the existence of a measurement code family that leads to an optimal circuit distance for the data code $C_D$. □

Lemma 6. If $\varepsilon = (e, f)$ is a propagating error with weight $|\varepsilon| < d_D$ then
(i) For all $i = 0, 1, \ldots, n_M$, one has $\bar{e}^i \cup C_D$.
(ii) $n(e, 0) = f$ Property (i) of Lemma 6 is independent of the codes $C_D$ and $C_M$. However the value of $m(e, 0)$ used in (ii) depends on these codes.

Proof. By definition of a propagating error, one has $\bar{e}^i \neq 0$ for all i and the condition $|\varepsilon| \leq d_D$ implies that $\bar{e}^i$ cannot belong to $C_D$. This proves item (i). The second property is an immediate consequence of the Property $m(\varepsilon) = 0$ □

The proof of the Theorem 2 relies on the following standard bound on combinatorial factors that.
Lemma 7. If $m = o(\sqrt{n})$, one has $$\binom{n}{m} \leq \left(\frac{ne}{m}\right)^m = 2^{m \log_2(n/m) + m \log_2(e)}$$

2.7.2 Numerical Results

The section reports numerical results. It is observed that an increase of the lifetime of encoded data using the truncated MWE decoder. The importance of different types of noise are analyzed by varying the probability of input errors, internal errors and measurement errors.

Given a data code $C_D$, one can select a measurement matrix with optimal circuit distance. One can pick a length $n_M$ as small as possible. The TMWE decoder is used for fault-tolerant error correction. One can implement this decoding algorithm as a look-up table. This strategy applies to a restricted set of codes since the amount of memory required grows exponentially with the code length. One of the main advantages of this approach is the rapidity of the decoding that returns the correction to apply in constant time as long as enough memory is available to store the table.

Figure 6A:
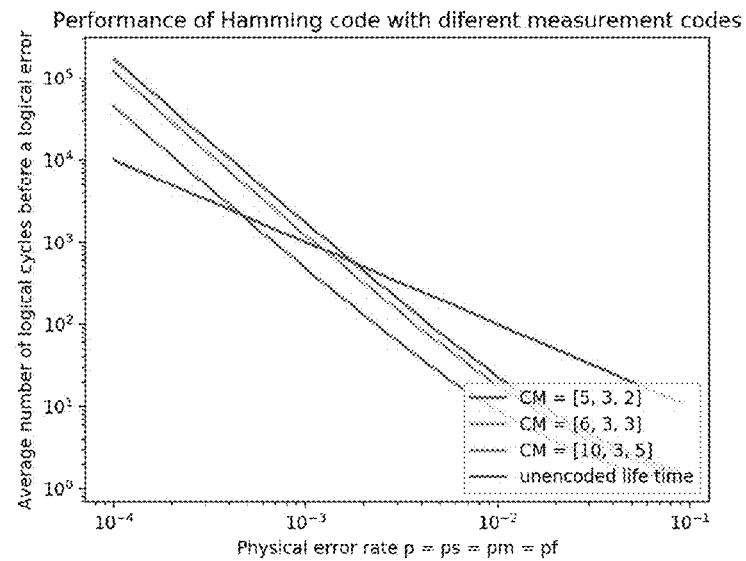
FIG. 6(A) is a schematic block diagram illustrating the average Life time of Hamming code with different measurement codes for a uniform noise with parameters $p = p_s = p_m = p_f$.

FIG. 6(A) is a schematic block diagram 600 illustrating the average Life time of Hamming code with different measurement codes for a uniform noise with parameters $p=p_s=p_m=p_f$.

Figure 6B:
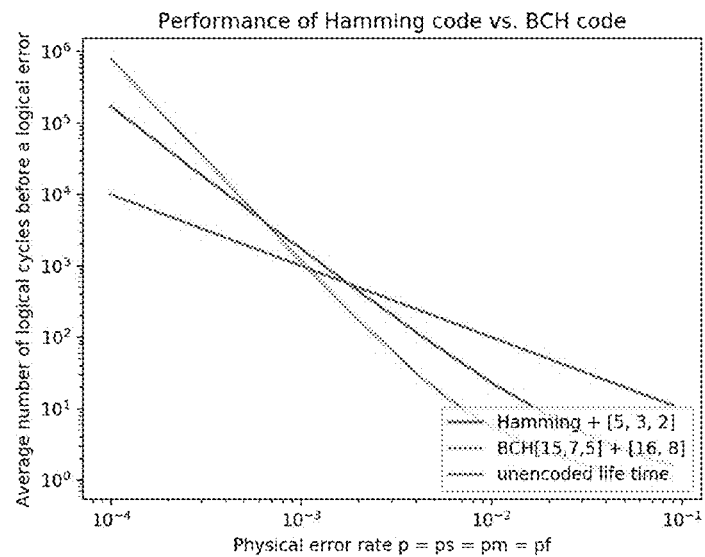
FIG. 6(B) is a schematic block diagram illustrating the shortest measurement sequence with five measurements gives the best results.

FIG. 6(B) is a schematic block diagram 610 illustrating the shortest measurement sequence with five measurements gives the best results. FIG. 6(B) illustrates a comparison between Hamming code and a distance-five BCH code. The larger minimum distance of the BCH code leads to a more favorable scaling of the encoded lifetime.

FIGS. 6(A) and 6(B) plot the average life time obtained by numerical simulations. It is assumed that cycles of measurement and error correction are performed at regular interval. Between two such error correction cycles, the stored data is affected by independent by flips with probability $p_s$. Refer to $p_s$ as the storage error rate. During a correction cycle, each parity check measurement may flip the measured bits. It is assumed that the noise on the bits that are not involved in the parity check is negligible. Measured bits are affected by independent bit flip with probability $p_m$. During a full measurement cycle, a bit involved in r parity checks suffers from an error rate that is roughly $rp_m$. Each outcome bit is flipped independently with probability $p_f$. The lifetime of encoded data is estimated by compute the average life time over 10000 trials. When the physical error rate is small enough the life time of encoded data surpass the unencoded life time. In the case of a uniform noise $p_s=p_f=p_m$, this happens for $$p_{th} \approx 1.1 \cdot 10^{-3}$$

for Hamming code combined with the linear code [5, 3, 2]. When the error rate p is below the threshold value $p^{th}$ often called pseudo threshold, it becomes advantageous to encode. For a uniform noise a smaller number of measurements, that is smaller length for the measurement code is preferable. A larger minimum distance $d_D$ brings a greater improvement of the average life time below the pseudo threshold but it generally also degrades the value of the pseudo threshold of the scheme.

The average life time and the pseudo threshold of a fault-tolerant error correction scheme depends on the three parameters $p_s$, $p_f$, $p_m$ of the storage noise model.

Figure 7:
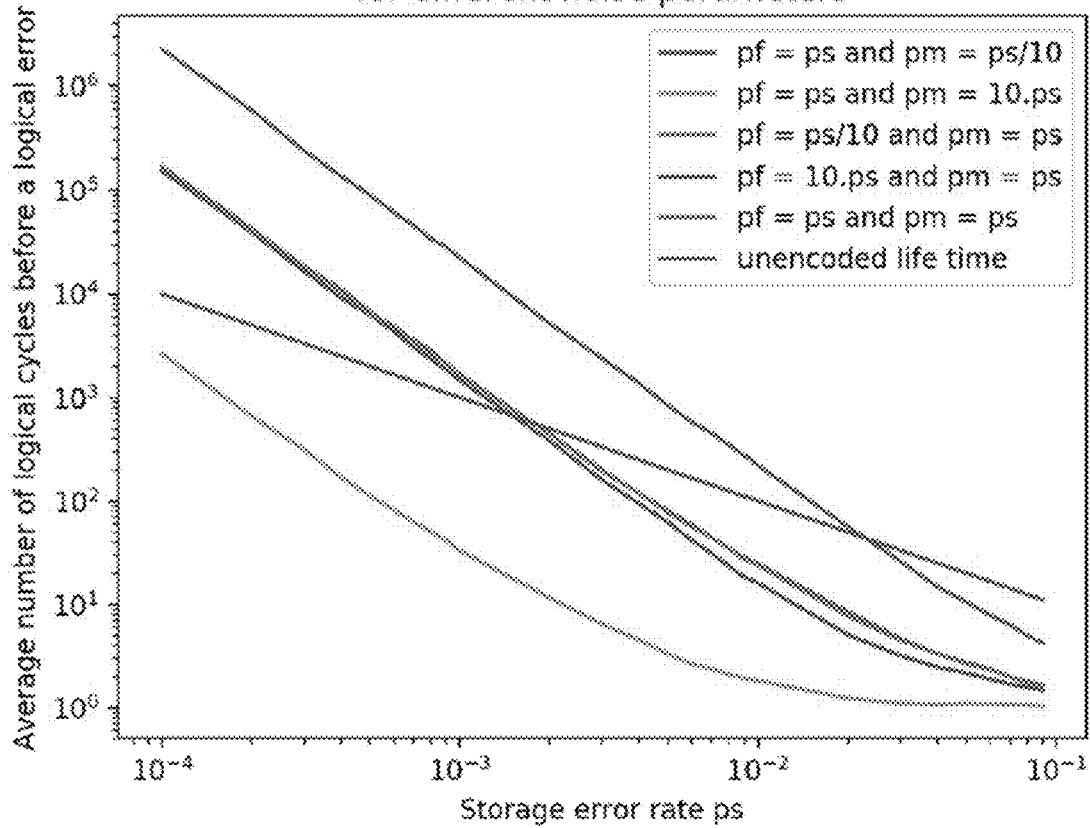
FIG. 7 is a graph showing an average life time of encoded data with Hamming code for different noise parameters obtained over 10,000 trials.

FIG. 7 shows that the parameter $p_m$ has a greater influence on the performance of the scheme than the flip error rate $p_f$. An internal bit flip is more likely to cause a logical error than a flipped outcome. This is because an error that affects only the measurement outcome leads to introducing an error $D_{MWE}(m)$ in the data and by construction of the decoder this error is chosen to have low weight. Through this process flipped outcomes are converted into low-weight residual errors that can be corrected by the next error correction cycle. This is true even when a large number of outcomes is flipped. This phenomenon makes outcome flips far easier to correct than bit flips corrupting the data.

FIG. 7 is a graph 700 showing an average life time of encoded data with Hamming code for different noise parameters obtained over 10,000 trials. The strength of the measurement noise $p_f$ and the internal noise $p_m$ is varied. Increasing or decreasing the value of $p_f$ keeps the lifetime unchanged. However, the encoded lifetime is very sensitive to the internal noise $p_m$.

2.8 Conclusion

In this section, a fault-tolerant error correction is designed based on linear codes that is well adapted to perform quantum error correction in a quantum computer. The decoder is implemented via a look up table which is extremely fast avoiding the difficulty encountered with the surface code decoder. The main drawback of this approach is the large amount of memory required. This restricts the decoder to codes of short length. However this size is enough to improve the quality of the qubits of several orders of magnitude.

Further improvements are possible.

Efficient fault-tolerant decoding algorithm: In this example, a look-up table implementation is used for the TMWE decoder. It is unclear whether a general efficient implementation of the TMWE decoder exists. However, an efficient decoder can be designed for specific families of measurement matrices. This would extend the scope of the current fault-tolerant error correction scheme.

Most Likely Coset decoder: It was observed in Section 2.6 that some circuit errors are trivial. That means that cosets of circuit errors are indistinguishable. Identifying the most likely coset instead of the most likely circuit error would lead to a better decoder. In the quantum setting, the equivalence between two errors that differ in a stabilizer should also be considered. This is another notion of coset that should be exploited in an ideal decoder.

Optimal time overhead: Theorem 2 proposes an asymptotic upper bound on the number of measurements required for fault-tolerant error correction. One could also investigate the tradeoff between the space overhead $n_D/k_D$ and the time overhead $n_M/k_D$.

3 Trained Decoder for Fault-Tolerant Quantum Error Correction

3.1 Introduction

The presence of faults during measurements makes quantum error correction extremely expensive. Shor fault-tolerant scheme, based on repetition of the syndrome measurement, requires a sequence of up to $(n-k)((d+1)/2)^2$ measurements in order to make a [[n, k, d]] CSS code fault-tolerant. In this subsection, a heuristic optimization algorithm is disclosed that produces short fault-tolerant measurement sequences for CSS codes. Further, a decoding algorithm and a trimmed decoder, tailored to the measurement sequence, are disclosed. The trimmed decoder returns a correction in time O(1) but uses a large amount of storage. This limits its application to bounded distance codes but makes it quite relevant for the first generations of fault-tolerant quantum computers. The performance of the optimization algorithm is also illustrated by providing short measurement sequences for repetition codes, Hamming codes, Reed-Muller codes and QR codes. Embodiments of the disclosed algorithm identify a family of single-shot fault-tolerant measurement sequences for Reed-Muller codes RM(m−2, m). In the case of Golay code with parameters [[23, 1, 7]], a fault-tolerant sequence of 27 measurements was found whereas the Shor scheme needs 176 measurements. For this particular sequence, the trimmed decoder consumes 140 times less memory than a look-up table decoder. Finally, an optimization algorithm is disclosed based on simulated annealing that allows one to design short adaptive fault-tolerance sequences of measurements. Allowing for adaptive sequences reduces further the measurement sequence length. In the example of a Golay code, an adaptive sequence of length 25 is identified by simulated annealing.

3.2 Fault Configurations

For simplicity, this subsection is restricted to CSS codes and the focus is on the correction of Z-type errors based on a sequence of X-type Pauli measurements. By symmetry, the same procedure applies to the correction of X-type errors based on Z-type measurements.

A CSS code of length n is considered and it is assumed that error correction is based on a sequence of r measurements of X-type Pauli operators. Each measurement is described by a vector u of $\mathbb{Z}_2^n$, which is the binary representation of the measured Pauli operator $X^u = X^{u_1} \otimes \ldots \otimes X^{u_n}$. Here, the Pauli measurement of the operator $X^u$ is referred to as the measurement u. After a Z-error $Z^v$ represented by a binary vector $v \in \mathbb{Z}_2^n$, the measurement u returns as an outcome the binary inner product (u|v) (mod 2). In what follows, a measurement sequence is given by a sequence of vectors $u_1, u_2 \ldots u_r \in \mathbb{Z}_2^n$. The only authorized measurements correspond to the vectors a that belong to row space of the X-type stabilizer matrix $H_X$ of the CSS code.

Figure 8A:
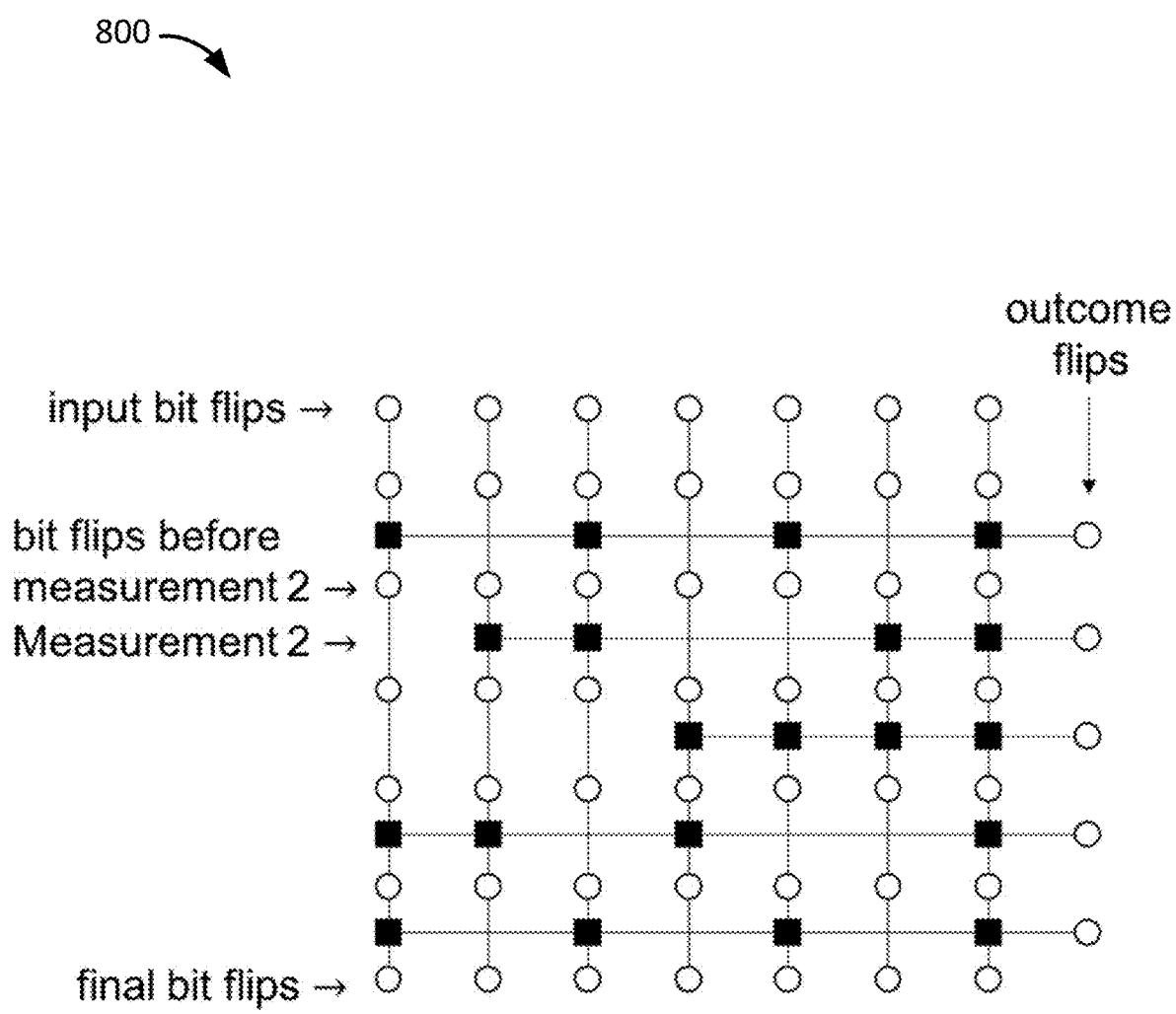
FIG. 8(A) is a schematic block diagram illustrating fault locations for a sequence of five X-type measurements for Steane code.
Figure 8B:
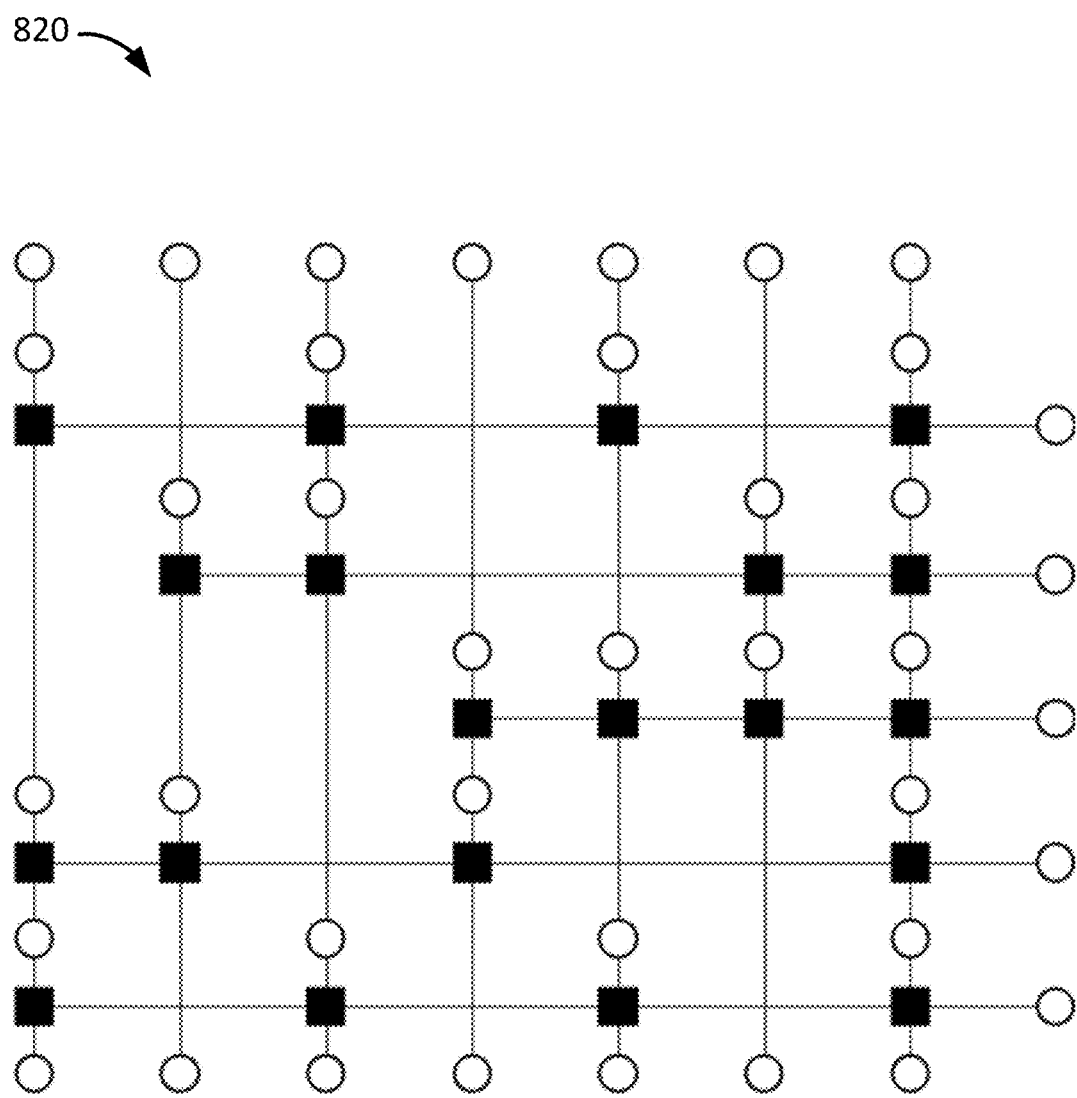
FIG. 8(B) is a schematic block diagram illustrating reduced fault locations for the same sequence of measurements.

In what follows, outcome flips and Z-errors that affect the qubits are considered. Faults that appear during a measurement from errors that are present on the input qubits are distinguished. For simplicity, a single qubit Z-flip is referred to as a bit flip. Four types of faults can appear through a measurement sequence.
 (i) Input bit flips affecting the initial state.
 (ii) Internal bit flips before each measurement $u_i$.
 (iii) Outcome flips for each measurement $u_i$.
 (iv) Final bit flips after the last measurement.
Faults of type (ii), (iii) and (iv) are called internal faults. FIGS. 8(A) and 8(B) show fault locations for a sequence of five measurements for Steane code. It is assumed that each measurement is implemented in a fault-tolerant way, using a cat state for instance but not necessarily. Then, faults can be considered independent. The goal in this instance is to perform error correction based on the outcome of such a sequence of faulty measurements.

FIG. 8(A) is a schematic block diagram 800 illustrating fault locations for a sequence of five X-type measurements for Steane code. Time flows from top to bottom and vertical lines correspond to the seven qubits of Steane code. A row of squares represents a X-measurement supported on the qubits marked by a square. The corresponding output flip is marked by a node at the end of the measurement line.

FIG. 8(B) is a schematic block diagram 820 illustrating reduced fault locations for the same sequence of measurements. In this embodiment, only locations placed before a measured qubits in addition to input and final errors are kept.

In the following, denote by $\Omega(y_1, \ldots, y_r)$ or simply $\Omega(y)$, the set of all fault configurations for a measurement sequence $y = y_1, \ldots, y_r$. The number of faults of a fault configuration; $\varepsilon \in \Omega(y)$, that is the number of bit flips or outcome flips is denoted by $|\varepsilon|$ and the number of internal faults is $|\overset{\circ}{\varepsilon}|$. The residual error on the code state after the measurement cycle is denoted by $\pi(\varepsilon)$. It is the sum of the error vectors that occurs at each level of the measurement cycle.

The size of the fault configuration space makes brute force exploration challenging. In order to shrink the configuration space, note that two fault configurations that result in the same outcome and the same residual error cannot be distinguished. These fault configurations are said to be equivalent.

Lemma 8. (reduced fault configurations) Any fault configuration of $\Omega(y)$ is equivalent to a fault configuration such that
 (a) The set of input bit flips is arbitrary.
 (b) At most one internal bit flip or one outcome flip occurs during a measurement (and not both).
 (c) An internal bit flip can occur on qubit j before measurement $y_i$ only if qubit i belongs to the support of y.
 (d) The set of final bit flips is arbitrary.
Moreover, for any fault configuration, there exists an equivalent fault configuration with smaller or equal internal weight that satisfies (a), (b), (c) and (d).

Proof. Property (a) and (d) are trivial. To prove (b), note that two internal bit flips occurring before a measurement are equivalent to the same bit flips after the measurement. This allows one to push pairs of bit flips through the whole measurement sequence until at most one bit flip remains before each measurement. Similarly, a bit flip before a measurement combined with a flipped outcome is equivalent to a bit flip after the measurement. To demonstrate item (c), remark that one can push a bit flip of a non-measured bit through a measurement. □

FIGS. 8(A) and 8(B) show the reduction of the set of fault locations for Steane code.

One could simplify further fault configurations by pushing the input error through the sequence. In this regard, it is preferred to keep the input error unchanged in order to preserve the distinction between input weight and internal weight of the fault configuration since these notions will play an important role in the definition of fault tolerance.

3.3 Fault Tolerance Criterion

A measurement sequence $y = y_1, \ldots, y_r$ is defined to be t-fault-tolerant if for all outcomes $s \in \mathbb{Z}_2^r$, there exists a correction $c(s) \in \mathbb{Z}_2^r$ such that $$|c(s) - \pi(\varepsilon)| \leq |\overset{\circ}{\varepsilon}| \tag{14}$$

for all fault configurations ε with weight $|\varepsilon| \leq t$. Such a vector c(s) is said to be a valid correction.

The reduction of the fault configuration space simplifies the fault tolerance criterion. It is enough to consider reduced errors. Moreover, one can impose the additional restriction
 (e) no final bit flip occur after the last measurement.
Lemma 9. (simplified fault tolerance criterion) A measurement sequence is fault-tolerant if it satisfies the fault-tolerant condition for all fault configurations e with weight up to t that satisfy (b), (c) and (e).

Proof. The restriction to the fault configurations that satisfy (b), (c) and (e) preserves fault tolerance. The converse implication is less obvious.

Assume that the fault tolerance condition is satisfied for all fault configurations ε that satisfy (b), (c) and (e). Consider an outcome $s \in \mathbb{Z}_2^r$ and a fault configuration ε with weight $|\varepsilon| \leq t$ and with outcome s that satisfies (b) and (c) but not (e). The final error of ε is arbitrary. Denote ε' the fault configuration obtained from ε by discarding its final component. The configuration ε' satisfies (b), (c) and (e) therefore, one has $$|c(s) - \pi(\varepsilon')| \leq |\overset{\circ}{\varepsilon}'|$$

Introducing the final component, one obtains $$|c(s) - \pi(\varepsilon)| = |c(s) - \pi(\varepsilon') + \omega_f| \leq |\overset{\circ}{\varepsilon}'| + \omega_f = |\overset{\circ}{\varepsilon}|$$

where $\omega_f$ is the weight of the final component of $\varepsilon$. The fault set $\varepsilon$ satisfies the fault-tolerant constraint.

It remains to prove that one can also obtain the fault tolerance condition without (b) and (c). Consider a fault configuration F. Based on Lemma 8, $\varepsilon$ is equivalent to a fault configuration $\varepsilon'$ that satisfies (b) and (c) but not (e) and with internal weight $|\overset{\circ}{\varepsilon}'| \leq |\overset{\circ}{\varepsilon}|$. It has been shown that the fault tolerance property holds for $\varepsilon'$. Injecting $\pi(\varepsilon) = \pi(\varepsilon')$ in the fault tolerance inequality, one obtains $$|c(s) - \pi(\varepsilon)| = |c(s) - \pi(\varepsilon')| \leq |\overset{\circ}{\varepsilon}'| \leq |\overset{\circ}{\varepsilon}|$$

which demonstrates the fault tolerance inequality for $\varepsilon$. This concludes the proof. □

Fault tolerance of a sequence depends on the residual sets $R(s|y)$ which contains all residual errors $\pi(\varepsilon)$ derived from a fault configuration $\varepsilon$ with outcome s and with weight at most t that satisfies condition (b), (c) and (e). One can say that the residual set $R(s|y)$ is t-fault-tolerant if satisfies (14). The sequence y is fault-tolerant iff for all outcome s the residual set $R(s|y)$ is t-fault-tolerant.

3.4 Trimmed Decoder

One can implement any decoder as a look-up table (LUT) that returns in time O(1) a correction $c(s) \in \mathbb{Z}_2^n$ for any outcome $s \in \mathbb{Z}_2^r$ as long as enough memory is available to store the $2^r$ possible corrections vectors. This considerably restrict the regime of application of the LUT decoder. The trimmed decoder that is introduced below has three main advantages over the LUT decoder. First, it allows for an early interruption of the sequence of measurements when a valid fault-tolerant correction is identified before the implementation the whole sequence of r measurements. Second, given that shorter sequences of measurement are performed in average, the noise introduce by these measurement drops. Third, most outcomes are very unlikely to occur and one can discard a large fraction of these outcomes without harming the decoder's performance. This significantly reduces the amount of space required.

The trimmed decoder gets his name from the binary tree representing the decoding procedure. One can associate a binary tree with depth r+1 with a measurement sequence $y_1, \ldots, y_r$. Nodes at level $i=1, 2, \ldots, r$ correspond to the measurement $y_i$ and the last level contains the correction to apply. The edges connecting a node of level $i=1, 2, \ldots, r$ with its two children are marked with the two possible outcomes 0 and 1 or the measurement $y_i$. Each node of the tree corresponds to a sequence of outcomes $s_1, s_2 \ldots, s_{i-1}$ where $i=1, 2, \ldots, r+1$ is the node level. At level 1, the root corresponds to the empty sequence.

The following lemma justifies the trimming procedure and explains the decoder's name.

Lemma 10. (trimming lemma) If the residual set $R = R(s_1, \ldots, s_i | y_1, \ldots, y_i)$ is t-fault-tolerant, then any successor $R' = R(s_1, \ldots, s_i, \ldots, s_j | y_1, \ldots, y_i, \ldots, y_j)$ with $j > i$ is also t-fault-tolerant. Moreover, any valid correction $c(s_1, \ldots, s_i)$ for R is also a valid correction for the residual set R'.

Prof. By induction, it is sufficient to prove that the two immediate successors $R_0'$ and $R_1'$ of R after measurement of $y_{i+1}$, with respective outcome $s_{i+1}=0$ or 1, are t-fault-tolerant.

Let $c = c(s_1, \ldots, s_i)$ be a valid correction for the residual set R. Consider a residual error $v' = \pi(\varepsilon') \in R_0'$, or $R_1'$. Assume first that $\varepsilon'$ contains no fault after the measurement $y_i$, then its restriction $\varepsilon$ to the configuration space of the sequence $y_1, \ldots, y_i$ is a fault configuration $\varepsilon$ such that $\pi(\varepsilon) = v'$. This shows that $v' \in R$ and by fault tolerance of R, one obtains $$|c(s) - \pi(\varepsilon')| = |c(s) - \pi(\varepsilon)| \leq |\overset{\circ}{\varepsilon}| = |\overset{\circ}{\varepsilon}'|$$

proving the fault tolerance criterion.

The only other possibility is that $\varepsilon'$ contains a single internal fault that is either a bit flip or an outcome flip. In both cases, one has $$|c(s) - \pi(\varepsilon')| \leq |c(s) - \pi(\varepsilon)| + 1 \leq |\overset{\circ}{\varepsilon}| + 1 = |\overset{\circ}{\varepsilon}'|$$

proving that both direct successors of R are fault-tolerant. The same argument shows that c(s) is a valid correction for all successors of R. □

Lemma 10 proves that one can interrupt the measurement sequence early and apply a valid correction, after a measurement $y_i$ with outcome $s_1, \ldots, s_i$, if the residual set $R(s_1, \ldots, s_i | y_1, \ldots, y_i)$ satisfies the fault tolerance condition. One can trim all the branches of the decoding tree until each leaf corresponds to a fault-tolerant residual set whose parent residual set is not fault-tolerant. For practical purposes, it is more efficient to directly build the trimmed tree from the root instead of cutting unnecessary branches. In term of memory requirement, storage of the single outcome $c(s_1, \ldots, s_i)$ replaces the $2^{r-i}$ outcomes of the successors of node $s_1, \ldots, s_i$.

Figure 9A:
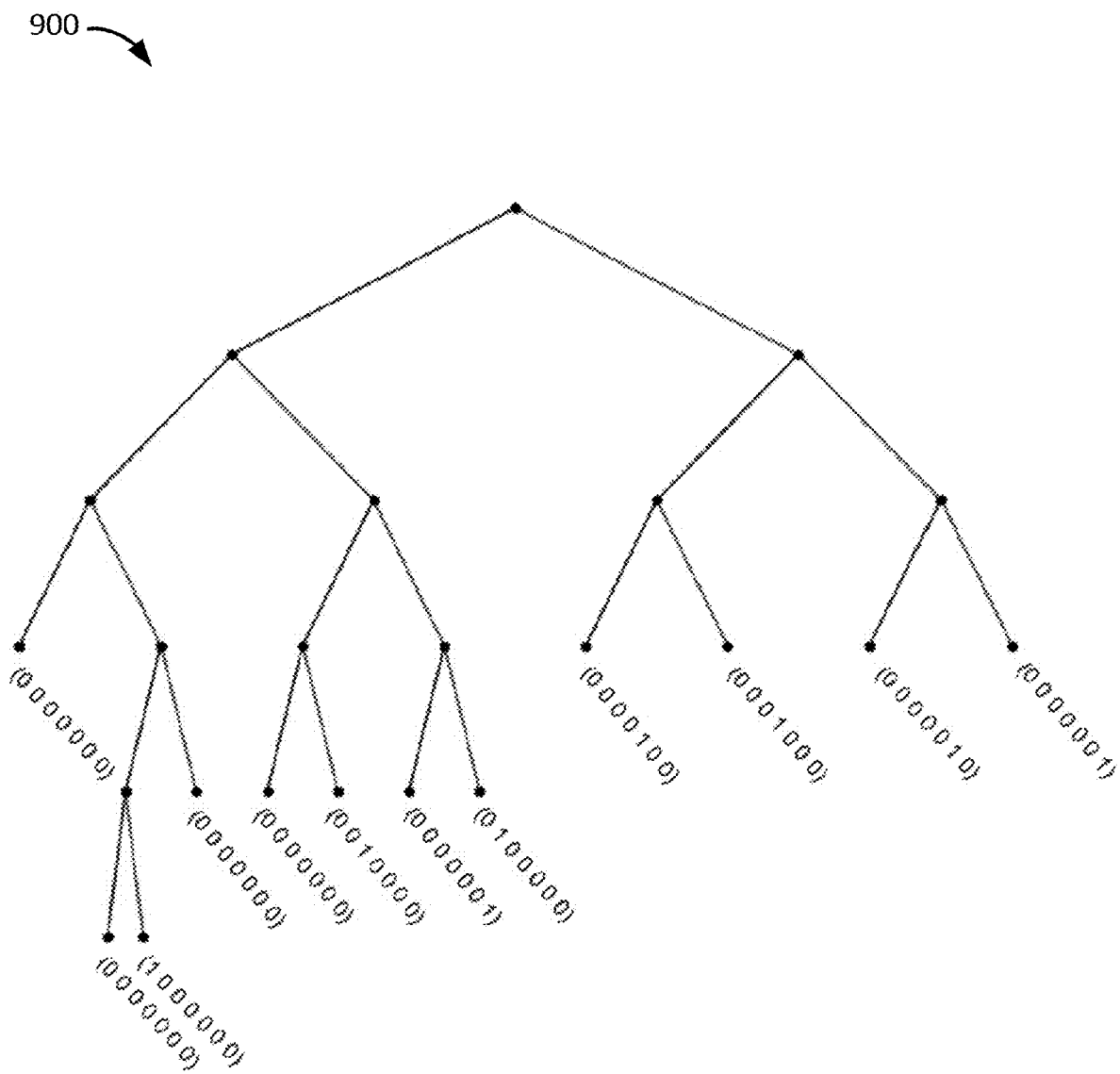
FIG. 9(A) is a schematic block diagram illustrating a decoding tree for Z-error-correction with Steane code corresponding to the sequence of five measurements defined in Eq. (15).

FIG. 9(A) is a schematic block diagram 900 illustrating a decoding tree for Z-error-correction with Steane code corresponding to the sequence of five measurements defined in Eq. (15). Each path from the root to a leaf corresponds to a sequence of outcomes (red for 1 and blue for 0). The measurement sequence stops when a leaf is reached. The correction to apply is stored at each leaf.

In particular. FIG. 9(A) shows a trimmed decoding tree associated with a fault-tolerant sequence of five measurements for Steane code defined by the rows of the following matrix.

$$H = \begin{pmatrix} 0 & 0 & 0 & 1 & 1 & 1 & 1 \\ 0 & 1 & 1 & 0 & 0 & 1 & 1 \\ 1 & 1 & 0 & 1 & 0 & 0 & 1 \\ 0 & 1 & 1 & 1 & 1 & 0 & 0 \\ 1 & 0 & 1 & 1 & 0 & 1 & 0 \end{pmatrix} \quad (15)$$

This sequence was generated by Algorithm 1 described in the next section.

To implement the trimmed decoder, one can build the trimmed decoding tree. Each node $v = v_s$ of the tree corresponds to a sequence of outcome $s = s_1, \ldots, s_i$. If the node $v_s$ is a leaf, the sequence of measurement is complete and the correction c(s) to apply is stored at node $v_s$. Decoding is performed by following the branches of the tree. Each time a new outcome is observed, one can move one step toward the leaves according to the outcome value. When a leaf s is reached, one can stop measuring and one can apply the correction c(s) stored at node s. In practice the time required to move one step through the tree is far shorter than the time required to implement a measurement circuit that returns one outcome bit $s_j$. Therefore, the decoding can be performed in time O(1) once the last outcome is observed. It is also possible to decode in parallel a large number of blocks given the fast pace of the trimming decoder compared to the time necessary to implement a Pauli measurement.

One can design a fault-tolerant sequence of 27 measurements for Golay code (see Algorithm 1 and Table 1). Implementation of the LUT decoder for such a sequence requires to store $2^{27}$ correction vectors. Assuming that each vector is written in three-byte blocks, this requires 40 megabytes of memory. The trimmed decoder requires less than 3 megabytes of memory. FIG. 10(*a*) shows the decoding tree that contains 648,059 nodes, 324,029 internal nodes and 324,030 leaves. One can store the 324,030 three-bytes corrections which costs only 1 megabyte of memory. In addition, one desirably stores the decoding tree. Since the decoding tree is static and since no backtracking is performed in this embodiment, one can associate an index i=0, 1, ..., |V|=648,058 with each node and one can store only the two successors of node i for each internal node. This requires to store 324,029 pairs of indices where each index is 3 bytes long, that is 1.9 megabyte. In this example, the trimmed decoder provides a 140× reduction of the memory requirement.

FIG. 10 is a schematic block diagram 1000 showing a trimmed decoding tree associated with a fault-tolerant sequence of 27 measurements for Golay code obtained using Algorithm 1. The tree contains 648,059 nodes and its leaves store 324,030 correction vectors.

If memory is the bottleneck, one can consider an alternative implementation of the trimmed decoder based on a hash table, avoiding to allocate the decoding tree. One can store all the pairs (s, c(s)) of syndrome and valid fault-tolerant correction corresponding to the leaves in a hash table. During the measurement cycle, one can form the outcome vector $s=(s_1, \ldots, s_i)$. After each measurement, one can check if s is present in the hash table. If s is found the measurement sequence is interrupted and the corresponding correction c(s) is applied. The decoding tree is not required. One only needs to store 324,030 syndrome-correction pairs, which cost 2.3 megabytes of memory, leading to 170× reduction factor compared with the LUT decoder.

3.5 Design of Short Measurement Sequences

This section proposes a heuristic optimization algorithm that produces a short fault-tolerant measurement sequence. Algorithm 1 provides a high level description of our procedure.

The most naive idea to produce a short fault-tolerant measurement sequence for a given CSS code is to randomly select sequences of measurements and to build the corresponding tree. Each time a measurement is added to the sequence, one can construct a new level of nodes of the decoding tree, and one can compute the residual set at each node and check the fault tolerance condition. While some non-fault-tolerant nodes remains, one can keep adding measurement to the sequence. After a large number of samples, one can return the shortest sequence found. This algorithm works in principle but is limited to very short length due to the exponential growth of the decoding tree and the difficulty to compute the residual set for each node. Checking the fault tolerant condition is very expensive given that the size of the residual set is generally exponential in the length n of the CSS code.

Here, an alternative approach is suggested that does not necessitate to build the whole decoding tree and does not check for fault-tolerance at each step. One can consider a simplified condition that produces short sequences that are likely to be fault tolerant. After a large number of samples, one can check that the shortest sequence found is fault-tolerant. If this is the case, the algorithm succeeds. In practice, one is able to find short sequences much faster than with the previous idea and all the sequences produced for codes with minimum distance d=3, 5, 7 were fault-tolerant. For distance 9 and larger, instances were found where multiple trials were necessary to obtain a sequence that satisfy the fault tolerance condition.

Pseudo-distance: Consider a measurement sequence $y_1, \ldots, y_r$. Let $\pi_i(\varepsilon)$ be the residual error on the encoded state after the sub-sequence $y_1, \ldots, y_i$. Define the pseudo-distanced $\tilde{d}$ of the measurement sequence by $$\tilde{d}=\min\{|\varepsilon| \| s(\varepsilon)=0, \pi_i(\varepsilon) \neq 0, \forall i=1, \ldots, r \text{ and } |\pi(\varepsilon)|>|\overset{\circ}{\varepsilon}|\} \qquad (16)$$

One of the motivations for introducing this notion of distance is the following lemma which proves that a large pseudo-distance guarantees the fault tolerance of a large number of residual sets. However, a large pseudo-distance is generally not sufficient for fault tolerance.

Lemma 11. Assume that y is a measurement sequence with pseudo-distance $\tilde{d} \geq 2t+1$. Then, for all fault configurations a with weight at most t, with outcome s and with trivial internal error $\overset{\circ}{\varepsilon}=0$, the residual set R(s|y) is t-fault-tolerant. Proof. Consider a residual set R(s|y) that contains the residual error of such a fault configuration $\varepsilon$ and denote $c(s)=\pi(\varepsilon)$. For all configurations $\varepsilon'$ with outcome s such that $|\varepsilon'| \leq t$, one has $$|c(s)-\pi(\varepsilon')|=|\pi(\varepsilon-\varepsilon')|.$$

Consider $\omega=\varepsilon-\varepsilon'$. One has $|\omega| \leq 2t < \tilde{d}$. By definition of the pseudo-distance, either $|\pi(\omega)| \leq |\overset{\circ}{\omega}|$ or $\pi_i(\omega)=0$ for some i. In both cases, one gets $|\pi(\omega)| \leq |\overset{\circ}{\omega}|=|\overset{\circ}{\varepsilon}|$ based on $\overset{\circ}{\varepsilon}=0$. This proves the lemma. □

The pseudo-distance is limited by the Z-type minimum distance d of the code used. Here, a sequence generator is disclosed that produces measurement sequences that admits an optimal pseudo-distance $\tilde{d}=d$ for a CSS code with minimum distance d. The main simplification over the naive approach considered above is that one does not need to explore the branches of the decoding tree corresponding to all the possible outcome values. One can restrict ourselves to the trivial outcome. This is a exponential reduction of the size of the space to explore.

In order to determine whether the pseudo-distance of a sequence reaches d, one can keep track of a set of errors with trivial outcome. For a sequence $y=y_1, \ldots, y_r$, one can consider the set $$\Omega_0(y)=\{\varepsilon \| \varepsilon| \leq d-1, s(\varepsilon)=0, \pi_i(\varepsilon) \neq 0, \forall i=1, \ldots, r \text{ and } |\pi(\varepsilon)|>|\overset{\circ}{\varepsilon}|\}$$

and the corresponding residual set $R_0(y)$, that contains the residual errors of all fault configurations $\varepsilon \in \Omega_0(y)$. By definition of the pseudo-distance, one has $\tilde{d}=d$ iff the set $R_0(y)$ is empty.

Detection power of a measurement: Each measurement is selected to reduce the size of $R_0(y)$ as much as possible. The detection power $\det(u|y_1, \ldots, y_i)$ introduced below measures the quality of a measurement $y_{i+1}=u$. Algorithm 1 designs measurement sequences based on high detection power measurements.

| Algorithm 1 Short measurement sequence generator |
|---|
| Input: A linear code C with length n, and minimum distance d, and the number of trials m for selecting each measurement. |
| Output: A measurement sequence y for the code C with optimal pseudo-distance $\tilde{d}$. |
| 1:    Initialize y as an empty sequence. |
| 2:    Compute the initial set of residual errors $R_0(y)$ |
| 3:    While $R_0(y)$ is non-empty do: |
| 4:        Generate m random vectors u of the dual code $C^\perp$. |
| 5:        For each vector u compute the detection power of u. |

| Algorithm 1 Short measurement sequence generator |
| --- |
| 6: Add the vector u with the largest detection power to the sequence y. |
| 7: Update the set of residual error $R_0(y)$. |
| 8: Return the sequence y. |

One could define the detection power of u by counting the number of residual errors $\pi(\varepsilon) \in R_0(y)$ that are detected by u, i.e. such that $(u|\pi(\varepsilon))=1 \pmod 2$. The measurement of u increases the internal weight of c since a flipped outcome is necessary in order to satisfy $s(\varepsilon)=0$. Therefore, one can hope that increasing the internal weight of $\varepsilon$ will discard this fault-configuration because it violates $|\varepsilon| \leq d-1$ or $|\pi(\varepsilon)| > |\overset{\circ}{\varepsilon}|$. This strategy does not work in general since the residual error $\pi(\varepsilon)$ is not necessarily discarded with $\varepsilon$. It can reappear with internal bit flips occurring during the new measurement. One way to ensure that the residual error $\pi(\varepsilon)$ is definitely eliminated, is to focus on faults configurations $\varepsilon \in \Omega_0(y)$ with minimum input weight and with minimum internal weight. In what follows, some notations are introduced to clarify this notion of detection power.

The set $\Omega_0(y)$ can be partitioned as $$\Omega_0(y) = \bigsqcup_{j=0}^{d-1} \Omega_0(y, j)$$

where $\Omega_0(y, j)$ is the subset of $\Omega_0(y)$ that contains the fault configurations with input weight equal to j. The induced residual subsets $R_0(y, j) = \pi(\Omega_0(y, j))$ form a cover of the residual set $$R_0(y) = \bigcup_{j=0}^{d-1} R_0(y, j).$$

They generally overlap: a residual error of $R_0(y)$ can be obtained from fault configurations with different input weights.

The subset of $\Omega_0^j(y)$ that contains fault configurations with input weight j and with minimum internal weight in $\Omega_0^j(y)$ is denoted $\Omega_{0,min}^j(y)$ and the corresponding residual set is $R_{0,min}^j(y)$. Consider the first non-empty set $R_0(y, j_0)$ for $j_0=0, 1, \ldots$. The detection power of a measurement $y_{i+1}=u$ after a sequence $y=y_1, \ldots, y_i$, is defined to be $$\det(u|y_1, \ldots, y_i) = |\{v \in R_{0,min}^{j_0}(y) | (u|v) \neq 0 \pmod 2\}|.$$

The index $j_0$ is the minimum input weight of an error of $\Omega_0(y)$. The condition $(u|v) \neq 0 \pmod 2$ means that a non-trivial outcome is observed for the measurement of $y_{i+1}=u$ if the residual error is u. In other words, u detects v.

Short measurement sequences: Algorithm 1 provides short fault-tolerant measurement sequence for different families of linear codes. The sequence is obtained by selecting random measurements with large detection power. Table 1 shows the length of short sequences generated by algorithm 1 for standard families of codes. These sequences satisfy the fault tolerance condition.

Table 1 illustrates the performance of Algorithm 1. Here, several standard families of codes are considered and fault-tolerant sequences are considered using Algorithm 1. In this example, 100 sequences are generated for each code and the shortest one is selected. Then, it is checked whether this short sequence satisfies the fault-tolerance condition. For all the examples reported in Table 1, the first sequence tested was fault-tolerant. The length of the shortest sequence found is reported and this length compared with the number of parity checks defining the code, this is a lower bound on the sequence length. As an upper bound, one can use the length of Short sequence, that is $(n-k)(d+1)_2$ measurements in order to satisfy the fault tolerance criterion. The full syndrome measurement must be repeated up to $(d+1)^2$ in order to obtain $(d+1)/2$ identical consecutive syndromes. The running time per sample is reported; that is, the time required by Algorithm 1 to return a single sequence.

Figure 9B:
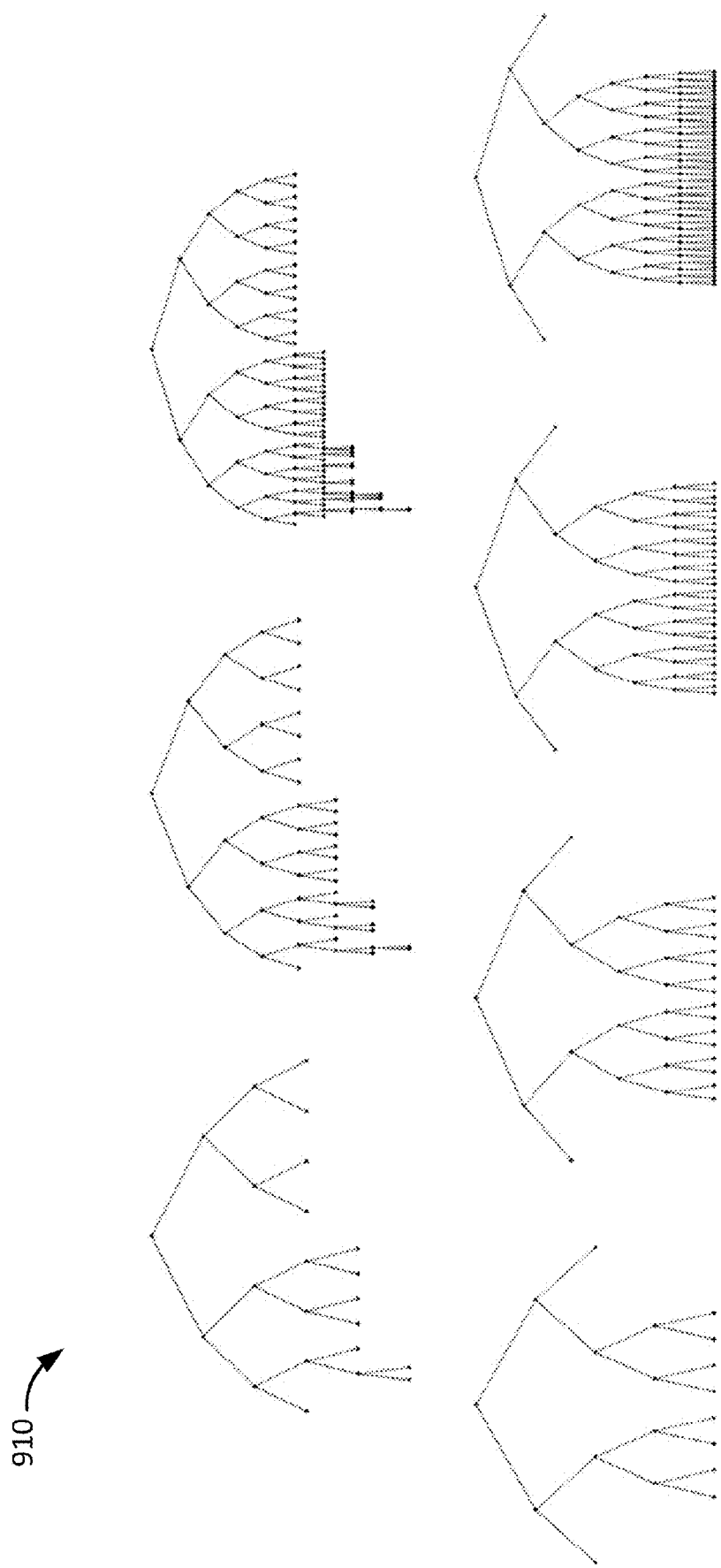
FIG. 9(B) represents the decoding obtained from Algorithm 1 for Hamming codes and Reed-Muller codes.

FIG. 9(B) represents the decoding obtained from Algorithm 1 for Hamming codes and Reed-Muller codes. In the case of Hamming codes, one can obtain sequences of length 2m−1 for Hamming codes of length $2^m-1$. It believed that no shorter fault-tolerant sequence exists for these codes.

In more detail, FIG. 9(B) is a schematic block diagram 910 showing trimmed decoding trees. The top decoding trees are associated with the short fault-tolerant measurement sequences obtained using Algorithm 1 for Hamming codes. The bottom decoding trees are associated with the short fault-tolerant measurement sequences obtained using Reed-Muller codes.

Figure 10A:
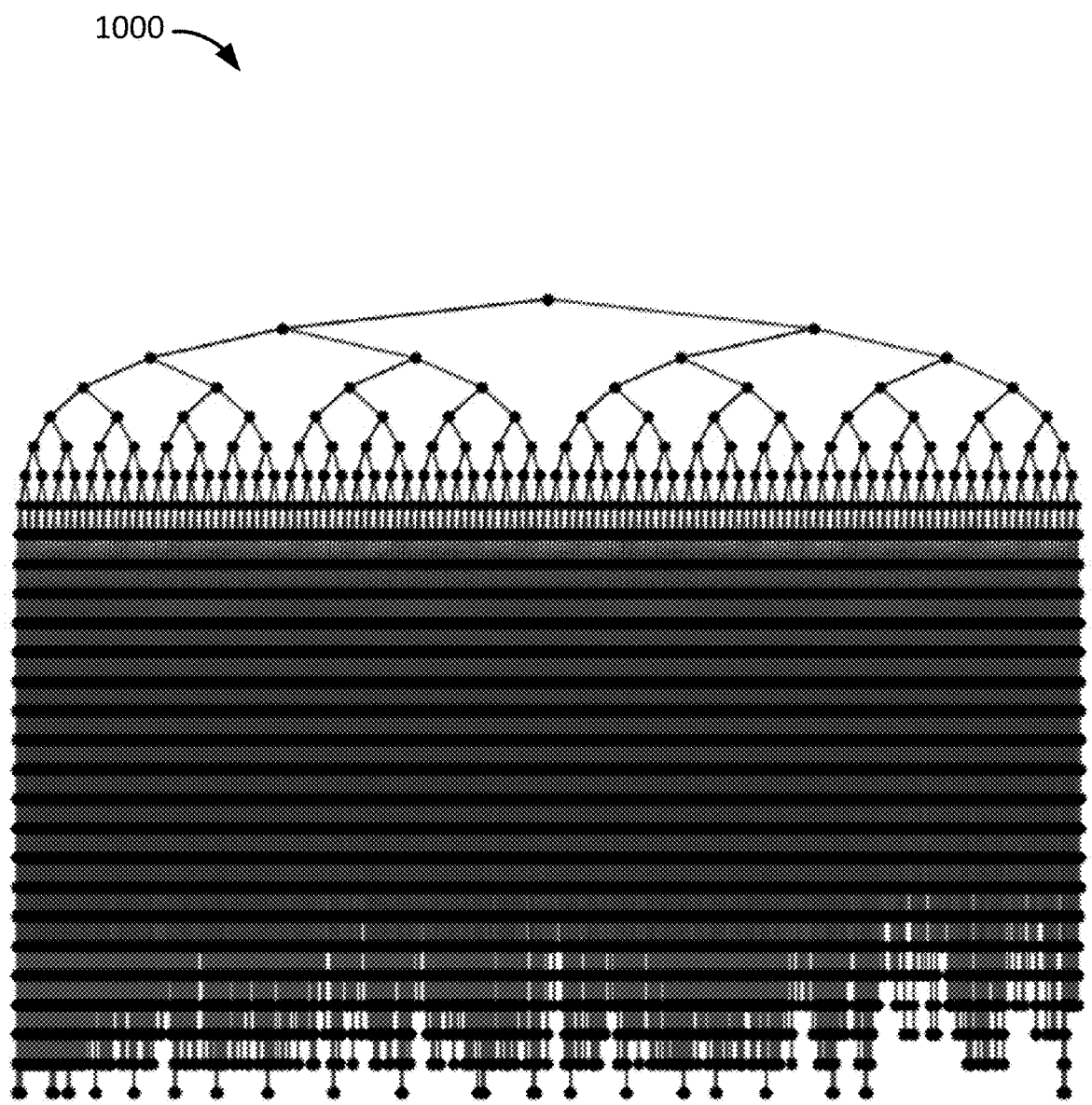
FIG. 10(a) shows the decoding tree that contains 648,059 nodes, 324,029 internal nodes and 324,030 leaves.

One can achieve the lower bound for Reed-Muller codes RM(m−2, m). This proves that single-shot fault-tolerant error correction is possible with this family in the following sense: any single fault can be corrected with a number of measurements that is equal to the number of parity checks defining the code. One does not need more measurements than in the fault-free context. In the case of Golay code, a fault-tolerant sequence of 27 measurements was found, whereas Shor fault-tolerant error correction requires up to 11×16=176 measurements. This decoding tree associated with this sequence is represented in FIG. 10(A).

Complexity of Algorithm 1: Algorithm 1 can be implemented in $O(n^2 S(n, d-1))$ bit operations using $O(nS(n, d-1))$ bits of memory where $$S(n, k) = \sum_{j=0}^{k} \binom{n}{j}.$$

Here, an examination of the most expensive subroutines Algorithm 1 is provided.

Computation of the residual set: The stopping condition $R_0(y)=\emptyset$ requires to compute the set $R_0(y)$ of residual errors. One could run over the set of all fault configurations and check for each configuration if it satisfies the condition of Eq. 16. This requires to run over a number of fault configurations that is exponential in both n and the number of measurements. Even within the shrink configuration space derived in Lemma 8, this is far too slow. Instead, a dynamic programming update of the set of residual errors is preferred that consumes more memory but allows for a fast update of the set of residual errors after adding a measurement. The set of all residual errors are stored. It is initialized with the $S(n, d-1)$ errors of $\mathbb{Z}_2^n$ with weight up to d−1. To obtain the updated set of residual errors $R' = R_0(y_1, \ldots, y_{i+1})$ from the set from $R = R_0(y_1, \ldots, y_i)$ after adding measurement $y_{i+1}$, one can run over the vectors v of R and include the extra fault that occurs during measurement $y_{i+1}$. By Lemma 8, one only need to consider at most $\omega+2$ cases where $\omega \leq n$ is the measurement weight (ω internal bit flips or an outcome flip or no fault). This provides the residual set update in $O(|R|n)$ operations on n-bit vectors. The complexity of this dynamic programming update is not exponential in the number of measurements but only linear.

TABLE 1

Length of the shortest fault-tolerant measurement sequence found using Algorithm 1 for standard families of linear codes. The last column is the running time of Algorithm 1 to generate one sequence using a single processor 2, 4 GHz Intel Core i5 with 16 Gb of RAM. The fault-tolerant sequences in this table are obtained by selecting the shortest sequence over 100 samples from the output of Algorithm 1 with 200 samples per measurement (m = 200). For Reed-Muller codes RM (m − 2, m) in red, one obtains a single shot fault-tolerant sequence, i.e. the sequence length reaches the lower bound. It is believed that the sequence obtained from Hamming codes are optimal. In all cases, a significant improvement is achieved over the Shor method that requires (d + 1)/2 repetitions of the full syndrome measurement.

| Code | Parameters | Sequence length lower bound | Sequence length from Algorithm 1 | Shot sequence length | Running time (in sec.) |
|---|---|---|---|---|---|
| Repetition(3) | [3, 1, 3] | 2 | 3 | 8 | .004 |
| Repetition(5) | [5, 1, 5] | 4 | 6 | 36 | .0067 |
| Repetition(7) | [7, 1, 7] | 6 | 14 | 96 | .018 |
| Hamming(3) | [7, 4, 3] | 3 | 5 | 12 | 0.006 |
| Hamming(4) | [15, 11, 3] | 4 | 7 | 16 | 0.01 |
| Hamming(5) | [31, 26, 3] | 5 | 9 | 20 | 0.0035 |
| Hamming(6) | [63, 57, 3] | 6 | 11 | 24 | 0.16 |
| RM(1, 4) | [16, 5, 8] | 11 | 23 | 176 | 2.5 |
| RM(1, 3) | [8, 4, 4] | 4 | 4 | 16 | 0.006 |
| RM(2, 4) | [16, 11, 4] | 5 | 5 | 20 | 0.012 |
| RM(3, 5) | [32, 26, 4] | 6 | 6 | 24 | 0.033 |
| RM (4, 6) | [64, 57, 4] | 7 | 7 | 28 | 0.16 |
| QR(17) | [17, 9, 5] | 8 | 14 | 72 | 0.31 |
| Golay code | [23, 12, 7] | 11 | 27 | 176 | 39 |

Computation of the detection power: In order to compute the detection power, it is desirable to loop over the set of residual errors of $R_{0,min}^{j0}(y)$ with minimum input weight and minimum internal weight. In order to obtain this set, one can include extra data about the residual errors and update this data after each measurement. For each residual error v of $R_0(y)$, the minimum internal weight $\omega^{(j)}(v)$ of a fault configuration $\varepsilon \in \Omega_0^j(y)$ is stored that results to the residual error $v=\pi(\varepsilon)$. This sequence of numbers $\omega^{(j)}(v)$ for j=0, 1, . . . , d−1 is updated after each measurement. This update can be done with the residual set update at a constant extra cost.

Verification of the fault tolerance condition: Once a short sequence is returned by Algorithm 1, we must perform a final check of the fault tolerance constraint. If the sequence fails the fault tolerance check, one can restart and generate a new sequence. Checking for fault tolerance is quite expensive since one desirably considers all outcomes and follow all the possible branches of the decoding tree. Again, one can use a dynamic programming update to speed up the computation of the residual set but this remains much more expensive than running Algorithm 1. One of the main advantages of this example approach to generate short sequences is that one generally performs the fault tolerance test only a very small number of times. Most sequences returned are successfully passing the fault tolerance test at the first attempt.

One can prove that if the measurement added at each step has a non-zero detection power, then Algorithm 1 terminates. One can design a greedy version of Algorithm 1 that selects the measurement $y_{i+1}$ with maximum detection power. It has been observed numerically that the randomized version described in this disclosure returns shorter sequences. Finally, the Algorithm 1 was tuned by considering different variant of the detection power. For instance, one can obtain better results by considering not only the detection relative to residual errors of $R_{0,min}^{j0}(y)$ but including also the second or the third non-empty residual set $R_{0,min}^{j}(y)$. It is suspected that there is no choice of the detection power function that is universally good. It is desirably tuned for a given type of error correcting code.

3.6 Adaptive Trimmed Decoder

The trimmed decoder implements a predefined sequence of measurements $y_1, \ldots, y_r$ independently of the outcomes observed. This is sub-optimal strategy. Adapting the measurement $y_{i+1}$ to the preliminary sequence $s_1, \ldots, s_i$ of outcomes observed can lead to shortened measurement sequences.

An adaptive version of the trimmed decoder is obtain by storing a measurement vector at each node of the decoding tree. The flexibility offered by the adaptive trimmed decoder allows in principle to obtain shorter fault-tolerant measurement sequences. In order to design such optimized sequences, a heuristic optimization algorithm is proposed based on simulated annealing that modifies the local structure of the decoding tree in order to reach shorter depth.

The initial random tree is obtained by selecting a random measurement for each node. One can recursively build the tree and check the fault tolerance condition along each branch. Instead of picking a random initial decoding tree, one can plug in the results of Algorithm 1 as a staring configuration so that the simulated annealing spends more time exploring short depth trees.

To perform a simulated annealing move, one can select a random node v of the decoding tree and produce a candidate subtree to replace the successors of v. In order to favor the reduction of the longest branches of the tree, one can select a random node as follow. Select the root $v_0$ with probability $2^{-(\delta-2)}$ where $\delta$ is the depth of the tree T. If the root is not selected, move to a child $v_1$ of $v_0$ that is contained in a maximum length path from the root to the leaves. If both children of $v_0$ satisfy this condition, pick one of them uniformly at random. Then, either $v_1$ is selected with probability $2^{-(\delta-3)}$ or one can move to its maximum depth child and so on. One can speed-up the convergence of the simulated

---

Algorithm 2 Short adaptive measurement sequence generator

---

Input: A linear code C with length n and minimum distance d. An initial temperature $\tau_0$ and a number of iterations m.
Output: An adaptive fault-tolerant sequence encoded as a binary tree T whose nodes support the measurements and edges support an outcome 0 or 1.
1:    Build a random adaptive fault-tolerant sequence represented by a binary tree T by selecting uniform random measurements until a fault-tolerant sequence is achieved through each path of the tree.
2:    For i from 1 to m do:
3:        Set the temperature to $\tau = \tau_0/(m + 1)$
4:        Select a random node v of the tree T.
5:        Construct a random subtree $T'_v$ to replace the subtree $T_v$ of T at node v.
6:        Compute $\delta_v = \text{depth}(T'_v)$ and $\delta'_v = \text{depth}(T_v)$.
7:        Replace $T_v$ by $T'_v$ with probability $p = \min(1, 2^{\delta_v} \cdot e^{-(\delta'_v - \delta_v)/\tau})$.
8:    Return the minimum depth decoding tree T obtained through the m iterations.

--- annealing optimization by tuning the value q in the probability $q^{(\delta-l)}$ of acceptance at level l in order to favor the optimization of certain levels of the tree.

A simulated annealing move which reduces the depth is always accepted, otherwise, it is accepted with probability $e^{-(\delta'_v - \delta_v)/\tau}$. The issue of this choice is that a random subtree $T_v'$ is very unlikely to be accepted as a replacement to the subtree $T_v$ of the current configuration since $T_v$ has that has been optimized for a large number of simulated annealing iterations. This remark motivates the introduction of the exponential term $2^{\delta_v}$ in the acceptance probability in Algorithm 2. With this correction, a notable improvement of the numerical results can be obtained.

Figure 10B:
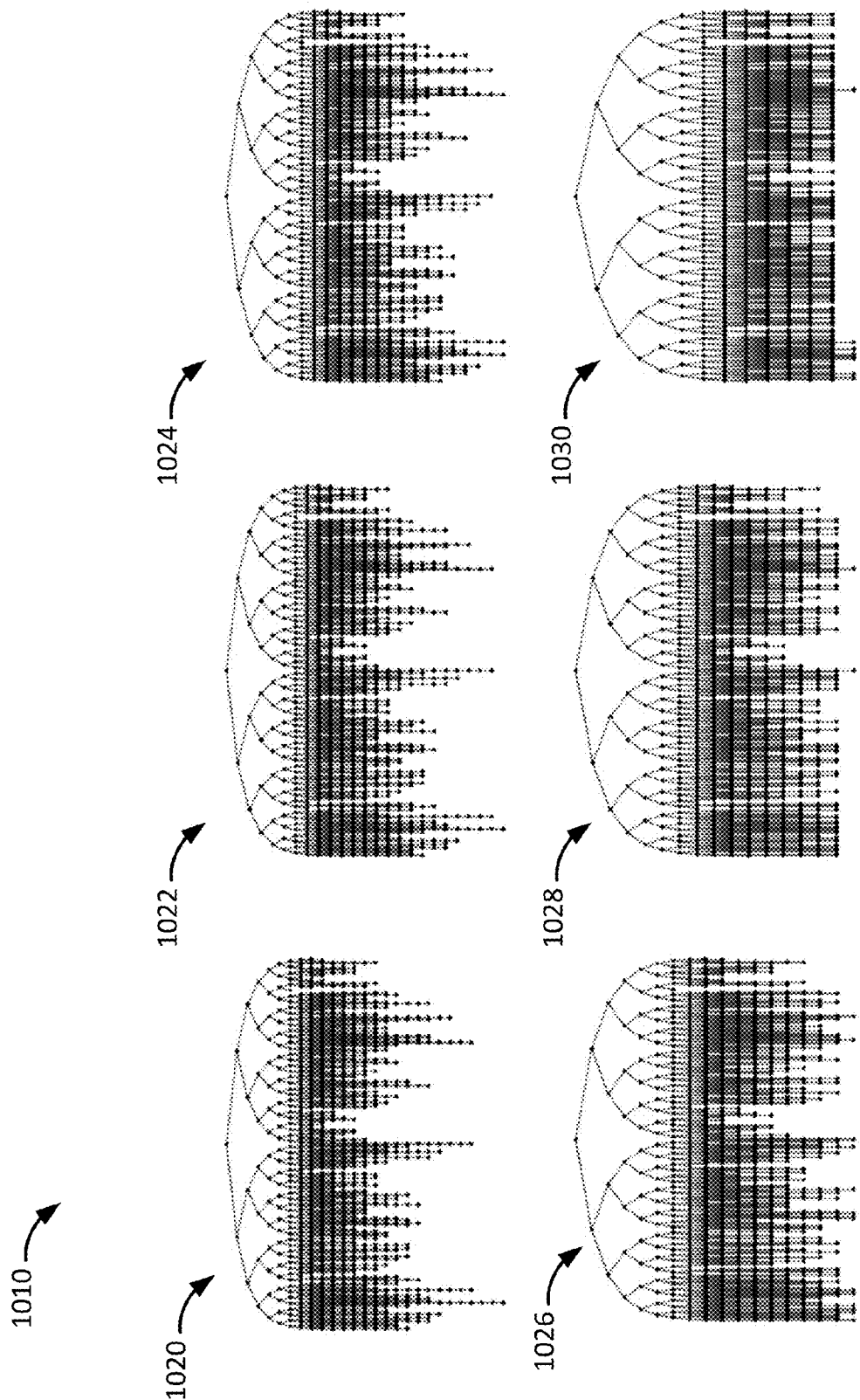
FIG. 10(B) is a schematic block diagram illustrating adaptive trimmed decoding trees for the [17,9,5] QR code obtained with Algorithm 2 after 1 iteration (depth 27 and shown at 1020), 10 iterations (depth 25 and shown at 1022), 100 iterations (depth 23 and shown at 1024), 1,000 iterations (depth 18 and shown at 1026), 10,000 iterations (depth 17 and shown at 2028) and 100,000 iterations (depth 14 and 1030).

FIG. 10(B) is a schematic block diagram 1010 illustrating adaptive trimmed decoding trees for the [17,9,5] QR code obtained with Algorithm 2 after 1 iteration (depth 27 and shown at 1020), 10 iterations (depth 25 and shown at 1022), 100 iterations (depth 23 and shown at 1024), 1,000 iterations (depth 18 and shown at 1026), 10,000 iterations (depth 17 and shown at 2028) and 100,000 iterations (depth 14 and 1030). The maximum depth of the final adaptive measurement sequence is 13 (tree depth 14) which is better than the shortest sequence obtained in Table 1 using Algorithm 1. We see how Algorithm 2 trimmed the longest branches.

FIG. 10(B) illustrates the local transformations of a random adaptive decoding tree. One can show the decoding tree obtained at different stages of the simulated annealing process. In the case of the QR code with length 17, the length of the sequence obtained (which is the depth of the tree minus one) after 1,000,000 iterations with initial temperature $\tau_0 = 100$, one can obtain a sequence of length 13, which improves over the results of Table 1 derived from Algorithm 1. It is not always possible to find adaptive measurement sequences that reduce the maximum length of the sequence. However, it is generally possible to obtain a shorter average length for the measurement sequence. Table 2 shows the average length obtained after 10,000 simulated annealing iterations with initial temperature $\tau_0 = 100$,

TABLE 2

Improvement obtained by Algorithm 2 after 10,000 simulated annealing iterations with initial temperature $\tau_0 = 100$, taking as an initial decoding tree the shortest sequence of Table 1. Here, the running time over a single processor 2, 4 GHz Intel Core i5 with 16 Gb of RAM is reported, and the maximum and average length of a measurement sequence in the decoding tree with the non-adaptive sequence of Table 1 and the adaptive sequence returned by Algorithm 2 are compared. In most cases, one sees a reduction of the average sequence length and in some case one also improves the maximum length.

| Code | Parameters | non-adaptive length (max/average) | adaptive length (max/average) | Running time (in sec.) |
|---|---|---|---|---|
| Repetition(3) | [3, 1, 3] | 3/2.4 | 3/2.4 | .078 |
| Repetition(5) | [5, 1, 5] | 6/5.4 | 6/5.4 | 7.9 |
| Repetition(7) | [7, 1, 7] | 14/10.9 | 12/10.2 | 21 |
| Hamming(3) | [7, 4, 3] | 5/3.8 | 5/3.6 | 1.2 |
| Hamming(4) | [15, 11, 3] | 7/5.0 | 7/3.96 | 2.4 |
| Hamming(5) | [31, 26, 3] | 9/6.2 | 9/6.0 | 5.0 |
| Hamming(6) | [63, 57, 3] | 11/7.289 | 11/7.283 | 14.8 |
| RM(1, 4) | [16, 5, 8] | 23/17.09 | 21/16.9 | 337 |
| RM(1, 3) | [8, 4, 4] | 4/3.6 | 4/3.3 | 1.2 |
| RM(2, 4) | [16, 11, 4] | 5/41 | 5/4.4 | 2.1 |
| RM(3, 5) | [16, 11, 4] | 6/5.8 | 6/5.4 | 3.5 |
| RM(4, 6) | [16, 11, 4] | 7/6.9 | 7/6.4 | 7.5 |
| QR(17) | [17, 9, 5] | 14/11.1 | 12/10.7 | 30 |
| Golay code | [23, 12, 7] | 27/19.6 | 25/19.5 | 2389 | starting from the short sequence obtained in Table 1. A reduced average length was observed and, in some cases, a reduced maximum length for the measurement sequence was observed.

It was proven that adapting the measurement sequence to the outcome observed can lead to a reduced measurement sequence. A shorter measurement sequence leads to a speed-up of the quantum clock cycle but it is also advantageous in term of error correction performance since measurement circuits are responsible for introducing additional noise to the data. Therefore, any reduction of the average measurement sequence length results in a weakened noise. The price to pay for adaptivity is the storage space require to store the whole tree which doubles the memory requirement of the trimmed decoder. Moreover, the classical controller of the qubits must be capable of adapting the sequence of operations to apply fast enough.

4 Examples of Distance-Three and -Four Fault-Tolerant Syndrome Measurement, Including Single-Shot Fault-Tolerant Syndrome Measurement

4.1 Introduction

4.1.2. Shor-Style Syndrome Measurement

Here, "Shor-style" syndrome measurement schemes are examined and developed, in which syndromes are measured one at a time using fault-tolerantly prepared cat states. For example, to measure $X^{\otimes w}$, one can first prepare a cat state $$\frac{1}{\sqrt{2}}(|0^w\rangle + |1^w\rangle)$$

using a fault-tolerant Clifford circuit. For distance-d fault tolerance, giving protection against up to $$t = \left\lfloor \frac{d-1}{2} \right\rfloor$$

faults, the preparation circuit should satisfy that for any k=1, . . . , t Pauli gate faults, the weight of the error on the output state, modulo stabilizers, is at most k. Then this cat state is coupled to the data with transversal CNOT gates and each of its qubits measured in the Hadamard, or $|+\rangle/|-\rangle$, basis. The parity of the w measurements is the desired syndrome. See FIGS. 11(A) and 11(B).

FIG. 11(A) is a schematic block diagram 1100 of a w-qubit cat state, $$\frac{1}{\sqrt{2}}(|0^w\rangle + |1^w\rangle),$$

can be used to measure the syndrome of $X^{\otimes w}$, as shown here with w=4.

FIG. 11(B) is a schematic block diagram 1120 illustrating a cat state should be prepared fault tolerantly, which here it is not: a single X fault, at the location in red, spreads to a weight-two X error on the data.

In FIG. 11(B), the w=4 qubit cat state can be prepared fault tolerantly using one extra ancilla qubit, conditioning on measuring an even parity for the first two qubits avoids the problem in FIG. 11(A), so that this circuit is fault tolerant.

One can also measure $X^{\otimes w}$ with a cat state on, potentially, fewer than w qubits, or even without using a cat state at all. For example, FIGS. 12(A) and 12(B) show two circuits for measuring $X^{\otimes 6}$ using only three ancilla qubits, both CSS fault tolerant to distance three. (For CSS states and codes, a weaker notion of fault tolerance is used, allowing the X and Z components of the error both separately to have weights ≤k. For example, $X \otimes Y \otimes Z$ has weight three, but its X and Z components, $X \otimes X \otimes I$ and $I \otimes Z \otimes Z$, both have weight two.)

In more detail, FIGS. 12(A) and 12(B) show two circuits for measuring $X^{\otimes 6}$ using three ancilla qubits. Both circuits are CSS fault tolerant to distance three, e.g., a single X fault will result in a data error of weight at most one.

The first circuit 1200 shown in FIG. 12(A) shows a generalized construction.

The second circuit 1220 shown in FIG. 12(B) does not use a cat state. It is a special case of a "flag fault-tolerant" procedure.

Here, (CSS) fault-tolerant syndrome measurements are taken as a primitive, and used as a building block for fault-tolerant error correction, fault-tolerant logical measurement, and other operations. The details of how syndromes are measured will not be important. What is important is that the syndromes are measured one at a time, in sequence, and not all at once as in Steane-style or Knill-style error correction. In Subsection 14.15 ("Other measurement models"), other syndrome measurement models are considered, including flag fault-tolerant syndrome measurement and models intermediate between Shor- and Steane-style syndrome measurement.

4.1.3. Fault-Tolerant Error Correction for the [[7,1,3]] Code

For a CSS code, an X error correction procedure is fault tolerant to distance d if for any k, $\ell$ with $$k + \ell \leq \left\lfloor \frac{d-1}{2} \right\rfloor,$$

when the input code block has a weight-k X error and at most $\ell$ faults occur during the procedure, then the output error has weight at most $\ell$.

As an example, consider Steane's [[7,1,3]] code, a self-dual CSS code with Z stabilizers given by $$I \otimes I \otimes I \otimes Z \otimes Z \otimes Z \otimes Z$$
$$I \otimes Z \otimes Z \otimes I \otimes I \otimes Z \otimes Z$$
$$Z \otimes I \otimes Z \otimes I \otimes Z \otimes I \otimes Z$$

The code can correct one input X error—it has distance three—because every weight-one X error has a distinct syndrome, e.g., $X_1$ gives syndrome 001 because it commutes with the first two stabilizers and anti-commutes with the third.

However, it is not fault tolerant to simply measure these three syndromes and apply the corresponding correction. For example, it might be that the input is perfect but an $X_7$ fault occurs right after measuring the second syndrome. Then the observed syndrome will be 001, and applying an $X_1$ correction will leave the data with a weight-two error, $X_1X_7$. Similarly, an $X_7$ fault after measuring the first syndrome will give syndrome 011 and therefore leave the data with error $X_3X_7$.

To handle faults that occur during error correction, for this code, one desirably measures more syndromes. For example, say one measures the first stabilizer again, so the measurement sequence is $$\begin{array}{ccccccc} 0 & 0 & 0 & 1 & 1 & 1 & 1 \\ 0 & 1 & 1 & 0 & 0 & 1 & 1 \\ 1 & 0 & 1 & 0 & 1 & 0 & 1 \\ 0 & 0 & 0 & 1 & 1 & 1 & 1 \end{array}$$

where one has adopted a less cumbersome notation, with 0 meaning I and 1 meaning Z. Now an internal $X_7$ fault can result in the syndromes 0111, 0011, 0001 or 0000 (coming from suffixes of the last column above). As none of these syndromes can be confused with that from an input error on a different qubit, an error-correction procedure can safely apply no correction at all in these cases. (Alternatively, one could correct $X_7$ for the syndrome 0111 and give no correction for 0011 or 0001.)

However, the above four-measurement sequence still does not suffice for fault-tolerant X error correction, because an internal fault on qubit 3 can also cause the syndrome 0010. A fifth measurement is needed an input $X_1$ error from an internal $X_3$ fault. For example, this measurement sequence works:

$$\begin{array}{ccccccc} 0 & 0 & 0 & 1 & 1 & 1 & 1 \\ 0 & 1 & 1 & 0 & 0 & 1 & 1 \\ 1 & 0 & 1 & 0 & 1 & 0 & 1 \\ 0 & 0 & 0 & 1 & 1 & 1 & 1 \\ 0 & 1 & 1 & 0 & 0 & 1 & 1 \end{array} \quad (17)$$

Note that after the first four syndrome measurements, the only bad case remaining is the suffix 0010 of column 3, 0110. For the fifth measurement, one can therefore use any stabilizer that distinguishes qubits 1 and 3. This need not be one of the stabilizer generators; for example, 0111100 also works.

In this disclosure, fault-tolerant syndrome measurement sequences are developed for other codes, including codes with distance >3, for error correction and other operations. In addition to fixed measurement sequences like Eq. (17), adaptive measurement sequences are also considered, in which the choice of the next stabilizer to measure depends on the syndromes already observed.

4.2. Distance-Three CSS Codes

Having established the setting of sequential fault-tolerant syndrome measurements, syndrome measurement sequences are next considered for fault-tolerant error correction for general distance-three CSS codes.

4.2.1. Heuristic Algorithm for Distance-Three CSS Codes

The argument leading to Eq. (17) suggests a general procedure for constructing measurement sequences for distance-three CSS fault-tolerant error correction:

Call a pair (i, j) of qubits "bad" if an internal fault on qubit j can result in the same syndrome as an X input error on a different qubit i. If the columns of the length-m measurement sequence are $c_1, \ldots, c_n \in \{0, 1\}^m$, then qubit j is bad if for some $k \in \{0, 1, \ldots, m\}$, the suffix $0^k(c_j)_{k+1} \ldots (c_j)_m = c_i$ with $i \neq j$.

Then repeat, while there exists a bad pair (i, j): Append to the measurement sequence a stabilizer that is 0 on qubit i and 1 on qubit j, or vice versa.

The algorithm eventually terminates because for a distance-three CSS code, for any pair (i, j) there must exist a Z stabilizer that distinguishes $X_i$ from $X_j$. (That is, unless the code is degenerate, i.e., $X_iX_j$ is a stabilizer. For a degenerate code with weight-two stabilizers, the definition of "bad" should require that $X_i$ and $X_j$ be inequivalent.) When there are no bad pairs left, the procedure is CSS fault tolerant to distance three.

A natural greedy version of this algorithm might, for example, choose to add the stabilizer that eliminates the most bad qubit pairs.

4.2.2. Non-Adaptive Measurement Sequence for any Distance-Three CSS Code

A fault-tolerant error-correction procedure is next constructed for any distance-three CSS code:

Theorem 3. Consider an $[[n, n-r_Z-r_X, 3]]$ CSS code with $r_Z$ independent Z stabilizer generators $g_1, \ldots, g_{r_Z}$. Then fault-tolerant X error correction can be realized with $2r_Z-1$ syndrome measurements, by measuring in order all the generators $g_1, \ldots, g_{r_Z}$, followed by just $g_1, \ldots, g_{r_Z-1}$.

For example, for Steane's [[7,1,3]] code, X and Z error correction can each be done with five syndrome measurements, as in Eq. (17). This is optimal, in the sense of using the fewest possible Z measurements for X error correction. It will be shown in Secs, and below that the construction is not optimal for every distance-three CSS code. More generally, for the $[[2^r-1, 2^r-1-2r, 3]]$ Hamming code, X and Z error correction can each be done with $2r-1$ syndrome measurements.

Proof of Theorem 3. The concern is that an internal X fault might be confused with an input X error. (One need not worry about an incorrectly flipped syndrome measurement, since it at worst it could cause a weight-one correction to be wrongly applied.)

For an internal fault occurring after the first $r_Z$ measurements, the first $r_Z$ measured syndromes will be trivial and therefore different from those of any input error.

This leaves as possibly problematic only internal faults occurring among the first $r_Z$ measurements (after $g_1$ and before $g_{r_Z}$). Consider an internal fault that results in syndromes (s, t, s'), where s, $s' \in \{0, 1\}^{r_Z-1}$ are the first and second syndromes for $g_1, \ldots, g_{r_Z-1}$, and $t \in \{0, 1\}$ is the syndrome of $g_{r_Z}$. Assume that the fault occurs on qubit q, after the measurement of a stabilizer $g_i$ that involves that qubit q; if it occurs before every stabilizer involving that qubit q, then it is equivalent to an input error. Since $s_i = 0$, which is incorrect for an input error on qubit q, this means that the syndromes (s, t) and (s', t) will be inconsistent in the sense that they correspond to different input errors; (s', t) corresponds to input error $X_q$, while (s, t) corresponds to some other, inequivalent input error or no input error. (One-qubit errors $X_i$ and $X_j$ are inequivalent if they correspond to different syndromes. They can be equivalent, even if $i \neq j$, if the code is degenerate and $X_iX_j$ is a stabilizer.) Therefore the syndromes (s, t, s') are not consistent with any input error. □

Observe that the important property for this proof to work is that both the first $r_Z$ stabilizers measured and the last $r_Z$ stabilizers measured form independent sets of generators. They need not both be $\{g_1, \ldots, g_{r_Z}\}$.

4.2.3 Adaptive Measurement Sequence

Theorem 3 constructs a nonadaptive error-correction procedure, in which the same stabilizers are measured no matter the syndromes. An adaptive syndrome-measurement procedure can certainly be more efficient. For example, if the first measured syndromes of $g_1, \ldots, g_{r_Z}$ are all trivial, then one can end X error correction without making the remaining $r_Z-1$ syndrome measurements. The following adaptive X error correction procedure works for any distance-three CSS code:

Adaptive X Error-Correction Procedure for a Distance-Three CSS Code

1. Measure the $r_Z$ stabilizer generators, stopping after the first nontrivial measurement outcome. If all syndromes are trivial, then end error correction, having made $r_Z$ measurements total.
2. If measurement $g_j$ is nontrivial, then measure again $g_1, g_2, \ldots, g_{j-1}, g_{j+1}, \ldots, g_{r_Z}$. Apply the appropriate correction based on these and the nontrivial outcome for syndrome g having made j+r−1 measurements total.

The procedure uses between $r_Z$ and $2r_Z-1$ syndrome measurements, the worst case being if the first nontrivial syndrome measurement is for $g_{(j=r_Z)}$. It is advantageous to detect errors early.

An alternative way to prove Theorem 3 is to notice that the theorem's nonadaptive measurement sequence includes as subsequences this adaptive procedure's possible measurement sequences.

4.3. [[5, 1, 3]] Perfect Code

The perfect [[5, 1, 3]] code, encoding one logical qubit into five physical qubits to distance three, has stabilizer group generated by X Z Z X I and its cyclic permutations I X Z Z X, X I X Z Z, Z X I X Z. For a deterministic (non-adaptive) distance-three fault-tolerant error-correction procedure, it suffices to fault-tolerantly measure six stabilizers, in the order:

X Z Z X I

I X Z Z X

Z Z X I X

Z X I X Z

X Z Z X I

X I X Z Z

If the error-correction circuit were perfect, then it would be enough to measure the four stabilizer generators in order to correct input errors. Thus, one can tolerate up to one fault (for distance-three fault tolerance) during syndrome extraction provided two extra syndromes are measured.

Precisely which stabilizers are measured, and in what order, matters. For example, consider if one only measured the first five of the above six stabilizers. The syndromes for $X_1$ and $X_5$ input errors would be 00110 and 00010, respectively. However, if the input were perfect and an $X_1$ fault occurred just after measuring the third syndrome, this would also generate the syndrome 00010. Applying an $X_5$ correction would leave the weight-two error $X_1X_5$ on the data. The above six measurements have been chosen to avoid any such problem.

4.4. Hamming Codes

Hamming codes are a family of $[[2^r-1, 2^r-1-2r, 3]]$ quantum error-correcting codes, for r=3, 4, 5, . . . . They are self-dual, perfect CSS codes.

For example, the [[7,1,3]] and [[15, 7, 3]] Hamming codes have stabilizer generators given respectively by, in both Pauli Z and X bases, $$\begin{matrix} 0 & 0 & 0 & 1 & 1 & 1 & 1 \\ 0 & 1 & 1 & 0 & 0 & 1 & 1 \\ 1 & 0 & 1 & 0 & 1 & 0 & 1 \end{matrix} \text{ and} \tag{18}$$

$$\begin{matrix} 0 & 0 & 0 & 0 & 0 & 0 & 0 & 1 & 1 & 1 & 1 & 1 & 1 & 1 & 1 \\ 0 & 0 & 0 & 1 & 1 & 1 & 1 & 0 & 0 & 0 & 0 & 1 & 1 & 1 & 1 \\ 0 & 1 & 1 & 0 & 0 & 1 & 1 & 0 & 0 & 1 & 1 & 0 & 0 & 1 & 1 \\ 1 & 0 & 1 & 0 & 1 & 0 & 1 & 0 & 1 & 0 & 1 & 0 & 1 & 0 & 1 \end{matrix}$$

It will be shown that:

Theorem 4.

For the [[7,1,3]] Steane code, measuring in order the seven stabilizers from Eq. (19) below suffices for distance-three fault-tolerant error correction.

In general, for the $[[2^r-1, 2^r-1-2r, 3]]$ Hamming code, there is a sequence of 3r−1 stabilizer measurements (beginning with the 2r standard Z and X stabilizer generators, and ending with certain r−1 Y basis stabilizers) that suffice for distance-three fault-tolerant error correction. (See, e.g., Eqs. (20) and (21) for the r=3 and r=4 cases, respectively.)

For the $[[2^r-1, 2^r-1-2r, 3]]$ Hamming code, one can separately correct X and Z errors fault tolerantly by measuring 2r−1 Z and 2r−1 X stabilizers, 4r−2 syndrome measurements total. (This is a special case of Theorem 3.)

Note that it is not fault tolerant just to measure the r Z and r X stabilizer generators fault tolerantly. For example, with either code, an X fault on qubit 3 just before the last syndrome measurement creates the same syndrome as an input X error on qubit 1. But applying an $X_1$ correction would result in the error $X_1X_3$, which is one away from the logical error $X_1X_2X_3$. In fact, because of the perfect CSS property, the $2^r-1$ possible weight-one input errors use all $2^r-1$ possible nontrivial r-stabilizer syndromes. Necessarily, therefore, some faults during syndrome extraction will lead to syndromes that are the same as syndromes from input errors. Thus sequential measurement of any fixed set of r stabilizer generators can never be fault tolerant. More measurements are needed.

Consider first the [[7,1,3]] Hamming code, also known as Steane's code. Measuring in order the following set of seven stabilizers suffices for fault-tolerant error correction:

I I I Z Z Z Z     (19)

I X X I I X X

X I X I X I X

I Y Y Y Y I I

Y Y I Y I I Y

-continued $$\begin{matrix} Z & Z & I & I & Z & Z & I \\ Z & X & Y & Z & I & Y & X \end{matrix}$$

As with the [[5, 1, 3]] code, the particular set of stabilizers and the order in which they are measured matters considerably. It is not immediately obvious that this order works, but it can be verified by computing the syndromes for all 7×3=21 nontrivial one-qubit errors as well as all suffixes of these syndromes.

The last stabilizer in Eq. (19) mixes X, Y and Z operators. Should this be undesirable in an experiment, the following sequence of eight measurements also allows for fault-tolerant error correction:

$$\begin{matrix} I & I & I & Z & Z & Z & Z \\ I & Z & Z & I & I & Z & Z \\ Z & I & Z & I & Z & I & Z \\ I & I & I & X & X & X & X \\ I & X & X & I & I & X & X \\ X & I & X & I & X & I & X \\ Y & Y & I & Y & I & I & Y \\ I & Y & Y & I & I & Y & Y \end{matrix} \quad (20)$$

Observe that the first six measurements are simply the standard X and Z stabilizer generators from Eq. (18). The last two Y stabilizers are measured to prevent bad syndrome suffixes from internal faults.

The construction of Eq. (20) generalizes to the entire family of Hamming codes. For the [[$2^r-1$, $2^r-1-2r$, 3]] Hamming code, first measure the m Z and m X standard stabilizer generators. Then make r−1 further Y measurements: first measure in the Y basis the product of all the standard stabilizer generators, then measure in the Y basis the generators 2 to r−1. This makes for r+r+(r−1)=3r−1 syndrome measurements total. For example, for the r=4, [[15, 7, 3]] Hamming code, the 11-stabilizer sequence generalizing Eq. (20) is $$\begin{matrix} I & I & I & I & I & I & I & Z & Z & Z & Z & Z & Z & Z \\ I & I & I & Z & Z & Z & Z & I & I & I & I & Z & Z & Z & Z \\ I & Z & Z & I & I & Z & Z & I & I & Z & Z & I & I & Z & Z \\ Z & I & Z & I & Z & I & Z & I & Z & I & Z & I & Z & I & Z \\ I & I & I & I & I & I & I & X & X & X & X & X & X & X \\ I & I & I & X & X & X & X & I & I & I & I & X & X & X & X \\ I & X & X & I & I & X & X & I & I & X & X & I & I & X & X \\ X & I & X & I & X & I & X & I & X & I & X & I & X & I & X \\ Y & Y & I & Y & I & I & Y & Y & I & I & Y & I & Y & Y & I \\ I & I & I & Y & Y & Y & Y & I & I & I & I & Y & Y & Y & Y \\ I & Y & Y & I & I & Y & Y & I & I & Y & Y & I & I & Y & Y \end{matrix} \quad (21)$$

If Y measurements are impossible in an experiment, then by Theorem 3 2r−1 Z and 2r−1 X syndrome measurements suffice for fault-tolerant error correction.

4.5. Single-Shot Error Correction with a [[16, 4, 3]] Color Code

Consider the following 16-qubit color code as illustrated by the schematic block diagram 1300 of FIG. 13.

In FIG. 13, there is a qubit for each vertex, indexed as in the diagram, and for each shaded plaquette there is both a Z stabilizer and an X stabilizer on the incident qubits. For example $Z^{\otimes 6} \otimes 1$ and $X^{\otimes 6} \otimes 1$ are stabilizers on the first six qubits, corresponding to a green hexagon. This gives a [[16, 4, 3]] self-dual CSS code.

For this [[16, 4, 3]] code, the sequence of syndrome measurements shown at 1400 in FIG. 14, in both Z and X bases, allows for fault-tolerant error correction, where • are written in place of 0 to draw attention to the structure. The highlighted syndromes correspond to plaquettes in FIG. 13. The 12 weight-six stabilizers measured are independent and so the sequence is optimal: it gives single-shot error correction with no redundant syndrome measurements.

Here, • have been rewritten in place of 0 to draw attention to the structure. The highlighted syndromes correspond to plaquettes in FIG. 13. The 12 weight-six stabilizers measured are independent and so the sequence is optimal; it gives single-shot error correction with no redundant syndrome measurements.

The theorem can be rapidly verified by noting that the columns in schematic block diagram 1400 of FIG. 14 that are all distinct (so the code has distance three), and furthermore their suffixes are all distinct from these columns (so faults during syndrome extraction cannot be confused with input errors). For example, the syndrome along the second column is 100100, and its suffix 000100 does not appear as any column.

Although this [[16, 4.3]] code allows for single-shot fault-tolerant error correction, it might still be preferable in practice to use a code like the [[15, 7, 3]] Hamming code. In addition to having higher rate, the 15-qubit Hamming code allows for error correction with only 11 syndrome measurements, shown in Eq. (21) (14 syndromes if Y operators cannot be measured).

4.6. Concatenation Fault-Tolerant Error Correction for the [[16, 4, 3]] Color Code An error-correction procedure is fault-tolerant to distance d if on an input with a weight-e Pauli error and if there are f internal faults, then provided $$e + f \leq \frac{d-1}{2}$$

the output error has weight at most f. This fault-tolerance definition is enough to show that encoding a computation can improve its reliability on a noisy device.

Depending on the physical and desired logical noise rates, however, it may be necessary to use multiple levels of encoding, in a concatenated fault-tolerance scheme. In this case, error correction for all but the outermost code should satisfy an additional fault-tolerance property. Roughly, failed code blocks need to be restored to the codespace so that the next code level can diagnose and correct any possible logical errors. More precisely.

Definition 5. An error-correction procedure is concatenation fault tolerant if, in addition to the previous fault-tolerance criterion, it satisfies:

On any input, if the error-correction procedure has f internal faults, with $$f \leq \frac{d-1}{2},$$

then the output should be within distance f of the codespace.

For example, with f=0 internal faults, error correction should restore an arbitrary input to the codespace, possibly with logical errors away from the desired state. Concatenation fault-tolerant error correction can also be used for state preparation. For example, for an [[n, k, d]] CSS code, $$\alpha = \langle 0^n | \overline{0}^k \rangle > 0, \text{ so } |0^n\rangle = \frac{1}{\alpha}|0^n\rangle\langle 0^n | \overline{0}^k\rangle = \frac{1}{\alpha}\left(\frac{I+Z}{2}\right)^{\otimes n}|\overline{0}^k\rangle = \frac{1}{2^n \alpha}\sum_{S\subseteq[n]} Z_S |\overline{0}^k\rangle;$$

and so starting from $|0^n\rangle$ can fault-tolerantly prepare the encoded state $|\overline{0}^k\rangle$ using a concatenation fault-tolerant Z error-correction procedure.

For a distance-three perfect or perfect CSS code, such as the [[5, 1, 3]] or Hamming codes, fault-tolerant error correction is automatically concatenation fault tolerant. (With f=0 internal faults, errors with every syndrome are restored to the codespace; and the concatenation fault-tolerance criterion with f=1 internal fault holds because every state is within distance one of the codespace.)

However, for the [[16, 4, 3]] color code of FIG. 13, the syndrome measurement sequence in the theorem below is not enough for concatenation fault tolerance. In particular, the input error $X_1 X_2$ leads to the syndrome 000100 if there are no internal faults. For concatenation fault tolerance, some correction needs to be applied to restore the state to the codespace. However, the same syndrome can arise from a perfect input if the fourth syndrome bit is incorrectly flipped, so fault tolerance requires that the correction have weight at most one. No correction works.

Concatenation fault tolerance is possible with two more syndrome measurements:

Theorem 6. For the [[16, 4, 3]] color code of FIG. 13, the sequence of syndrome measurements in FIG. 15, in both Z and X bases, allows for concatenation fault-tolerant error correction.

The theorem is easily verified by using a computer to find a consistent correction for every possible syndrome.

Due to high qubit overhead, code concatenation is undesirable in a quantum computer. For the rest of this disclosure, fault-tolerant error correction without the concatenation fault-tolerance criterion will be considered.

4.7. Codes Designed for Fast Error Correction

So far, efficient and fault-tolerant syndrome-measurement schemes have been designed for existing codes. One can also design codes to facilitate efficient fault-tolerant syndrome measurement. To do so, let one begin by considering three simple codes; then one can generalize them.

A. 4.7.1. Base Codes

Here are the parity checks for a [4, 1, 4] classical linear code (a repetition code), and the stabilizer generators for [[8, 2, 3]] and [[8, 3.3]] quantum stabilizer codes:

[4, 1, 4] code (22)
1 1 1 1
0 0 1 1
0 1 0 1

[[8, 2, 3]] code
Z Z Z Z I I I I
X X X X I I I I
I I I I Z Z Z Z
I I I I X X X X
I X Y Z I X Y Z
I Z X Y I Z X Y

[[8, 3, 3]] code
Z Z Z Z Z Z Z Z
X X X X X X X X
I I Z Y X Z Y X
I Z X I X Y Z Y
I X I Z Z X Y Y This [[8, 3, 3]] code is (equivalent to) the first in a family of [[$2^r$, $2^r-r-2$, 3]] codes.

For the [[8, 3, 3]] code, one can measure in order $Z^{\otimes 8}$, $X^{\otimes 8}$, $Z^{\otimes 8}$, and then the remaining three stabilizer generators—six syndrome measurements total—and this will suffice for fault-tolerant error correction. Indeed, with perfect syndrome measurement the $Z^{\otimes 8}$, $X^{\otimes 8}$ measurements suffice to identify the type X, Y or Z of any one-qubit error, and the last three stabilizer generators localize the error. For fault-tolerant syndrome measurement, one can measure $Z^{\otimes 8}$ a second time in order to handle the case of a Y fault occurring after the first $Z^{\otimes 8}$ measurement. No other syndrome suffixes can be problematic; a fault occurring after the three transversal stabilizer measurements will not trigger any of them and therefore cannot be confused with an input error.

Furthermore, with this [[8, 3, 3]] code, should the experimental hardware support adaptive stabilizer measurements, one can first measure just $Z^{\otimes 8}$ and $X^{\otimes 8}$, and then only if one or both are nontrivial continue on to measure $Z^{\otimes 8}$ and the last three stabilizer generators. The first two measurements suffice to detect any one-qubit input error.

For the [4, 1, 4] repetition code, one could similarly imagine measuring the three parity checks in order 1111, 0011, 0101. This already suffices for fault-tolerant error correction, because an interior fault could not trigger the first parity check and therefore could not be confused with an input error. With adaptive control, the last two checks need only be measured should the first parity be odd. This observation is not immediately interesting because the code is classical. One can generalize it to a family of quantum codes below.

Finally, the [[8, 2, 3]] code above is also similar to the [[8, 3, 3]] code. For fault-tolerant error correction one can measure the stabilizers

Z Z Z Z I I I I, X X X X I I I I, Z Z Z Z I I I I, then I I I I Z Z Z Z, I I I I X X X X, I I I I Z Z Z Z, and then the last three stabilizer generators. Stabilizers supported on the first four qubits can potentially be measured in parallel to the stabilizers on the last four qubits. With adaptive control, if the results of measuring Z Z Z Z I I I I, X X X X I I I I and I I I I Z Z Z Z, I I I I X X X X are trivial, then further syndromes need not be measured.

B. 4.7.2. Generalized Codes

Next, the above base codes are generalized in order to develop families of distance-three quantum error-correcting codes with fault-tolerant error-correction procedures that are efficient, in the sense of requiring few syndrome measurements.

1. 4.7.2.1. Generalizing the [4,1,4] Classical Repetition Code

Let one start by extending the [4, 1, 4] classical repetition code: the procedures for generalizing the other codes will be quite similar.

Consider the following two parity-check matrices on 16 and 24 bits, respectively:

```
1 1 1 1 . . . . . . . . . . . .
. . . . 1 1 1 1 . . . . . . . .
. . . . . . . . 1 1 1 1 . . . .
. . . . . . . . . . . . 1 1 1 1
. . 1 1 . . 1 1 . . 1 1 . . 1 1
. 1 . 1 . 1 . 1 . 1 . 1 . 1 . 1

1 1 1 1 . . . . . . . . . . . . . . . . . . . .
. . . . 1 1 1 1 . . . . . . . . . . . . . . . .
. . . . . . . . 1 1 1 1 . . . . . . . . . . . .
. . . . . . . . . . . . 1 1 1 1 . . . . . . . .
. . . . . . . . . . . . . . . . 1 1 1 1 . . . .
. . . . . . . . . . . . . . . . . . . . 1 1 1 1
. . 1 1 . . 1 1 . . 1 1 . . 1 1 . . 1 1 . . 1 1
. 1 . 1 . 1 . 1 . 1 . 1 . 1 . 1 . 1 . 1 . 1 . 1
```

One can write • in place of 0 to draw attention to the structure. The bits are divided into blocks of four, with 1111 parity checks, and the last two parity checks have the same form, 0011 or 0101, on each block.

The above parity checks define self-orthogonal [16, 10, 4] and [24, 16, 4] classical linear codes. By the CSS construction, using the same parity checks in both the Z and X bases, they induce [[16, 4, 4]] and [[24, 8, 4]] self-dual quantum stabilizer codes. The codes can be extended by adding eight qubits at a time, two blocks of four. (Adding just a single block of four would break the self-orthogonality property.) For $r \geq 2$, this defines [[8r, 4(r−1), 4]] self-dual CSS codes. For example, the next in the family is [[32, 12, 4]].

These codes are potentially of interest for a variety of reasons, e.g., the [[16, 4, 4]] code isn't too far off in terms of rate from the perfect CSS [[15, 7, 3]] Hamming code, yet it has higher distance and weight-four logical operators $\bar{Z}_1$, $\bar{X}_1$, $\bar{Z}_2$, $\bar{X}_2$.

They are of interest because they allow for distance-three fault-tolerant error correction with single-shot stabilizer measurements. Similar as for the [4, 1, 4] classical code described above, it suffices to measure the $Z^{\otimes 4}$ and $X^{\otimes 4}$ stabilizers on each block, and then (if some block's syndrome measurements are nontrivial) measure the last two parity checks in the Z and/or X bases: $(I\,I\,Z\,Z)^{\otimes r}$, $(I\,Z\,I\,Z)^{\otimes r}$, $(I\,I\,X\,X)^{\otimes r}$, $(I\,X\,I\,X)^{\otimes r}$. No redundant syndrome information needs to be measured for distance-three fault-tolerant error correction. An X fault, for example, occurring in a block after the Z Z Z Z measurement necessarily leads to a syndrome different from that caused by any weight-one X input error (which always triggers some Z Z Z Z syndrome).

Theorem 7. Each code in this family of [[8r,4(r−1),4]] self-dual CSS codes, for $r \geq 2$, allows for distance-three fault-tolerant error correction with a single measurement of each of the specified stabilizer generators.

Observe that measurements on different blocks of four qubits can be implemented in parallel. Thus while 4(r+1) syndrome measurements are needed (12 measurements for the [[16, 4, 4]] code, most comparable to the [[15, 7, 3]] Hamming code), these measurements can be implemented in only six rounds.

Distance-three fault-tolerant error correction can handle up to one input error or internal fault. Although the codes have distance four, the above single-shot error-correction procedure is not fault tolerant to distance four. For example, with the [[16, 4, 4]] code, an input $X_2$ error and an $X_6$ fault after the first round of Z syndrome measurements gives the same syndrome (100000) as an input $X_1$ error. With this correction applied, $X_1 X_2 X_6$ is equivalent to a logical error times $X_5$. For distance-four fault tolerance, it suffices to measure the four-qubit block stabilizers a second time at the end. This then takes eight rounds of syndrome measurements.

2. 4.7.2.2. Generalizing the [8, 4, 4] and [16, 11, 4] Classical Codes

The above procedure defined a family of quantum error-correcting codes based on the classical [4, 1, 4] code. One can similarly define families of quantum codes with blocks of size 8, 16, or larger powers of two.

Start, for example, with the following codes on blocks of size 8 and 16:

[8, 4, 4] code
```
1 1 1 1 1 1 1 1
0 0 0 0 1 1 1 1
0 0 1 1 0 0 1 1
0 1 0 1 0 1 0 1
```

[16, 11, 4] code
```
1 1 1 1 1 1 1 1 1 1 1 1 1 1 1 1
. . . . . . . . 1 1 1 1 1 1 1 1
. . . . 1 1 1 1 . . . . 1 1 1 1
. . 1 1 . . 1 1 . . 1 1 . . 1 1
. 1 . 1 . 1 . 1 . 1 . 1 . 1 . 1
```

The first, [8, 4, 4], code can be used to define a family of [[8r, 6(r−1), 4]] self-dual CSS quantum codes, for r≥2, by putting a separate copy of the first parity check 11111111 on each block of eight qubits (in both Z and X bases), while copying the other three parity checks across to be the same on each block. For example, the [[16, 6, 4]] code's Z and X basis parity checks are each

```
1 1 1 1 1 1 1 1 0 0 0 0 0 0 0 0

0 0 0 0 0 0 0 0 1 1 1 1 1 1 1 1

0 0 0 0 1 1 1 1 0 0 0 0 1 1 1 1

0 0 1 1 0 0 1 1 0 0 1 1 0 0 1 1

0 1 0 1 0 1 0 1 0 1 0 1 0 1 0 1
```

The [16, 11, 4] code above can similarly be used to define a family of [[16r, 6+14(r−1), 4]] self-dual CSS codes, for r≥1, by putting a $1^{16}$ parity check on each block of 16 qubits, while copying the other four parity checks across each block.

Both of these families of codes allow for single-shot distance-three fault-tolerant error correction. By measuring disjoint qubit blocks in parallel, only eight measurement rounds are needed for the [[8r, 6(r−1), 4]] codes, and ten measurement rounds for the [[16r, 6+14(r−1), 4]] codes.

Some particularly interesting codes in these families are [[16, 6, 4]], [[24, 12, 8]] and [[32, 20, 4]]. They can be compared to the [[15, 7, 3]] and [[31, 21, 3]] Hamming codes. The rates are similar, but the new codes have a higher distance and allow for significantly faster fault-tolerant error correction. The stabilizers measured have the same weights as those of the closest Hamming codes: weight-8 stabilizers for the [[16, 6, 4]] code, weights 8 or 12 stabilizers for the [[24, 12, 4]] code, and weight-16 stabilizers for the [[32, 20, 4]] code.

3. 4.7.2.3. Generalizing the [[8, 2, 3]] and [[8, 3, 3]] Codes

Similar to how the [4, 1, 4], [8, 4, 4] and [16, 11, 4] codes were extended by adding on more blocks, the [[8, 2, 3]] and [[8, 3, 3]] codes of Eq. (22) can be extended. By adding either two blocks of four qubits to the former code, or one block of eight qubits to the latter code, one can obtain 16-qubit codes, with respective stabilizers:

[[16,6,3]] code
```
Z Z Z Z I I I I I I I I I I I I
X X X X I I I I I I I I I I I I
I I I I Z Z Z Z I I I I I I I I
I I I I X X X X I I I I I I I I
I I I I I I I I Z Z Z Z I I I I
I I I I I I I I X X X X I I I I
I I I I I I I I I I I I Z Z Z Z
I I I I I I I I I I I I X X X X
I X Y Z I X Y Z I X Y Z I X Y Z
I Z X Y I Z X Y I Z X Y I Z X Y
```

[[16,9,3]] code
```
Z Z Z Z Z Z Z Z I I I I I I I I
X X X X X X X X I I I I I I I I
I I I I I I I I Z Z Z Z Z Z Z Z
I I I I I I I I X X X X X X X X
I I Z Y X Z Y X I I Z Y X Z Y X
I Z X I X Y Z Y I Z X I X Y Z Y
I X I Z Z X Y Y I X I Z Z X Y Y
```

By adding more blocks, these procedures yield families of [[8r,2+4(r−1), 3]] and [[8r, 3+6(r−1), 3]] codes, respectively. While the second code family has higher rate, its stabilizers also have higher weight. This tradeoff can be continued by applying the extension procedure to the other [[$2^r$, $2^r$−r−2, 3]] codes defined by Gottesman (see Daniel Gottesman, "Class of quantum error-correcting codes saturating the quantum Hamming bound," Phys. Rev. A, 54(3):1862, 1996, doi:10.1103/PhysRevA.54.1862, arXiv:quant-ph/9604038.)

These codes do not allow for single-shot fault-tolerant error correction. However, they require only one round of measuring redundant syndromes, in parallel. After measuring the Z and X parity checks on each block of four or eight qubits, one can measure the Z parity checks a second time. Then finally measure the syndromes for the block-crossing stabilizers. This procedure is fault tolerant for essentially the same reason that it works for the [[8,3,3]] code, described above. (Faults occurring after the block stabilizer measurements will not trigger any of them, and therefore cannot be confused with an input error.) One can conclude:

Theorem 8. For each of these [[8r, 2+4(r−1), 3]] and [[8r, 3+6(r−1), 3]] codes, fault-tolerant error correction is possible with five or sir rounds, respectively, of syndrome measurements.

4.8. Error Correction for Higher-Distance Codes

So far, the examples and general constructions have been for distance-three codes. In this section, several distance-five and -seven CSS codes will be considered, and non-adaptive fault-tolerant syndrome measurement sequences that suffice for fault-tolerant error correction presented for them.

4.8.1. [[17, 1, 5]] Color Code

Begin by considering the [[17, 1, 5]] color code illustrated in

Fault-tolerant Z error correction can be accomplished with nine rounds of fault-tolerantly measuring X plaquette stabilizers, 20 syndrome measurements total, in the following order: Here, the plaquette stabilizers that should be measured in each round are highlighted.

There could well be more-efficient syndrome measurement sequences. The fault tolerance of this one has been verified by a computer enumeration over all possible combinations of up to two input errors or internal faults.

Topological codes like the color and surface codes have the advantage that their natural stabilizer generators are geometrically local for qubits embedded in a two-dimensional surface. For error correction, it may therefore be preferable to measure a sequence of only these stabilizer generators, and not measure any nontrivial linear combination of generators. The above measurement sequence satisfies this property, while the measurement sequence for the [[16, 4, 4]] color code, in Sec., does not.

FIG. 17 is a schematic block diagram 1700 showing hexagonal color codes for the color code referenced above.

4.8.2. [[25, 1, 5]] Surface Code

For odd d≥3, there are $[[d^2, 1, d]]$ surface codes, illustrated in FIG. 18 for d=3 and d=5:

In particular, FIG. 18 illustrates examples 1800, 1810 of such surface codes. In particular, In 1800 and 1810, the qubits are placed at the vertices. Red (darker) plaquettes correspond to Z stabilizers on the involved qubits, and green (lighter) plaquettes to X stabilizers. (The codes are CSS, but not self dual.)

For the [[9, 1, 3]] code, six syndrome measurements, applied in three rounds, suffice for fault-tolerant X error correction, as shown in schematic block diagram 1900 of FIG. 19.

A symmetrical sequence works for Z error correction.

For the [[25, 1, 5]] code, 30 Z measurements, applied in five rounds, suffice for distance-five fault-tolerant X error correction, as shown in schematic block diagram of FIG. 20.

4.9. [[31, 11, 5]] BCH Code

The [[31, 11, 5]] BCH code is a self-dual CSS code whose Z and X stabilizer groups are both generated by 1 0 0 0 0 0 0 0 0 1 1 0 1 0 1 0 1 1 1 1 0 0 1 0 0 1 0 1 0 0 and its cyclic permutations, 10 generators for each group. (This presentation can be recovered in the Magma computer algebra program with the commands "C:=BCHCode(GF(2), 31, 5); ParityCheckMatrix(C)".)

Distance-five fault-tolerant X error correction can be done by measuring this stabilizer generator and its next 26 right cyclic permutations—27 measurements total. (This is not optimal, however, as one has also found working sequences of 26 measurements.)

4.10. [[23, 1, 7]] Golay Code

The Golay code is a self-dual CSS code whose Z and X stabilizer groups are both generated by 1 0 0 0 0 0 0 0 0 0 1 1 1 1 1 0 0 1 0 0 1 0 and its cyclic permutations, 11 generators for each group.

Measuring the syndrome of this stabilizer generator and its next 29 right cyclic permutations—30 measurements total—is sufficient for distance-seven fault-tolerant X error correction.

(For a [[21, 3, 5]] punctured Golay code, one has also verified that 22 stabilizer measurements suffice for distance-five fault-tolerant X error correction.)

4.11. Logical Measurement

Adaptive and non-adaptive fault-tolerant syndrome measurement sequences that allow for fault-tolerant error correction have been considered. In a fault-tolerant quantum computer, however, one also needs fault-tolerant implementations of logical operations, the simplest being logical measurement.

Fault-tolerant logical measurement is not so simple as measuring a logical operator, or even doing so repeatedly. For example, with the [[7, 1, 3]] Steane code, $Z_1Z_2Z_3$ is a logical Z operator, but if you use it to measure a codeword with an $X_1$ error, you will get the wrong answer every time. Instead, different logical operators need to be measured to implement a fault-tolerant logical Z measurement. Two good measurement sequences are given below:

```
. . 1 1 . . 1    . 1 . . 1 . 1
1 1 1 . . . .    1 1 1 . . . .
1 . . 1 1 . .    1 . . 1 1 . .
1 . . . . 1 1    1 . . . . 1 1
. 1 . 1 . 1 .    1 . 1 . 1 . 1
```

The measurement sequences above show a fault-tolerant logical measurement for the [[7, 1, 3]] code can be implemented with either of these measurement sequences. The first sequence measures five equivalent logical operators, while the second measures four logical operators and a code stabilizer. Both sequences also work for fault-tolerant error correction.

In this section, measurement sequences are studied that allow for fault-tolerant logical measurements. The focus will be on the [[15, 7, 3]] and [[16.6, 4]] codes introduced earlier, because of their practical interest. The codes also have a rich group of qubit permutation automorphisms that simplifies a case-by-case consideration of the many different logical operators. For example, with six encoded qubits, the [[16, 6, 4]] code has $2^6-1$ nontrivial logical Z operators that one might wish to measure—but one will see below that up to code-preserving qubit permutations there are only two equivalence classes of logical Z operators.

Measurement sequences are also studied that allow for fault-tolerant logical measurements combined with fault-tolerant error correction. One can potentially do both together faster than running logical measurement and error correction in sequence. Logical measurements across multiple code blocks will be considered, e.g., measuring $\bar{Z}_1 \otimes \bar{Z}_1$ on two [[15, 7, 3]] code blocks. Finally, combining multiple logical measurements will be considered, e.g., measuring $\bar{Z}_1$ and $\bar{Z}_2$ together faster than measuring them separately in sequence.

4.11.1. Logical Operators and Permutation Automorphisms

```
[[[15, 7, 3]] code]  Z₁, X̄₁ : 1 1 . 1 . . . . 1 . . . . . . 1
                     Z₂, X̄₂ : 1 1 . . 1 . . . . 1 . 1 . . .
                     Z₃, X̄₃ : 1 1 . . . 1 . . . . 1 . . 1 .
                     Z₄, X̄₄ : 1 1 . . . . 1 . 1 . . . . 1 . .
                     Z₅, X̄₅ : 1 . . 1 . 1 . . 1 1 . . . . .
                     Z₆, X̄₆ : 1 . . 1 . . 1 . . . . . 1 . 1 .
                     Z₇, X̄₇ : 1 . . . . . . 1 . 1 . . 1 1 .

[[[16, 6, 4]] code]  Z₁, X̄₂ : 1 1 1 1 . . . . . . . . . . . .
                     Z₂, X̄₁ : 1 . . . 1 . . . 1 . . . 1 . . .
                     Z₃, X̄₄ : 1 1 . . 1 1 . . . . . . . . . .
                     Z₄, X̄₃ : 1 . 1 . . . . . 1 . 1 . . . . .
                     Z₅, X̄₆ : 1 1 . . 1 1 . . . . . . . . . .
                     Z₆, X̄₅ : 1 . 1 . 1 . 1 . . . . . . . . .
```

The table above shows possible bases for the logical qubits for the (a) [[15, 7, 3]] and (b) [[16, 6, 4]] codes. (To explain the notation, for example in (b), $\bar{Z}_1 = Z^{\otimes 4} \otimes I^{\otimes 12}$ and $\bar{X}_2 = X^{\otimes 4} \otimes I^{\otimes 12}$.) There are other bases that might be useful, for example for the [[15, 7.3]] code one can choose a basis with six weight-four operators that also work for the unpunctured 16-qubit code, and one weight-seven operator. In the basis shown here, the operators have weight five and are self-dual, so transversal Hadamard implements logical transversal Hadamard.

Bases for the encoded qubits for the [[15, 7, 3]] and [[16, 6, 4]] codes are given in FIG. B 3. These bases are only for reference, as the details are not important here.

The weight of a logical operator $\bar{P}$ is the least Hamming weight of any stabilizer-equivalent operator. The weight distributions of the two codes' Z or X logical operators are given in the table below

|  | Weight | # Operators |
|---|---|---|
| [[[15, 7, 3]] code] | 0 | 1 |
|  | 3 | 35 |
|  | 4 | 35 |
|  | 5 | 28 |
|  | 6 | 28 |
|  | 7 | 1 |
| [[[16, 6, 4]] code] | 0 | 1 |
|  | 4 | 35 |
|  | 6 | 28 |

The table above shows distributions of weights of the Z or X logical operators for the [[15, 7, 3]] and [[16, 6, 4]] codes.

The permutation automorphism group of a code is the set of qubit permutations that preserve the codespace. The permutation automorphism group of the [[15, 7, 3]] code has order 20,160, and is isomorphic to $A_8$ and GL(4, 2). It is generated by:

(1, 2, 3)(4, 14, 10)(5, 12, 9)(6, 13, 11)(7, 15, 8)
(1, 10, 5, 2, 12)(3, 6, 4, 8, 9)(7, 14, 13, 11, 15)
(1, 10, 15, 3, 8, 13)(4, 6)(5, 12, 11)(7, 14, 9)

Where the Magma commands to find the automorphism group are "C:=LinearCodeGF⟨(2),15|[0,0,0,0,0,0,0,1,1,1,1, 1,1,1,1], [0,0,0,1,1,1,1,0,0,0,0,1,1,1,1], [0,1,1,0,0,1,1,0,0,1, 1,0,0,1,1],[1,0,1,0,1,0,1,0,1,0,1,0,1,0,1]⟩; Automorphism-Group(C);".

The permutation automorphism group of the [[16, 6, 4]] has order 322,560, and is generated by the permutations (1, 2)(3, 4)(5, 6)(7, 8)(9, 10)(11, 12)(13, 14)(15, 16)
(1, 2, 4, 8, 16, 15, 13, 9)(3, 6, 12, 7, 14, 11, 5, 10)
(9, 10)(11, 12)(13, 14)(15, 16)

A subgroup of order 16 acts trivially, with no logical effect. (The first permutation above, e.g., has no logical effect.)

A large permutation automorphism group allows for a rich set of logical operations to be applied by simply permuting the physical qubits, or perhaps just by relabeling them. That is not the concern here. Instead, observe:

For both codes, any two logical operators with the same weight are related by a qubit permutation in the automorphism group.

(Logical operators with different weights of course cannot be related by a permutation automorphism.)

Therefore, up to permutation automorphisms, there are five equivalence classes of nontrivial logical operators for the [[15, 7, 3]] code, and just two equivalence classes for the [[16, 6, 4]] code. This greatly simplifies the problem of specifying sequences for measuring logical operators fault tolerantly. It is sufficient to find a sequence that works for one logical operator in each weight equivalence class: then for any logical operator of the same weight, a working measurement sequence can be obtained by applying the appropriate qubit permutation.

4.12. [[15, 7, 3]] Code: Measurement and Error Correction

Every logical operator can be fault-tolerantly measured using at most six fault-tolerant syndrome measurements. For weight-four and weight-five logical operators, three and five measurements suffice, respectively; see the two tables below:

|  | Weight | # Measurements for logical measurement | # Measurements for logical measurement and X error correction |
|---|---|---|---|
| [[[15, 7, 3]] code] | 3 | 6 | 7 |
|  | 4 | 3 | 7 |
|  | 5 | 5 | 6 |
|  | 6 | 6 | 7 |
|  | 7 | 6 | 7 |
| [[[16, 6, 4]] code] | 4 | 3 | 6 |
|  | 6 | 6 | 6 |

For each weight, the tables above give a number of measurements sufficient for fault-tolerantly measuring a logical operator of that weight. For example, Eq. (23) gives three measurements that suffice for measuring a weight-four logical operator. The tables also give a sufficient number of measurement sufficient both for measuring a Z logical operator and carrying out X error correction. As X error correction on its own needs seven Z measurements for the [[15, 7, 3]] code, or five measurements for the [[16, 6, 4]] code, there are substantial savings from combining logical measurement with error correction.

Certainly, three measurements are needed for a fault-tolerant logical measurement. With two or fewer measurements, a single measurement fault would not be correctable. For measuring weight-four logical operators, three measurements suffice, because every such operator has three representatives with disjoint supports. For example, these three logical operators are equivalent up to stabilizers:

$$\begin{matrix} \ldots\ 1\ 1\ 1\ 1\ \ldots\ \ldots\ \ldots\ \ldots \\ \ldots\ \ldots\ \ldots\ 1\ 1\ 1\ 1\ \ldots\ \ldots\ \ldots \\ \ldots\ \ldots\ \ldots\ \ldots\ \ldots\ 1\ 1\ 1\ 1 \end{matrix} \quad (23)$$

A single error on the input, or a single fault during the measurements, can flip at most one of the three outcomes, so the majority will still be correct.

The following sequence of measurements works for a weight-three logical operator. Here the first three measurements are of equivalent logical operators, and the last three are of stabilizers. (It is also possible to use six logical operator measurements, and in fact that can give a lower total weight, 38 instead of 41.)

$$\begin{matrix} & 1\ 1\ 1\ \ldots\ \ldots\ \ldots\ \ldots\ \ldots\ \ldots \\ \text{logical} & \{1\ \ldots\ 1\ 1\ \ldots\ \ldots\ 1\ 1\ \ldots\ \ldots\ 1\ 1 \\ \text{operators} & \{\ldots\ 1\ \ldots\ 1\ \ldots\ 1\ \ldots\ 1\ \ldots\ 1\ \ldots\ 1\ \ldots\ 1 \\ \text{stablizers} & \{1\ \ldots\ 1\ \ldots\ 1\ \ldots\ 1\ \ldots\ 1\ \ldots\ 1\ \ldots\ 1\ \ldots\ 1 \\ & \{\ldots\ 1\ 1\ 1\ 1\ \ldots\ \ldots\ 1\ 1\ \ldots\ \ldots\ \ldots\ 1\ 1 \\ & \ldots\ \ldots\ \ldots\ \ldots\ 1\ 1\ 1\ 1\ 1\ 1\ 1\ 1 \end{matrix}$$

Why are the last three measurements necessary? If one only made the first three measurements, of equivalent logical operators, then without any errors logical 0 would result in measurement outcomes 000 and logical 1 in outcomes 111. However, with a input error on the last qubit, logical 0 would result in measurement outcomes 011, which cannot be distinguished from logical 1 with an erroneous first measurement. With the last three stabilizer measurements, ideally the measurement outcomes will be either 000000, for logical 0, or 111000, for logical 1. One can check that no two faults, either on the input or during the measurements, can flip 000000 to 111000, and hence logical 0 and logical 1 will be distinguishable even if there is up to one fault.

With the aid of a computer to verify fault tolerance, measurement sequences for logical operators of weights five, six or seven can be similarly found.

Given that one has to make multiple measurements in order to measure a logical operator fault tolerantly, it makes sense to use the extracted information not just for determining the logical outcome, but also for correcting errors. Can one combine measurement of a logical Z operator with X error correction, faster than running them sequentially? Yes.

As listed in the table above showing distributions of weights of the Z or X logical operators for the [[15, 7, 3]] and [[16, 6, 4]] codes, in fact for any logical operator seven Z measurements suffice for logical measurement and X error correction together. For a weight-five logical operator, just six Z measurements suffice:

$$\begin{matrix} 1\ 1\ \ldots\ \ldots\ 1\ \ldots\ \ldots\ 1\ \ldots\ \ldots\ \ldots\ 1 \\ \ldots\ \ldots\ \ldots\ 1\ \ldots\ \ldots\ 1\ \ldots\ \ldots\ 1\ 1\ 1 \\ \ldots\ \ldots\ \ldots\ 1\ \ldots\ 1\ \ldots\ 1\ 1\ 1\ \ldots\ \ldots\ \ldots \\ 1\ \ldots\ 1\ \ldots\ \ldots\ 1\ \ldots\ \ldots\ 1\ \ldots\ \ldots\ 1\ \ldots \\ \ldots\ 1\ 1\ 1\ \ldots\ \ldots\ \ldots\ 1\ \ldots\ \ldots\ \ldots\ \ldots\ 1\ \ldots\ \ldots \\ \ldots\ \ldots\ \ldots\ 1\ \ldots\ 1\ 1\ \ldots\ 1\ \ldots\ \ldots\ 1\ \ldots\ \ldots\ \ldots \end{matrix}$$

This measurement sequence, of six equivalent weight-five operators, satisfies that no two input or internal faults can flip the ideal syndrome for logical 0, $0^6$, to the ideal syndrome for logical 1, $1^6$. Therefore with at most one fault, logical 0 can be distinguished from logical 1. Then, the differences from the ideal syndromes can be used to diagnose and safely correct input errors.

Recall from Theorem 4 that X error correction on its own uses seven non-adaptive Z syndrome measurements. Thus by combining the Z measurement steps, 6+7=13 measurements suffice for a weight-five logical measurement and full error correction, versus 5+7+7=19 steps for running error correction separately.

4.12.2. [[16, 6, 4]] Code: Measurement and Error Correction

From the table above showing distributions of weights of the Z or X logical operators for the [[15, 7, 3]] and [[16, 6, 4]] codes, there are two weight equivalence classes of nontrivial logical operators, weight-four and weight-six operators.

Although the [[16, 6, 4]] code has distance four, one can consider fault tolerance only to distance three, i.e., tolerating up to one input error or internal fault.

Any weight-four operator can be measured fault tolerantly in three steps, just as in Eq. (23). (Adding an initial qubit makes the operators in (23) valid logical operators for the [[16, 6, 4]] code.)

For logical operators of weight four, six measurement steps suffice for combined logical Z measurement and X error correction:

```
                1 1 1 1 . . . . . . . . . . . .
logical    ⎧ . . . . 1 1 1 1 . . . . . . . .
operators  ⎨ . . . . . . . . 1 1 1 1 . . . .
           ⎩ . . . . . . . . . . . . 1 1 1 1 stablizers{. . 1 1 . . 1 1 . . 1 1 . . 1 1

. 1 . 1 . 1 . 1 . 1 . 1 . 1 . 1
```

(Measuring the four disjoint, equivalent logical operators suffices for fault-tolerant logical measurement. For error correction, a logical operator measurement different from the others identifies which block of four qubits an input error occurred on, and the two stabilizer measurements then fully localize the error.)

For logical operators of weight six, too, six steps suffice:

```
           1 1 . . . . . . . . 1 1 . 1 . 1 .
logical    ⎧ . . 1 1 1 1 1 1 1 . . 1 . 1 . 1
operators  ⎨ . . . . . . 1 1 . 1 . 1 . 1 1 .
           ⎩ . . . . . . 1 1 1 . 1 . 1 1 1 1 stablizers{. . 1 1 . . 1 1 . . 1 1 . . 1 1

. 1 . 1 . 1 . 1 . 1 . 1 . 1 . 1
```

Recall that five Z stabilizer measurements suffice for distance-three fault-tolerant X error correction. Combining a logical Z measurement with X error correction thus costs only one more measurement.

4.13. Measuring Logical Operators Across Multiple Code Blocks

From the above analysis, one can now implement (distance-three) X error correction combined with fault-tolerant measurement of any logical Z operator, for the [[15, 7, 3]] and codes. However, what if one wants to measure a logical Z operator across multiple code blocks, for example, $\bar{Z}_1 \otimes \bar{Z}_2$ on two code blocks, or perhaps $\bar{Z}_1 \otimes \bar{Z}_2 \otimes (\bar{Z}_3 \bar{Z}_4 \bar{Z}_5 \bar{Z}_6 \bar{Z}_7)$ on three code blocks?

Distance-three fault tolerance for a multi-block logical Z operator requires the same condition needed for a single-block logical Z operator: no two faults should be able to flip the all-zeros syndrome to the all-ones syndrome. With this condition, logical 0 and 1 can be distinguished even with up to one input error or internal fault, across all the involved code blocks. In general, one has to search to find working measurement sequences.

Fortunately, in many cases one can use the measurement sequences found already. For measuring $\bar{Z}_a \otimes \bar{Z}_b \otimes \ldots$, if the individual logical operators $\bar{Z}_a$, $\bar{Z}_b$, ... are related by a permutation automorphism, and therefore working measurement sequences for $\bar{Z}_a$, $\bar{Z}_b$, ... differ only by a qubit permutation, then these sequences can be combined into a sequence for measuring $\bar{Z}_a \otimes \bar{Z}_b \otimes \ldots$ For example, for the [[7, 1, 3]] code, place two copies of the measurement sequence from the table above showing the [7, 1, 3] code side-by-side, in order to obtain a sequence of five equivalent $\bar{Z} \otimes \bar{Z}$ operators:

```
        block 1            block 2
      . . 1 1 . . 1   . . 1 1 . . 1
      1 1 1 . . . .   1 1 1 . . . .
      1 . . 1 1 . .   1 . . 1 1 . .
      1 . . . . 1 1   1 . . . . 1 1
      . 1 . 1 . 1 . . . 1 . 1 . 1 .
```

This is a fault-tolerant $\bar{Z} \otimes \bar{Z}$ measurement sequence. Indeed, the syndrome errors that can be caused by a single fault in block 1 (e.g., 01110 from an $X_1$ input error) are the same as those that a single fault in block 2 can cause. The fault-tolerance condition for one block implies that no two faults can flip syndrome $0^5$ to $1^5$.

One can therefore obtain fault-tolerant sequences for measuring $\bar{Z}_a \otimes \bar{Z}_b \otimes \ldots$, provided that each operator lies in the same permutation equivalence class; for the [[15, 7, 3]] and [[16, 6, 4]] codes, this means that they have the same weight as the table above showing distributions of weights of the Z or X logical operators for the [[15; 7; 3]] and [[16; 6; 4]] codes.

If $\bar{Z}_a$ and $\bar{Z}_b$ have different weights, then more work is required to find a fault-tolerant measurement sequence for $\bar{Z}_a \otimes \bar{Z}_b$, because single faults in a $\bar{Z}_a$ measurement sequence have different syndrome effects than single faults in a $\bar{Z}_b$ measurement sequence.

14.13.1. Further Problems for Logical Measurement

There are further logical measurement problems, with practical utility depending on the application.

For example, one problem is to measure multiple logical operators in parallel, possibly combined with error correction. With the [[16, 6, 4]] code, e.g., say one wants to measure $\bar{Z}_1$ and $\bar{Z}_3$, from the [16, 6, 4] basis presented above. As both operators have weight four, one can measure them both separately in 3+3=6 steps, or one can measure them both separately, with one logical measurement combined with error correction, in 3+6=9 steps. However, one can fault-tolerantly measure them together, with error correction, in seven steps, as follows:

```
              1 1 1 1 . . . . . . . . . . . .
       ⎧ . . . . 1 1 1 1 . . . . . . . .
Z̄₁    ⎨ . . . . . . . . 1 1 . . 1 1 . .
       ⎩
Z̄₃    { . . . . . . . . . . 1 1 . . 1 1
Z̄₁Z̄₃  { . . 1 1 1 1 . . . . . . . . . .

stablizers{. . 1 1 1 1 . . . . 1 1 1 1 . .

. 1 . 1 . 1 . 1 . 1 . 1 . 1 . 1
```

Essentially, instead of using separate [3, 1, 3] classical repetition codes, in the first five steps, the [5, 2, 3] classical code that encodes syndrome $(z_1, z_3)$ is used as $(z_1, z_1, z_3, z_3, z_1 \otimes z_3)$.

In Sec. B 3 above, sequences for measuring $\bar{Z}_a \otimes \bar{Z}_b$ across two code blocks were presented. What about combining the logical measurement with error correction, on two code blocks? To consider this problem, one has to choose a suitable definition for fault tolerance. Should a two-block error-correction procedure tolerate up to one input error or one internal fault total, across both blocks? Or should it tolerate up to one input error or one internal fault on each block, so up to two faults total? Or should it tolerate up to one input error on each block, and one internal fault total? All these choices are possible, but tolerating more faults will generally require longer measurement sequences.

14.14. Brief Conclusion

Non-adaptive, Shor-style syndrome extraction is a limited model for error correction. Nonetheless, the model allows for efficient error correction, via a properly designed syndrome-measurement sequence or even a code optimized for one-shot correction.

14.15. Other Measurement Models

In this disclosure, fault-tolerant error correction has been discussed by sequentially, and either non-adaptively or adaptively, measuring stabilizer syndromes fault tolerantly using cat states. Of course, this is not the only technique for fault-tolerant error correction. For example, Knill-style error correction works essentially by teleporting an encoded state through an encoded Bell state. Steane-style error correction, for CSS codes, uses transversal CNOT gates to/from encoded $|-\rangle/|0\rangle$ states. The advantage of these methods is that they extract multiple syndromes in parallel; but the disadvantage is that the required encoded ancilla states are more difficult to prepare fault tolerantly than cat states, and need more qubits.

However, there is room for variation even staying closer to the Shor-style error-correction framework, using cat states to measure single syndromes. Four variants are considered: syndrome extraction with flags to catch internal faults, partial parallel and parallel syndrome extraction, and non-adaptive flagged fault-tolerant syndrome extraction. Each technique is demonstrated on the [[7, 1, 3]] code.

14.15.1. Syndrome Extraction with Flagged Qubits

Recall from Eq. (17) that for the [[7, 1, 3]] Steane code, fault-tolerant X error correction can be accomplished by measuring a fixed sequence of five Z stabilizers. Consider instead measuring the following sequence of four stabilizers:

$$I\ I\ I\ Z\ Z\ Z\ Z \quad (24)$$
$$I\ Z\ Z\ I\ I\ Z\ Z$$
$$Z\ I\ Z\ I\ Z\ I\ Z$$
$$I\ Z\ Z\ Z\ Z\ I\ I$$

This is not enough for fault-tolerant error correction. As indicated in red, an internal error on qubit 7 after the second syndrome measurement generates the syndrome 0010, which is confused with an input error on qubit 1 (indicated in orange). This is the only bad internal error, however.

One way to fix this problem is to place a "flag" on qubit 7, as shown in FIG. 21. By temporarily coupling qubit 7 to another ancilla qubit, one can ensure that if between the second and third syndrome measurements an X fault occurs on qubit 7, it will be detected. Therefore this internal fault can be distinguished from an input error on qubit 1.

By placing a temporary "flag" on qubit 7 to catch the bad internal X fault, fault-tolerant X error correction for the [[7, 1, 3]] code can be implemented with four non-adaptive syndrome measurements, compared to five measurements in Eq. (17). Since this method requires one more ancilla qubit, it trades space for time.

This technique of adding flags to catch internal faults requires more qubits available for error correction: it trades space for time. It easily extends to other codes. First find all of the bad internal faults, then put flags around them. (It is simplest to use separate flags for all code qubits that need them. Using the same flag on multiple code qubits is not directly fault tolerant, because then a Z fault on the flag could spread back to more than one code qubit.)

14.15.2. Partial Parallel Syndrome Extraction

The bad internal fault in Eq. (24) can also be fixed by switching qubit 7's interactions with the cat states measuring the second and third syndromes, as shown in FIG. B 3. Then the possible syndromes from an internal fault on qubit 7 are 0100 and 0110, which are both okay. Again this technique trades space for time.

FIG. 22 is a schematic block diagram 2200 illustrating another way of implementing [[7, 1, 3]] code fault-tolerant X error correction with four non-adaptive syndrome measurements is to extract some syndromes in parallel, partially reordered. By extracting some syndromes in parallel, and partially reordering them, fault-tolerant X error correction for the code can be implemented with four non-adaptive syndrome measurements, compared to five measurements in Eq. (17).

14.15.3. Parallel Syndrome Extraction

Alternatively, the bad internal fault in Eq. (24) can be avoided entirely by measuring the second and third syndromes simultaneously, using a fault-tolerantly prepared six-qubit ancilla state, stabilized by $$I\ I\ Z\ Z\ Z\ Z$$
$$Z\ Z\ Z\ I\ I\ I$$
$$X\ X\ I\ I\ I\ I$$
$$I\ I\ X\ X\ I\ I$$
$$I\ I\ I\ I\ X\ X$$
$$X\ I\ X\ I\ X\ I$$

Since both syndromes are extracted simultaneously, an X fault on the data can flip both or neither, but unlike in (24) cannot go between them.

With the [[7, 1, 3]] code, all three Z syndromes can be simultaneously measured, Steane style, using a seven-qubit encoded $|+\rangle$ state. Measuring two at a time might be more useful for larger codes.

14.15.4. Non-Adaptive Flagged Fault-Tolerant Syndrome Extraction

Naively, measuring a weight-w stabilizer fault tolerantly requires a w-qubit cat state that has been prepared fault tolerantly. However, this is not necessarily the case. Methods of using cat states more efficiently have been developed.

Flag fault tolerance is a technique that uses just two ancilla qubits to measure a weight-w stabilizer, though it only works for certain codes. In the simplest form of flag fault tolerance, a syndrome is extracted all onto a single qubit, while an extra "flag" qubit is used to detect faults that could spread backwards into correlated data errors. For example, FIG. 23 shows a flagged circuit for measuring the syndrome of a weight-four Z stabilizer. A single Z fault can spread to a weight-two data error, but then will also be detected by the X basis measurement of the flag qubit, initialized as $|+\rangle$.

More specifically. FIG. 23 is a schematic block diagram 2300 showing a flagged circuit for measuring a weight-four Z stabilizer. A Z fault on the syndrome qubit, initialized to $|0\rangle$, can spread to a weight-two data error, but then will also be detected by the X basis measurement of the flag qubit.

For a distance-three CSS code, when the flag is triggered the possible Z errors spread back to the data are I I I I, Z I I I, I I Z Z and I I I Z. The error-correction schemes given in Christopher Chamberland and Michael E. Beverland, "Flag fault-tolerant error correction with arbitrary distance codes," Quantum, 2:53, 2018, doi:10.22331/q-2018-02-08-53, arXiv:1708.02246 [quant-ph] are adaptive: given that the flag was triggered, additional X syndrome measurements are made to distinguish these four possibilities.

FIG. 23 is a schematic block diagram 2300 showing a flagged circuit for measuring a weight-four Z stabilizer. A Z fault on the syndrome qubit, initialized to $|0\rangle$, can spread to a weight-two data error, but then will also be detected by the X basis measurement of the flag qubit.

However, flag fault-tolerant error correction can also be non-adaptive. For example, for the [[7, 1, 3]] code, consider the following sequence of ten stabilizer measurements:

$$I\ I\ I\ Z\ Z\ Z\ Z \quad (25)$$
$$I\ Z\ Z\ I\ I\ Z\ Z$$

$$\left.\begin{array}{ccccccc} Z & I & Z & I & Z & I & Z \\ I & I & I & X_1 & X_3 & X_2 & X_4 \\ I & X1 & X3 & I & I & X2 & X_4 \\ X^1 & I & X^2 & I_1 & X_3^3 & I_2 & X_4^4 \\ I & I^1 & I^3 & X & X & X^2 & X^4 \end{array}\right\} \text{measure with flags}$$

$$\left.\begin{array}{cccccc} I & X & X & I & I & X & X \end{array}\right\} \text{measure with cat states}$$

$$I\ I\ I\ Z\ Z\ Z\ Z$$
$$I\ Z\ Z\ I\ I\ Z\ Z$$

The first three Z stabilizer measurements can all be made using flags, because they are followed by a full round of X error correction. In fact, though, the five X stabilizer measurements can also be made using flags, provided that the interactions are made in the specified order, because the final two Z measurements are enough to diagnose the data error when a flag is triggered. (For example, should either of the I I I X X X X measurements be flagged, the possible errors $X_4$, $X_7$ and $X_5X_7$ are correctable using the final two Z measurements. Should the X I X I X I X measurement be flagged, the possible $X_1$ error is not detected, but this is okay for fault tolerance.) However, the last two Z measurements cannot be made using flags, because if a flag were triggered there would be no subsequent X measurements to diagnose the error.

It is important to develop error-correction schemes, non-adaptive or adaptive, that are both fast—requiring few rounds of interaction with the data—and efficient in the sense of using simple cat states or other efficiently prepared ancilla states. Combining flag fault tolerance with standard Shor-style syndrome extraction, as in Eq. (25), is a step in this direction, although its effectiveness will depend on implementation details such as geometric locality constraints.

5 Further Example Embodiments

FIG. 28 is a flow chart 2800 illustrating a method for managing quantum memory. The particular operations and sequence of operations should not be construed as limiting, as they can be performed alone or in any combination, subcombination, and/or sequence with one another. Additionally, the illustrated operations can be performed together with one or more other operations.

At 2810, a fault-tolerant error-correction scheme for a quantum computing device is generated. In this embodiment, the fault-tolerant error-correction scheme produces a sequence of parity measurements over a set of qubits in the quantum computing device.

At 2812, the fault-tolerant error-correction scheme is implemented in the quantum computing device.

At 2814, a look-up-table-based fault-tolerant decoder is run in a classical computing device. In some embodiments, the running of the look-up-table-based fault-tolerant decoder in a classical computing device is based on a binary tree with one or more leaf store corrections, thereby reducing memory requirements in the classical computing device.

At 2816, based on the measurement outcomes, an error-correction action is performed, either in hardware or in software.

In some implementations, the sequence of measured parity do not depend on an outcome of any previous measurement outcome. In certain implementations, the sequence of parity measurements is generated by a fault-tolerant measurement sequence generating algorithm performed by a classical computing device. In further implementations, the sequence of measured parity for Reed-Muller codes RM(m−2, m) consists of a sequence of m+1 measurements, where m is an integer value. In some implementations, the quantum computing device is a topologically protected quantum computing device. In certain implementations, the sequence of measured parity is based on the surface code and comprises rounds of surface code syndrome extraction on m plaquettes such that each extraction round uses only m/4 measurements per round, where m is an integer.

In some implementations, the code is a CSS code with X-type stabilizers S1, S2, . . . , Sr and the sequence measured is S1, S2, Sr followed by S1, S2, Sr−1 for distance-three fault tolerance. In other implementations, the code is a CSS code with X-type stabilizers S1, S2, Sr and the sequence measured is S1, S2, Sr if the outcomes are all zero and S1, S2, Sj, S1, S2, Sj−1, Sj−1, Sr−1 if the j-th outcome is the first non-zero outcome observed.

In certain implementations, a non-destructive fault-tolerant logical measurement is implemented simultaneously with fault-tolerant error correction. In some implementations, the sequence of parity measurements is non-adaptive. In other implementations, the sequence of parity measurements is adaptive.

FIG. 29 is a flow chart 2900 illustrating a method for managing quantum memory. The particular operations and sequence of operations should not be construed as limiting, as they can be performed alone or in any combination, subcombination, and/or sequence with one another. Additionally, the illustrated operations can be performed together with one or more other operations.

At 2910, a fault-tolerant error-correction scheme for implementation on a quantum computing device is generated. In this embodiment, the fault-tolerant error-correction scheme is configured to produce a plurality of cat states in a two-dimensional grid of qubits in the quantum computing device. At 2912, the fault-tolerant error-correction scheme is caused to be generated in a plurality of qubits of the quantum computing device. At 2914, one or more of the cat states are measured. At 2916, an error-correction action is performed.

In some implementations, the performing the error-correction action does not depend on an outcome of any previous measurement. In certain implementations, the fault-tolerant error-correction scheme requires at most $O((n-k)d)$ parity measurements or at most $O(d^{1+e})$ parity measurements.

In certain implementations, the method further comprises running a fault-tolerant decoder in a classical computing device, wherein the fault-decoder alternates between passive storage and round of error correction.

FIG. 30 is a flow chart 3000 illustrating another method for managing quantum memory. The particular operations and sequence of operations should not be construed as limiting, as they can be performed alone or in any combination, subcombination, and/or sequence with one another. Additionally, the illustrated operations can be performed together with one or more other operations.

At 3010, a fault-tolerant error-correction scheme is generated and implemented in a quantum computing device. In this embodiment, the fault-tolerant error-correction scheme produces a plurality of cat states in a grid of qubits in the quantum computing device.

At 3012, one or more cat states are measured.

At 3014, an error-correction action is caused to be performed on the quantum device (e.g., based on the measurements).

In some implementations, results of the measuring do not depend on an outcome of any previous measurement of the one or more of the cat states. In certain implementations, the fault-tolerant error-correction scheme requires at most $O((n-k)d)$ parity measurements or at most $O(d^{1+e})$ parity measurements. In further implementations, a look-up-table-based fault-tolerant decoder configured to alternate between passive storage and one or more rounds of error correction is run.

Another embodiment is a system, comprising a quantum computing device; and a classical computing device in communication with the quantum computing device, the classical computing device being programmed to generate and implement a fault-tolerant error-correction scheme in the quantum computing device, the fault-tolerant error-correction scheme producing a plurality of cat states in a grid of qubits in the quantum computing device.

In particular implementations, the classical computing device is further configured to measure one or more of the cat states. In certain implementations, a number of the measurements is reduced by 4 times fewer plaquette at each round of the measurements. In some implementations, the classical computing device is further configured to cause an error-correction action to be performed on the quantum computing device. In certain implementations, results of the measuring do not depend on an outcome of any previous measurement of the one or more of the cat states. In particular implementations, the fault-tolerant error-correction scheme requires at most $O((n-k)d)$ parity measurements or at most $O(d^{1+e})$ parity measurements. In some implementations, the classical computing device is further configured to run a look-up-table-based fault-tolerant decoder configured to alternate between passive storage and one or more rounds of error correction.

Any of the disclosed embodiments can be performed by one or more computer-readable media storing computer-executable instructions which when executed by a computer cause the computer to perform any of the disclosed methods.

Any of the disclosed embodiments can also be implemented in a system, comprising a quantum computing device; and a classical computer in communication with and configured to control the quantum computing device, wherein the quantum computing device and the classical computer collectively operate to perform any of the disclosed methods.

6 Example Computing Environments

FIG. 24 illustrates a generalized example of a suitable classical computing environment 2400 in which aspects of the described embodiments can be implemented. The computing environment 2400 is not intended to suggest any limitation as to the scope of use or functionality of the disclosed technology, as the techniques and tools described herein can be implemented in diverse general-purpose or special-purpose environments that have computing hardware.

With reference to FIG. 24, the computing environment 2400 includes at least one processing device 2410 and memory 2420. In FIG. 24, this most basic configuration 2430 is included within a dashed line. The processing device 2410 (e.g., a CPU or microprocessor) executes computer-executable instructions. In a multi-processing system, multiple processing devices execute computer-executable instructions to increase processing power. The memory 2420 may be volatile memory (e.g., registers, cache, RAM, DRAM, SRAM), non-volatile memory (e.g., ROM, EEPROM, flash memory), or some combination of the two. The memory 2420 stores software 2480 implementing tools for performing any of the disclosed techniques for operating a quantum computer as described herein. The memory 2420 can also store software 2480 for synthesizing, generating, or compiling quantum circuits for performing any of the disclosed techniques.

The computing environment can have additional features. For example, the computing environment 2400 includes storage 2440, one or more input devices 2450, one or more output devices 2460, and one or more communication connections 2470. An interconnection mechanism (not shown), such as a bus, controller, or network, interconnects the components of the computing environment 2400. Typically, operating system software (not shown) provides an operating environment for other software executing in the computing environment 2400, and coordinates activities of the components of the computing environment 2400.

The storage 2410 can be removable or non-removable, and includes one or more magnetic disks (e.g., hard drives), solid state drives (e.g., flash drives), magnetic tapes or cassettes, CD-ROMs. DVDs, or any other tangible non-volatile storage medium which can be used to store information and which can be accessed within the computing environment 2400. The storage 2440 can also store instructions for the software 2480 implementing any of the disclosed techniques. The storage 2440 can also store instructions for the software 2480 for generating and/or synthesizing any of the described techniques, systems, or quantum circuits.

The input device(s) 2450 can be a touch input device such as a keyboard, touchscreen, mouse, pen, trackball, a voice input device, a scanning device, or another device that provides input to the computing environment 2400. The output device(s) 2460 can be a display device (e.g., a computer monitor, laptop display, smartphone display, tablet display, netbook display, or touchscreen), printer, speaker, or another device that provides output from the computing environment 2400.

The communication connection(s) 2470 enable communication over a communication medium to another computing entity. The communication medium conveys information such as computer-executable instructions or other data in a modulated data signal. A modulated data signal is a signal that has one or more of its characteristics set or changed in such a manner as to encode information in the signal. By way of example, and not limitation, communication media include wired or wireless techniques implemented with an electrical, optical, RF, infrared, acoustic, or other carrier.

As noted, the various methods and techniques for performing any of the disclosed technologies, for controlling a quantum computing device, to perform circuit design or compilation/synthesis as disclosed herein can be described in the general context of computer-readable instructions stored on one or more computer-readable media. Computer-readable media are any available media (e.g., memory or storage device) that can be accessed within or by a computing environment. Computer-readable media include tangible computer-readable memory or storage devices, such as memory 2420 and/or storage 2440, and do not include propagating carrier waves or signals per se (tangible computer-readable memory or storage devices do not include propagating carrier waves or signals per se).

Various embodiments of the methods disclosed herein can also be described in the general context of computer-executable instructions (such as those included in program modules) being executed in a computing environment by a processor. Generally, program modules include routines, programs, libraries, objects, classes, components, data structures, and so on, that perform particular tasks or implement particular abstract data types. The functionality of the program modules may be combined or split between program modules as desired in various embodiments. Computer-executable instructions for program modules may be executed within a local or distributed computing environment.

An example of a possible network topology 2500 (e.g., a client-server network) for implementing a system according to the disclosed technology is depicted in FIG. 25. Networked computing device 2520 can be, for example, a computer running a browser or other software connected to a network 2512. The computing device 2520 can have a computer architecture as shown in FIG. 24 and discussed above. The computing device 2520 is not limited to a traditional personal computer but can comprise other computing hardware configured to connect to and communicate with a network 2512 (e.g., smart phones, laptop computers, tablet computers, or other mobile computing devices, servers, network devices, dedicated devices, and the like). Further, the computing device 2520 can comprise an FPGA or other programmable logic device. In the illustrated embodiment, the computing device 2520 is configured to communicate with a computing device 2530 (e.g., a remote server, such as a server in a cloud computing environment) via a network 212. In the illustrated embodiment, the computing device 2520 is configured to transmit input data to the computing device 2530, and the computing device 2530 is configured to implement a technique for controlling a quantum computing device to perform any of the disclosed embodiments and/or a circuit generation/compilation/synthesis technique for generating quantum circuits for performing any of the techniques disclosed herein. The computing device 2530 can output results to the computing device 2520. Any of the data received from the computing device 2530 can be stored or displayed on the computing device 2520 (e.g., displayed as data on a graphical user interface or web page at the computing devices 2520). In the illustrated embodiment, the illustrated network 2512 can be implemented as a Local Area Network (LAN) using wired networking (e.g., the Ethernet IEEE standard 802.3 or other appropriate standard) or wireless networking (e.g. one of the IEEE standards 802.11a, 802.11b, 802.11g, or 802.11n or other appropriate standard). Alternatively, at least part of the network 2512 can be the Internet or a similar public network and operate using an appropriate protocol (e.g., the HTTP protocol).

Another example of a possible network topology 2600 (e.g., a distributed computing environment) for implementing a system according to the disclosed technology is depicted in FIG. 26. Networked computing device 2620 can be, for example, a computer running a browser or other software connected to a network 2612. The computing device 2620 can have a computer architecture as shown in FIG. 24 and discussed above. In the illustrated embodiment, the computing device 2620 is configured to communicate with multiple computing devices 2630, 2631, 2632 (e.g., remote servers or other distributed computing devices, such as one or more servers in a cloud computing environment) via the network 2612. In the illustrated embodiment, each of the computing devices 2630, 2631, 2632 in the computing environment 2600 is used to perform at least a portion of the disclosed technology and/or at least a portion of the technique for controlling a quantum computing device to perform any of the disclosed embodiments and/or a circuit generation/compilation/synthesis technique for generating quantum circuits for performing any of the techniques disclosed herein. In other words, the computing devices 2630, 2631, 2632 form a distributed computing environment in which aspects of the techniques for performing any of the techniques as disclosed herein and/or quantum circuit generation/compilation/synthesis processes are shared across multiple computing devices. The computing device 2620 is configured to transmit input data to the computing devices 2630, 2631, 2632, which are configured to distributively implement such as process, including performance of any of the disclosed methods or creation of any of the disclosed circuits, and to provide results to the computing device 2620. Any of the data received from the computing devices 2630, 2631, 2632 can be stored or displayed on the computing device 2620 (e.g., displayed as data on a graphical user interface or web page at the computing devices 2620). The illustrated network 2612 can be any of the networks discussed above with respect to FIG. 25.

With reference to FIG. 27, an exemplary system for implementing the disclosed technology includes computing environment 2700. In computing environment 2700, a compiled quantum computer circuit description (including quantum circuits for performing any of the disclosed techniques as disclosed herein) can be used to program (or configure) one or more quantum processing units such that the quantum processing unit(s) implement the circuit described by the quantum computer circuit description.

The environment 2700 includes one or more quantum processing units 2702 and one or more readout device(s) 2708. The quantum processing unit(s) execute quantum circuits that are precompiled and described by the quantum computer circuit description. The quantum processing unit(s) can be one or more of, but are not limited to: (a) a superconducting quantum computer; (b) an ion trap quantum computer; (c) a fault-tolerant architecture for quantum computing; and/or (d) a topological quantum architecture (e.g., a topological quantum computing device using Majorana zero modes). The precompiled quantum circuits, including any of the disclosed circuits, can be sent into (or otherwise applied to) the quantum processing unit(s) via control lines 2706 at the control of quantum processor controller 2720. The quantum processor controller (QP controller) 2720 can be part of and operate in conjunction with classical processor 2710 (e.g., having an architecture as described above with respect to FIG. 24) to implement the desired quantum computing process. In the illustrated example, the QP controller 2720 further implements the desired quantum computing process via one or more QP subcontrollers 2704 that are specially adapted to control a corresponding one of the quantum processor(s) 2702. The QP subcontrollers 2704 can be classical processors located within the quantum circuit architecture. Still further, and with respect to the disclosed technology and in certain embodiments, the QP subcontrollers 2704 are programmed to implement any of the disclosed error correction schemes.

Further, in some examples, the quantum controller 2720 facilitates implementation of the compiled quantum circuit by sending instructions to one or more memories (e.g., lower-temperature memories), which then pass the instructions to low-temperature control unit(s) (e.g., QP subcontroller(s) 2704) that transmit, for instance, pulse sequences representing the gates to the quantum processing unit(s) 2702 for implementation. In other examples, the QP controller(s) 2720 and QP subcontroller(s) 2704 operate to provide appropriate magnetic fields, encoded operations, or other such control signals to the quantum processor(s) to implement the operations of the compiled quantum computer circuit description. The quantum controller(s) can further interact with readout devices 2708 to help control and implement the desired quantum computing process (e.g., by reading or measuring out data results from the quantum processing units once available, etc.)

With reference to FIG. 27, compilation is the process of translating a high-level description of a quantum algorithm into a quantum computer circuit description comprising a sequence of quantum operations or gates, which can include the circuits as disclosed herein (e.g., the circuits configured to perform one or more of the procedures as disclosed herein). The compilation can be performed by a compiler 2722 using a classical processor 2710 (e.g., as shown in FIG. 27) of the environment 2700 which loads the high-level description from memory or storage devices 2712 and stores the resulting quantum computer circuit description in the memory or storage devices 2712.

In other embodiments, compilation and/or verification can be performed remotely by a remote computer 2760 (e.g., a computer having a computing environment as described above with respect to FIG. 24) which stores the resulting quantum computer circuit description in one or more memory or storage devices 2762 and transmits the quantum computer circuit description to the computing environment 2700 for implementation in the quantum processing unit(s) 2702. Still further, the remote computer 2700 can store the high-level description in the memory or storage devices 2762 and transmit the high-level description to the computing environment 2700 for compilation and use with the quantum processor(s). In any of these scenarios, results from the computation performed by the quantum processor(s) can be communicated to the remote computer after and/or during the computation process. Still further, the remote computer can communicate with the QP controller(s) 2720 such that the quantum computing process (including any compilation, verification, and QP control procedures) can be remotely controlled by the remote computer 2760. In general, the remote computer 2760 communicates with the QP controller(s) 2720, compiler/synthesizer 2722, and/or verification tool 2723 via communication connections 2750.

In particular embodiments, the environment 2700 can be a cloud computing environment, which provides the quantum processing resources of the environment 2700 to one or more remote computers (such as remote computer 2760) over a suitable network (which can include the internet).

7 Concluding Remarks

Having described and illustrated the principles of the disclosed technology with reference to the illustrated embodiments, it will be recognized that the illustrated embodiments can be modified in arrangement and detail without departing from such principles. For instance, elements of the illustrated embodiments shown in software may be implemented in hardware and vice-versa. Also, the technologies from any example can be combined with the technologies described in any one or more of the other examples. It will be appreciated that procedures and functions such as those described with reference to the illustrated examples can be implemented in a single hardware or software module, or separate modules can be provided. The particular arrangements above are provided for convenient illustration, and other arrangements can be used.

What is claimed is:

1. One or more computer-readable media storing computer-readable instructions, which when executed by a classical computer, cause the classical computer to perform a method, the method comprising:
   determining a set of residual errors associated with an observed syndrome;
   performing a sequence of operations until all residual errors in the determined set of residual errors are eliminated, the sequence including:
   generating a set of random vectors, each one of the random vectors being a parity measurement of one or more stabilizers defined for a linear code;
   adding a select one of the random vectors to a solution set, the select one of the random vectors having a largest detection power of the set of random vectors; and
   updating the set of residual errors to eliminate a subset of the residual errors that are detectable by the select one of the random vectors to generate a fault-tolerant error-correction scheme; and
   causing the fault-tolerant error-correction scheme to be generated in a plurality of qubits of a quantum computing device.

2. The one or more computer-readable media of claim 1, wherein the method further comprises:
   generating a plurality of cat states;
   implementing the sequence of measurements on one or more cat states in the plurality of cat states; and
   performing an error-correction action.

3. The one or more computer-readable media of claim 1, wherein the fault-tolerant error-correction scheme requires at most $O((n-k)d)$ parity measurements or at most $O(d^{1+e})$ parity measurements, where O is a constant, n is a code length, k is a number of data bits, and d is a minimum distance.

4. The one or more computer-readable media of claim 1, where in the method further comprises running a fault-tolerant decoder in a classical computing device, wherein the fault-tolerant decoder alternates between passive storage and round of error correction.

5. A system, comprising:
a quantum computing device; and
a classical computing device in communication with the quantum computing device, the classical computing device being programmed to generate and implement a fault-tolerant error-correction scheme in the quantum computing device, the fault-tolerant error-correction scheme being generated by:
determining a set of residual errors associated with an observed syndrome;
performing a sequence of operations until all residual errors in the determined set of residual errors are eliminated, the sequence including:
generating a set of random vectors, each one of the random vectors being a parity measurement of one or more stabilizers defined for a linear code;
adding a select one of the random vectors to a solution set, the select one of the random vectors having a largest detection power of the set of random vectors; and
updating the set of residual errors to eliminate a subset of the residual errors that are detectable by the select one of the random vectors.

6. The system of claim 5, the classical computing device being further configured to:
generate a plurality of cat states;
implement the sequence of measurements on one or more cat states in the plurality of cat states; and
cause an error-correction action to be performed on the quantum computing device.

7. The system of claim 5, wherein (a) the fault-tolerant error-correction scheme requires at most $O((n-k)d)$ parity measurements or at most $O(d^{1+e})$ parity measurements, wherein O is a constant, n is a code length, k is a number of data bits, and d is a minimum distance; or (b) the classical computing device is further configured to run a look-up-table-based fault-tolerant decoder configured to alternate between passive storage and one or more rounds of error correction.

* * * * *